(12) United States Patent
Maeno et al.

(10) Patent No.: US 6,275,963 B1
(45) Date of Patent: Aug. 14, 2001

(54) TEST CIRCUIT AND A REDUNDANCY CIRCUIT FOR AN INTERNAL MEMORY CIRCUIT

(75) Inventors: Hideshi Maeno; Tokuya Ōsawa, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/129,041

(22) Filed: Aug. 4, 1998

(30) Foreign Application Priority Data

Jan. 16, 1998 (JP) ............................... P10-006524
Apr. 15, 1998 (JP) ............................... P10-104752

(51) Int. Cl.$^7$ .................................................. G01R 31/28
(52) U.S. Cl. ............................................ 714/726; 714/733
(58) Field of Search ............................. 365/201; 714/727, 714/726, 729, 733, 719

(56) References Cited

U.S. PATENT DOCUMENTS

| | | | | |
|---|---|---|---|---|
| 5,185,722 | * | 2/1993 | Ota et al. ................................ | 365/201 |
| 5,202,625 | * | 4/1993 | Farwell .................................. | 714/727 |
| 5,228,000 | * | 7/1993 | Yamagata .............................. | 365/201 |
| 5,473,617 | * | 12/1995 | Farwell .................................. | 714/727 |
| 5,703,818 | * | 12/1997 | Osawa .................................. | 365/201 |
| 5,946,245 | * | 8/1999 | Brown et al. .......................... | 365/201 |

FOREIGN PATENT DOCUMENTS 7-245000   9/1995   (JP).
8-94718    4/1996   (JP).

* cited by examiner

*Primary Examiner*—Albert Decady
*Assistant Examiner*—David Ton
(74) *Attorney, Agent, or Firm*—Burns, Doane, Swecker & Mathis, LLP

(57) ABSTRACT

In the first test mode with a shift-mode signal (SM) of "1" and a test-mode signal (TM) of "1", supplying a comparison control signal (CMP) of "1" makes a test-valid condition. Then, a comparison result between input data (D) which becomes "0" to indicate a failure and an expected value data (EXP) (an output of a comparator (21)) and an AND-operation result between a serial input (SI) and a latch data (an output of a D-FF (27)) are given to the D-FF (27) through NAND gates (28 and 29), an AND gate (30) and a selector (26). With this configuration achieved is a semiconductor integrated circuit having a test circuit which allows a quick recognition of whether there is a failure or not in an internal memory circuit under test.

20 Claims, 33 Drawing Sheets

F I G. 4 4  PRIOR ART

TEST CIRCUIT AND A REDUNDANCY CIRCUIT FOR AN INTERNAL MEMORY CIRCUIT

BACKGROUND OF THE INVENTION

1. Field of the Invention

The present invention relates to a semiconductor integrated circuit device, and more particularly to a test circuit and a redundancy circuit for an internal memory circuit.

2. Description of the Background Art

Among prior-art test circuits and redundancy circuits for a memory circuit in a semiconductor integrated circuit device is a test circuit and a redundancy circuit shown in Japanese Patent Application Laid-Open Gazette 8-94718.

FIG. 43 is a circuit diagram showing a configuration of a prior-art scan flip flop 200 (hereinafter, sometimes abbreviated as "S-FF") for a RAM test.

As shown in FIG. 43, a comparator 201 consists of an EX-OR gate 202 and a NAND gate 203. One of inputs of the EX-OR gate 202 receives input data D and the other receives expected value data EXP, and one of inputs of the NAND gate 203 is connected to an output of the EX-OR gate 202 and the other receives a comparison control signal CMP. An output of the NAND gate 203 serves as an output of the comparator 201.

The output of the comparator 201 is connected to one of inputs of an AND gate 204. A selector 205 has a "0"-input receiving a serial input (data ) SI, a "1"-input connected to an output of the AND gate 204 and a control input receiving a test-mode signal TM1. The selector 205 outputs a signal given from the "1"/"0"-input based on "1"/"0" of the test-mode signal TM1 through its output unit Y.

A selector 206 has a "0"-input receiving the input data D, and a "1"-input connected to the output unit Y of the selector 205 and a control input receiving a shift-mode signal SM. The selector 206 outputs a signal given from the "1"/"0" input based on "1"/"0" of the shift-mode signal SM through its output unit Y.

The D-FF (D-type flip flop) 207 has a D-input connected to the output unit Y of the selector 206, a toggle input T receiving a timing signal (clock signal) T and a Q-output for outputting signals. The signals from the output unit Q are given outside and fed back to the other input of the AND gate 204 as a data output Q and a serial output (data) SO.

In this configuration, with the shift-mode signal SM of "0", a normal operation starts to take the input data D into the D-FF 207 in synchronization with a timing signal T.

With the shift-mode signal SM of "1" and the test-mode signal TM1 of "0", the S-FF 200 enters a shift operation mode to take the serial input SI into the D-FF 207 in synchronization with the timing signal T.

With the shift-mode signal SM of "1" and the test-mode signal TM1 of "1", the S-FF 200 enters a test mode. In the test mode, supplying the comparison control signal CMP of "0" makes a test-invalid condition. The output of the comparator 201 forcedly becomes "1" and the Q-output of the D-FF 207 is fed back to the D-input to hold latch data of the D-FF 207.

In the test mode, supplying the comparison control signal CMP of "1" makes a test-valid condition. The input data D is compared with the expected value data EXP and when agrees, the EX-OR gate 202 outputs "0" and the comparator 201 outputs "1" as comparison result data to hold the latch data of the D-FF 207.

On the other hand, when disagrees, the EX-OR gate 202 outputs "1" and the comparator 201 outputs "0" as comparison result data to forcedly latch "0" into the D-FF 207 (to be reset).

FIG. 44 is a circuit diagram showing a configuration of a prior-art RAM with test circuit (showing only circuits connected to data outputs DO<0> to DO<4> of the RAM). As shown in FIG. 44, a test circuit 216 has a scan path for RAM test connecting in series five scan flip flops SFF<0> to SFF<4> each of which has the circuit configuration of FIG. 43. Hereinafter, the scan flip flop SFF< > is sometimes abbreviated as SFF< >.

Specifically, the SFF<4> externally receives serial input data SIDO as its serial input SI and its serial output SO is connected to a serial input SI of the SFF<3>, and the SFF<2>, the SFF<1> and the SFF<0> are connected in series likewise. A serial output SO of the last-stage SFF<0> is externally outputted as serial output data SODO.

The SFF<0> to SFF<4> receive the shift-mode signal SM, the test-mode signal TM1, the expected value data EXP, the comparison control signal CMP and the timing signal T in common. Further, the SFF<0> to SFF<4> receive data outputs DO<0> to DO<4> as respective input data D and output respective data outputs Q as data outputs Q<0> to Q<4>.

With reference to FIGS. 43 and 44, a RAM test operation will be discussed below.

(1) Prior to the RAM test, in the shift mode {TM1=0, SM=1}, the serial input data SIDO (the serial input SI of the SFF<4>) of "1" is sequentially shifted to latch "1" into all the SFF<0> to SFF<4>. At this time, clocks for five cycles are needed as the timing signal T. As a result, all the serial outputs SO<0> to SO<4> of the SFF<0> to SFF<4> become "1".

(2) In the test mode {TM1=1, SM=1}, the RAM test is executed on all the addresses. While test data are written or read out, the test-valid condition is made at a predetermined timing by appropriate control of the expected value data EXP and the comparison control signal CMP (when "1", comparison is made).

If a RAM 211 has a failure, the output DO<i> (i=0 to 4) of the RAM 211 disagrees with the expected value data EXP in the test-valid condition. At this time, the comparison result data from the comparator 201 in the SFF<i> is "0" and the SFF<i> latches "0" therein in synchronization with the clock signal T to be reset.

For example, when a failure is found in the SFF<2> connected to the output data DO<2> of the RAM 211, the serial output SO<2> becomes "0" (the serial outputs SO<0>, SO<1>, SO<3> and SO<4> are kept "1").

(3) In the shift mode {TM1=0, SM=1}, the test result is sequentially outputted as the serial output data SODO (the serial output SO of the SFF<0>).

In the above example, "1", "1", "0", "1" and "1" are outputted in this order as the serial output data SODO and the third serial output data SODO of "0" (indicative of failure) reveals existence of failure in the RAM 211.

Since the prior-art test circuit for RAM in the semiconductor integrated circuit device performs the failure test for RAM as above, through observation of the serial output data SODO which are externally outputted in the stage (2) in the test mode, whether there is a failure of the data output DO<0> can be detected but whether there is a failure of the other data outputs DO<1>, DO<2>, DO<3> and DO<4> can not be detected. Therefore, the test in the stage (2) needs recognition on whether there is a failure of all the data outputs DO<0> to DO<4> in the stage (3) after executing the test on the data outputs DO<0> to DO<4> of all the addresses. That disadvantageously requires longer time than necessary to perform a test for detecting a defective RAM.

FIG. 45 is a circuit diagram showing a configuration of a semiconductor integrated circuit device having a RAM with test circuit and a redundancy circuit. In FIG. 45, a RAM with test circuit has a configuration where the RAM 212 with test circuit of FIG. 44 is additionally provided with a redundancy circuit 213.

As shown in FIG. 45, the serial outputs SO<1> to SO<4> of the scan flip flops SFF<1> to SFF<4> are taken into a register 214 and stored as store data G<1> to G<4>.

The store data G<1> to G<3> of the register 214 are applied to respective ones of inputs of AND gates 221 to 223. The other input of the AND gate 221 is connected to an output of the AND gate 222, the other input of the AND gate 222 is connected to an output of the AND gate 223 and the other input of the AND gate 223 receives the store data G<4>. Outputs of the AND gates 221 to 223 are output data F<1> to F<3>.

Selectors 230 to 233 are provided correspondingly to the data outputs Q<0> to Q<4> (or data outputs DO<0> to DO<4>) of the RAM 212 with test circuit. The selectors 230 to 233 have "0"-inputs receiving data outputs Q<0> to Q<3>, "1"-inputs receiving the data outputs Q<1> to Q<4> and control inputs receiving the output data F<1> to F<3> and G<4>, respectively. Outputs of the selectors 230 to 233 are redundancy data outputs XDO<0> to XDO<3>, respectively.

On the other hand, an OR gate 215 and selectors 234 to 236 are provided correspondingly to the data inputs DI<0> to DI<4> of the RAM 212 with test circuit. One of inputs of the OR gate 215 receives an redundancy data input XDI<0> and the other receives the output data F<1>. The selectors 234 to 236 have "0"-inputs receiving redundancy data inputs XDI<1> to XDI<3>, "1"-inputs receiving the redundancy data inputs XDI<0> to XDI<2> and the control inputs receiving the output data F<2> and F<3> and the store data G<4>.

An output of the OR gate 215 is applied to the data input DI<0>, outputs of the selectors 234 to 236 are applied to the data inputs DI<1> to DI<3> and the redundancy data output XDO<3> is applied to the data input DI<4>.

With this configuration, if the data output DO<2> of the RAM 211, for example, has a failure, the SFF<2> corresponding to the data output DO<2> latches "0" indicative of failure therein. Specifically, the serial output SO<2> is "0" (the serial outputs SO<0>, SO<1>, SO<3> and SO<4> are kept "1").

When the serial outputs SO<1> to SO<3> are taken into the register 214, the store data G<1>=1, G<2>=0, G<3>=1 and G<4>=1 and the output data F<3>=1, F<2>=0 and FF<1>=0}. As a result, the redundancy data outputs XDO<0> to XDO<3> are outputted according to such a correspondence as {DO<4>/Q<4> to XDO<3>, DO<3>/Q<3> to XDO<2>, DO<1>/Q<1> to XDO<1> and DO<0>/Q<0> to XDO<0>} through the signal selection by the selectors 230 to 233. In short, the data output DO<2> having a failure is not used.

Similarly, the redundancy data inputs XDI<0> to XDI<3> are inputted according to such a correspondence as {XDI<3> to DI<4>, XDI<2> to DI<3> and DI<2>, XDI<1> to DI<1> and XDI<0> to DI<0>} through the signal selection by the selectors 234 to 236. In short, the redundancy data input XDI<2> is inputted also to the data input DI<3> besides the data input DI<2> corresponding to the data output DO<2> having a failure.

Thus, even when the RAM 211 provided with the data output DO<2> has a failure, it works normally as a 4-bit input/output RAM by using the RAM 212 with test circuit and the redundancy circuit 213 through connection change of the redundancy circuit 213.

When the D-FFs 207 in the SFF<0> the SFF<4> are not used as flip flops for output during a normal operation, the D-FFs 27 are used as registers for storing the redundancy control data in the redundancy circuit 213 to omit the register 214. Further, by omitting the OR gate 215, the data input DI<0> and the redundancy data input XDI<0> may be shorted as indicated by a broken line.

The prior-art redundancy circuit 213 needs logic circuits (the AND gates 221 to 223) for generating selection control signal output data F<1> to F<3>, being complicate in circuit configuration.

SUMMARY OF THE INVENTION

The present invention is directed to a semiconductor integrated circuit device. According to a first aspect of the present invention, the semiconductor integrated circuit device comprises: a memory circuit under test which can output in parallel a plurality of output data corresponding to a plurality of bits based on an internally-stored content; and a test circuit having a plurality of scan flip flops (S-FFs), the plurality of S-FFs receiving serial output data of their respective preceding S-FFs as serial input data to be connected in series to one another. Each of the plurality of S-FFs comprises: a comparison circuit for comparing at least one of the plurality of output data with at least one of expected value data corresponding thereto to output a comparison result data indicating whether there is a failure or not; and failure-information transfer means receiving a group of failure judging data including the comparison result data in a first test mode, for outputting the serial output data indicating a failure when at least one data of the group of failure judging data indicate a failure. The group of failure judging data of the failure-information transfer means in each of one or more serial S-FFs among the plurality of S-FFs further includes the serial input data.

According to a second aspect of the present invention, in the semiconductor integrated circuit device of the first aspect, the failure-information transfer means in each of the plurality of S-FFs comprises memory-data output means for outputting memory data indicating a failure when at least one data of the group of failure judging data indicate a failure in the first test mode; and a data storage for storing the memory data as latch data in synchronization with a predetermined timing signal, and the serial output data include the latch data.

According to a third aspect of the present invention, in the semiconductor integrated circuit device of the second aspect, the group of failure judging data further include the latch data.

According to a fourth aspect of the present invention, in the semiconductor integrated circuit device of the first aspect, the failure-information transfer means in each of the one or more serial S-FFs comprises a data storage for storing memory data as latch data in synchronization with a predetermined timing signal; memory-data output means for outputting the memory data indicating a failure when at least one of the comparison result data and the latch data indicates a failure in the first test mode; and serial-data output means for outputting the serial output data indicating a failure when at least one of the serial input data and the latch data indicates a failure in the first test mode.

According to a fifth aspect of the present invention, in the semiconductor integrated circuit device of the first aspect, the failure-information transfer means in each of the one or more serial S-FFs comprises a data storage for storing memory data as latch data in synchronization with a predetermined timing signal; serial-data output means for outputting the serial output data indicating a failure when at least one of the comparison result data and the latch data indicates a failure in the first test mode; and memory-data output means for outputting the memory data indicating a failure when at least one of the serial input data and the serial output data indicates a failure in the first test mode.

According to a sixth aspect of the present invention, in the semiconductor integrated circuit device of the first aspect, the failure-information transfer means in each of the one or more serial S-FFs comprises data storing means for storing the serial input data as latch data in synchronization with a predetermined timing signal in the first test mode; and serial-data output means for outputting the serial output data indicating a failure when at least one of the comparison result data and the latch data indicates a failure.

According to a seventh aspect of the present invention, in the semiconductor integrated circuit device of the sixth aspect, the data storing means stores the comparison result data as latch data in synchronization with the predetermined timing signal in a failure observation mode.

According to an eighth aspect of the present invention, in the semiconductor integrated circuit device of the first aspect, the failure-information transfer means in each of the one or more serial S-FFs comprises a data storage for storing memory data as latch data in synchronization with a predetermined timing signal; selection means receiving the serial input data and the latch data, for outputting the serial input data as selected data in the first test mode and outputting the latch data as the selected data in a second test mode; and memory-data output means for outputting memory data indicating a failure when at least one of the selected data and the comparison result data indicates a failure in the first and second test modes, and the serial output data include the latch data.

According to a ninth aspect of the present invention, in the semiconductor integrated circuit device of the eighth aspect, the memory-data output means outputs the comparison result data as the memory data in a failure observation mode.

According to a tenth aspect of the present invention, in the semiconductor integrated circuit device of the first aspect, the at least one output data include a predetermined number of output data and the at least one expected value data include the predetermined number of expected value data, the predetermined number being not less than two, and the comparison circuit compares the predetermined number of output data with the predetermined number of expected value data and outputs the comparison result data indicating a failure when at least one of the output data disagrees with corresponding one of the comparison result data.

According to an eleventh aspect of the present invention, in the semiconductor integrated circuit device of the tenth aspect, the test circuit further includes a data input unit capable of independently writing the predetermined number of test data into the predetermined number of bits corresponding to the predetermined number of output data among the plurality of bits.

According to a twelfth aspect of the present invention, in the semiconductor integrated circuit device of the first aspect, the failure-information transfer means in each of the one or more serial S-FFs comprises a data storage for storing memory data as latch data in synchronization with a predetermined timing signal; and memory-data output means for outputting the memory data indicating a failure when at least one of the comparison result data and the latch data indicates a failure in a second test mode.

According to a thirteenth aspect of the present invention, in the semiconductor integrated circuit device of the third aspect, the comparison result data, the serial input data, the latch data and the memory data each represent a logic value "0"/"1" to indicate whether there is a failure or not, and a unit constituted of the memory-data output means and the data storage includes AND-operation means for performing an AND operation of the serial input data, the latch data and the comparison result data to output the memory data.

According to a fourteenth aspect of the present invention, in the semiconductor integrated circuit device of the thirteenth aspect, the AND-operation means includes first to third OR gates for outputting first to third OR-operation results, respectively, with the serial input data, the latch data and the comparison result data being valid in the first test mode; a NAND gate receiving the first to third OR-operation results simultaneously, for performing a NAND operation of the first to third OR-operation results at a time to output a NAND-operation result; and an inverter for logically inverting the NAND-operation result to output the memory data, and the first to third OR gates and the NAND gate are united to constitute an OR-NAND compound gate.

According to a fifteenth aspect of the present invention, in the semiconductor integrated circuit device of the thirteenth aspect, the AND-operation means includes first and second OR gates for outputting first and second OR-operation results, respectively, with the serial input data and the latch data being valid in the first test mode; a first NAND gate receiving the first and second OR-operation results simultaneously, for performing a NAND operation of the first and second OR-operation results at a time to output a first NAND-operation result; a first inverter for logically inverting the first NAND-operation result to output a first AND-operation result; a third OR gate for outputting a third OR-operation result with the comparison result data being valid in the first test mode; a second NAND gate receiving the first AND-operation result and the third OR-operation result simultaneously, for performing a NAND operation of the first AND-operation result and the third OR-operation result at a time to output a second NAND-operation result; and a second inverter for logically inverting the second NAND-operation result to output the memory data, and the first and second OR gates and the first NAND gate are united to constitute a first OR-NAND compound gate and the third OR gate and the second NAND gate are united to constitute a second OR-NAND compound gate.

According to a sixteenth aspect of the present invention, the semiconductor integrated circuit device of the thirteenth aspect further comprises: a comparison-control-signal generation circuit for outputting first and second comparison control signals one of which is "1" and the other is "0" based on the at least one expected value data in the first test mode, and in the device of the sixteenth aspect, the at least one output data include 1-bit output data of "1" or "0" and the third OR-operation result includes a third OR-operation result for the first comparison and a third OR-operation result for the second comparison, the third OR gate includes an OR gate for the first comparison for performing an OR operation of the 1-bit output data and the first comparison control signal to output the third OR-operation result for the first comparison; and an OR gate for the second comparison for performing an OR operation of an inverted value of the 1-bit output data and the second comparison control signal to output the third OR-operation result for the second comparison, and the memory-data output means and the comparison circuit share the third OR gates for the first comparison and the second comparison.

According to a seventeenth aspect of the present invention, the semiconductor integrated circuit device of the fifteenth aspect further comprises a comparison-control-signal generation circuit for outputting first and second comparison control signals one of which is "1" and the other is "0" based on the at least one expected value data in the first test mode, and in the device of the seventeenth aspect, the at least one output data include 1-bit output data of "1" or "0" and the third OR-operation result includes a third OR-operation result for the first comparison and a third OR-operation result for the second comparison, the third OR gate includes an OR gate for the first comparison for performing an OR operation of the 1-bit output data and the first comparison control signal to output the third OR-operation result for the first comparison; and an OR gate for the second comparison for performing an OR operation of an inverted value of the 1-bit output data and the second comparison control signal to output the third OR-operation result for the second comparison, the first NAND gate receives the third OR-operation result for the second comparison together with the first and second OR-operation results and performs a NAND operation of the first and second OR-operation results and the third OR-operation result for the second comparison at a time to output the first NAND-operation result, and the second NAND gate simultaneously receives the first AND-operation result and the third OR-operation result for the first comparison and performs a NAND operation of the first AND-operation result and the third OR-operation result for the first comparison at a time to output the second NAND-operation result.

According to an eighteenth aspect of the present invention, in the semiconductor integrated circuit device of the thirteenth aspect, the AND-operation means further has a function of performing an AND operation of only the latch data and the comparison result data to output the memory data in the second test mode and performing an AND operation of only the serial input data and the comparison result data to output the memory data in the third test mode.

According to a nineteenth aspect of the present invention, the semiconductor integrated circuit device of the first aspect further comprises: a redundancy circuit for detecting a defective bit among the plurality of bits based on at least some of the serial output data from each of the one or more serial S-FFs to control input/output data of the memory circuit under test corresponding to the defective bit not to be used.

In the semiconductor integrated circuit device of the first aspect, the failure-information transfer means in each of one or more serial S-FFs among a plurality of S-FFs outputs the serial output data indicating a failure when at least one of the group of the failure judging data including the comparison control data and the serial input data indicates a failure in the first test mode.

Therefore, if at least one of the respective serial output data of the first to last ones of the serial S-FFs and the serial input data of the first-stage S-FF indicates a failure, the serial output data indicating a failure are propagated from the S-FF that first outputs the serial output data indicating a failure to the last-stage S-FF.

As a result, in the first test mode, whether there is a failure or not in a portion of the memory circuit under test corresponding to the one or more serial S-FFs can be recognized earlier by observing the serial output data of the last-stage S-FF.

In the semiconductor integrated circuit device of the second aspect, the memory-data output means stores the memory data indicating a failure into the data storage as latch data when at least one data of the group of failure judging data indicates a failure in the first test mode, and the serial output data include the latch data.

Therefore, the serial output data indicating a failure can be stored into the data storage as the latch data.

In the semiconductor integrated circuit device of the third aspect, since the group of the failure judging data further include the latch data, once the latch data indicating a failure are stored in the data storage, the latch data indicating a failure are continually stored.

In the semiconductor integrated circuit device of the fourth aspect, the memory-data output means stores the latch data indicating a failure into the data storage when at least one of the comparison result data and the latch data indicates a failure in the first test mode, and the serial-data output means outputs the serial output data indicating a failure when at least one of the serial input data and the latch data indicates a failure.

Therefore, if at least one data of the group of the failure judging data including the serial input data, the comparison result data and the latch data indicates a failure, the serial output data indicating a failure are outputted.

Since the serial-data output means outputs the serial output data indicating a failure regardless of the indication content of the latch data when the serial input data indicate a failure, the serial output data indicating a failure can be outputted earlier than the latch data is determined.

In the semiconductor integrated circuit device of the fifth aspect, the serial-data output means outputs the serial output data indicating a failure when at least one of the comparison result data and the latch data in consideration of the failure indication of the serial input data indicates a failure in the first test mode.

Therefore, if at least one data of the group of the failure judging data including the serial input data, the comparison result data and the latch data indicates a failure, the serial output data indicating a failure are outputted.

Since the serial-data output means outputs the serial output data indicating a failure regardless of the indication of the latch data when the comparison result data indicate a failure, the serial output data indicating a failure can be outputted earlier than the latch data is determined.

In the semiconductor integrated circuit device of the sixth aspect, the serial-data output means outputs the serial output data indicating a failure when at least one of the comparison result data and the latch data that are the serial input data indicates a failure.

Therefore, if at least one data of the group of the failure judging data including the serial input data and the comparison result data indicates a failure, the serial output data indicating a failure are outputted.

Since the serial-data output means outputs the serial output data indicating a failure regardless of the indication of the latch data when the comparison result data indicate a failure, the serial output data indicating a failure can be outputted earlier than the latch data is determined.

In the semiconductor integrated circuit device of the seventh aspect, since the data storage means stores the comparison result data as the latch data in synchronization with the predetermined timing signal in the failure observation mode, the failure indication of the comparison result data can be easily recognized by observing the latch data.

The semiconductor integrated circuit device of the eighth aspect comprises the data storage for storing the memory data as the latch data and the serial output data, selection means for outputting the serial input data as the selected data in the first mode and outputting the latch data as the selected data in the second test mode and memory-data output means for outputting memory data indicating a failure when at least one of the selected data and the comparison result data indicates a failure in the first and second test mode.

Therefore, the serial output data indicating a failure are outputted when at least one data of the group of failure judging data including the serial input data and the comparison result data indicates a failure in the first test mode and the serial output data indicating a failure are outputted when at least one data of the group of failure judging data including the latch data and the comparison result data indicates a failure in the second test mode.

In the semiconductor integrated circuit device of the ninth aspect, since the memory-data output means outputs the comparison result data as the memory data in the failure observation mode, the failure indication of the comparison result data can be easily recognized by observing the latch data in the data storage.

In the semiconductor integrated circuit device of the tenth aspect, since the comparison circuit compares the predetermined number of output data with the predetermined number of expected value data and outputs the comparison result data indicating a failure when at least one disagreement is found, the failure judgment can be made in a unit of the predetermined number.

Therefore, the test circuit can be achieved by employing relatively small number of S-FFs, in inverse proportion to the predetermined number, for a plurality of output data of the memory circuit under test.

In the semiconductor integrated circuit device of the eleventh aspect, since the test circuit includes the data input unit which writes the predetermined number of test data independently into the predetermined number of bits corresponding to the predetermined number of output data among the plurality of bits, it is possible to execute an effective test by determining the predetermined number of bits in consideration of the internal configuration of the memory circuit under test, such as memory cell array.

In the semiconductor integrated circuit device of the twelfth aspect, since the memory-data output means outputs the memory data indicating a failure when at least one of the comparison result data and the latch data indicates a failure in the second test mode, the latch data indicating a failure can be obtained if at least one data of the group of failure fudging data including the comparison result data and the latch data indicates a failure.

Therefore, the test for the memory circuit can be executed both in cases where the group of failure judging data include the serial input data and where do not include the serial input data by switching between the first and second test modes.

In the semiconductor integrated circuit device of the thirteenth aspect, since the AND-operation means performs the AND operation of the serial input data, the latch data and the comparison result data, the memory data indicating a failure can be obtained quickly to achieve an improvement in failure detection speed by performing the AND operation of at least two out of the three data at a time.

In the semiconductor integrated circuit device of the fourteenth aspect, the first to third OR gates for outputting the first to third OR-operation results, respectively, with the serial input data, the latch data and the comparison result data being valid in the first test mode and the NAND gate for performing the NAND operation to output the NAND-operation result are united to constitute the OR-NAND compound gate.

The OR-NAND compound gate is achieved with simpler circuit configuration than separate formations of the OR gates and the NAND gate or a circuit having combination of selectors and other logic gates to achieve equivalent logic function. Therefore, a semiconductor integrated circuit device can be achieved with higher integration, on the whole.

In the semiconductor integrated circuit device of the fifteenth aspect, the first and second OR gates and the first NAND gate are united to constitute the first OR-NAND compound gate and the third OR gate and the second NAND gate are united to constitute the second OR-NAND compound gate, to achieve higher integration like the fourteenth aspect.

Further, since the second NAND gate, which would originally receive the first and second OR-operation results, receives the first AND-operation result, it takes a shorter time to perform the operation of the second NAND gate and therefore a faster operation can be achieved when the first AND-operation result is early obtained.

In the semiconductor integrated circuit device of the sixteenth aspect, since the memory-data output means and the comparison circuit share the third OR gates for the first comparison and the second comparison, a higher integration can be achieved.

In the semiconductor integrated circuit device of the seventeenth aspect, the first NAND gate performs the NAND operation of the first and second OR-operation results and the third OR-operation result for the second comparison at a time to output the first NAND-operation result and the second NAND gate performs the NAND operation of the first AND-operation result and the third OR-operation result for the first comparison at a time to output the second NAND-operation result.

Therefore, since the second NAND gate, which would originally receive the first and second OR-operation results and the third OR-operation result for the second comparison, receives the first AND-operation result, it takes a shorter time to perform the operation of the second NAND gate and therefore a faster operation can be achieved when the first AND-operation result is early obtained.

In the semiconductor integrated circuit device of the eighteenth aspect, a combination unit of the memory-data output means and the data storage performs the AND operation of only the latch data and the comparison result data in the second test mode and performs the AND operation of only the serial input and the comparison result data in the third test mode.

Therefore, the test for the memory circuit can be executed in the best test mode by selection among the first to third test modes as required.

The semiconductor integrated circuit device of the nineteenth aspect further comprises the redundancy circuit for detecting the defective bit among the plurality of bits based on at least some of the serial output data from each of the one or more serial S-FFs to control input/output data of the memory circuit under test corresponding to the defective bit not to be used.

Observing the serial output data from each of the one or more serial S-FFs reveals a clear border between the serial output data indicating a failure and those indicating no failure to make it easy to detect the defective bit, and therefore the redundancy circuit can be achieved with a relatively simple circuit configuration.

An object of the present invention is to provide a semiconductor integrated circuit device having a test circuit capable of early recognizing whether there is a failure in an internal memory circuit under test and having a redundancy circuit of simpler configuration connected thereto.

These and other objects, features, aspects and advantages of the present invention will become more apparent from the following detailed description of the present invention when taken in conjunction with the accompanying drawings.

DESCRIPTION OF THE PREFERRED EMBODIMENTS

<<The First Preferred Embodiment>>

Figure 1:
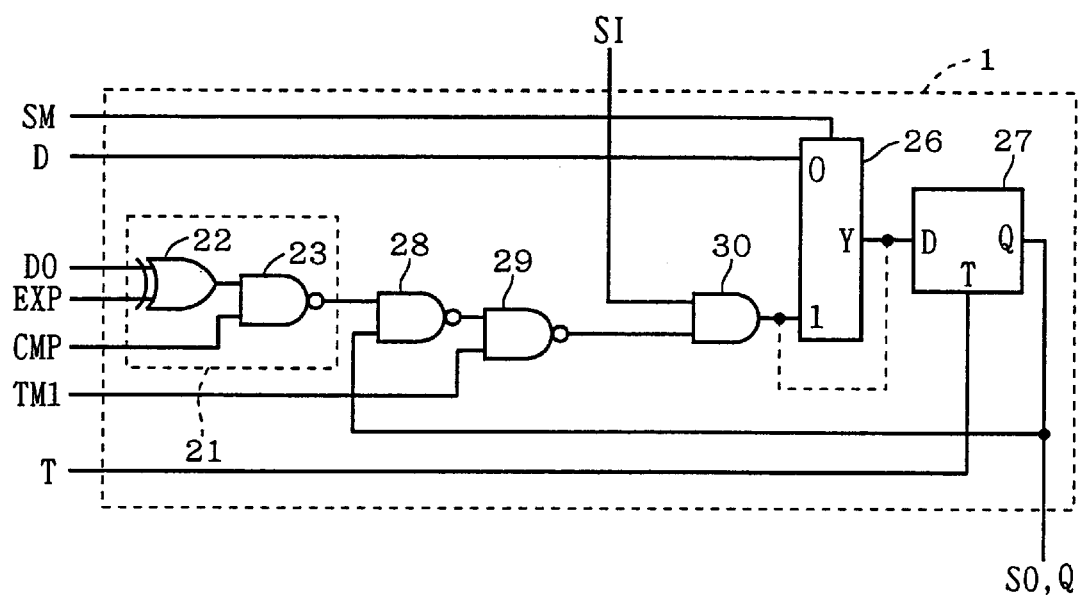
FIG. 1 is a circuit diagram showing an internal configuration of a scan flip flop (S-FF) used for a test circuit in a RAM with test function in accordance with a first preferred embodiment of the present invention.

FIG. 1 is a circuit diagram showing a configuration of a scan flip flop (S-FF 1) used for a test circuit in a semiconductor integrated circuit device such as a DRAM and an SRAM in accordance with the first preferred embodiment.

As shown in FIG. 1, a comparator 21 consists of an EX-OR gate 22 and a NAND gate 23. One of inputs of the EX-OR gate 22 receives input data DO and the other receives expected value data EXP, and one of inputs of the NAND gate 23 is connected to an output of the EX-OR gate 22 and the other receives the comparison control signal CMP. An output of the NAND gate 23 serves as an output of the comparator 21.

The output of the comparator 21 is connected to one of inputs of a NAND gate 28. One of inputs of a NAND gate 29 is connected to an output of the NAND gate 28 and the other receives the test-mode signal TM1. One of inputs of an AND gate 30 receives the serial input (data) SI and the other is connected to an output of the NAND gate 29.

A selector 26 has a "0"-input receiving the input data D, a "1"-input connected to an output of the AND gate 30 and a control input receiving the shift-mode signal SM. The selector 26 outputs a signal given from the "1"/"0"-input based on "1"/"0" of the shift-mode signal SM through its output unit Y.

The D-FF (D-type flip flop) 27 has a D-input connected to the output unit Y of the selector 26, a toggle input T receiving the timing signal (clock signal) T and a Q-output for outputting signals. The signals from the output unit Q are given outside and fed back to the other input of the NAND gate 28 as the data output Q and the serial output (data) SO.

In this configuration, with the shift-mode signal SM of "0", a normal operation starts to take the input data D into the D-FF 27 in synchronization with the timing signal T. If the normal operation is not needed, the selector 26 may be removed and the output of the AND gate 30 may be directly connected to the D-input of the D-FF 27 as indicated by a broken line in FIG. 1.

With the shift-mode signal SM of "1" and the test-mode signal TM1 of "0", the S-FF 1 enters a shift operation mode and the output of the NAND gate 29 forcedly becomes "0", to take the serial input SI into the D-FF 27 in synchronization with the timing signal T.

With the shift-mode signal SM of "1" and the test-mode signal TM1 of "1", the S-FF 1 enters a test mode. In the test mode, supplying the comparison control signal CMP of "0" makes a test-invalid condition, and the output of the comparator 21 forcedly becomes "1". Then, an AND-operation result between the serial input SI and the Q-output of the D-FF 27 obtained by the AND gate 30 is fed back to the D-input of the D-FF 27.

In the test mode, supplying the comparison control signal CMP of "1" makes a test-valid condition. The input data DO is compared with the expected value data EXP and when agrees, the EX-OR gate 22 outputs "0" and the comparator 21 outputs "1" as comparison result data. The AND-operation result between the serial input SI and the Q-output (latch data) of the D-FF 27 is fed back to the D-input of the D-FF 27. On the other hand, when disagrees, the EX-OR gate 22 outputs "1" and the comparator 21 outputs "0" as comparison result data to forcedly latch "0" into the D-FF 27 (to be reset).

Figure 2:
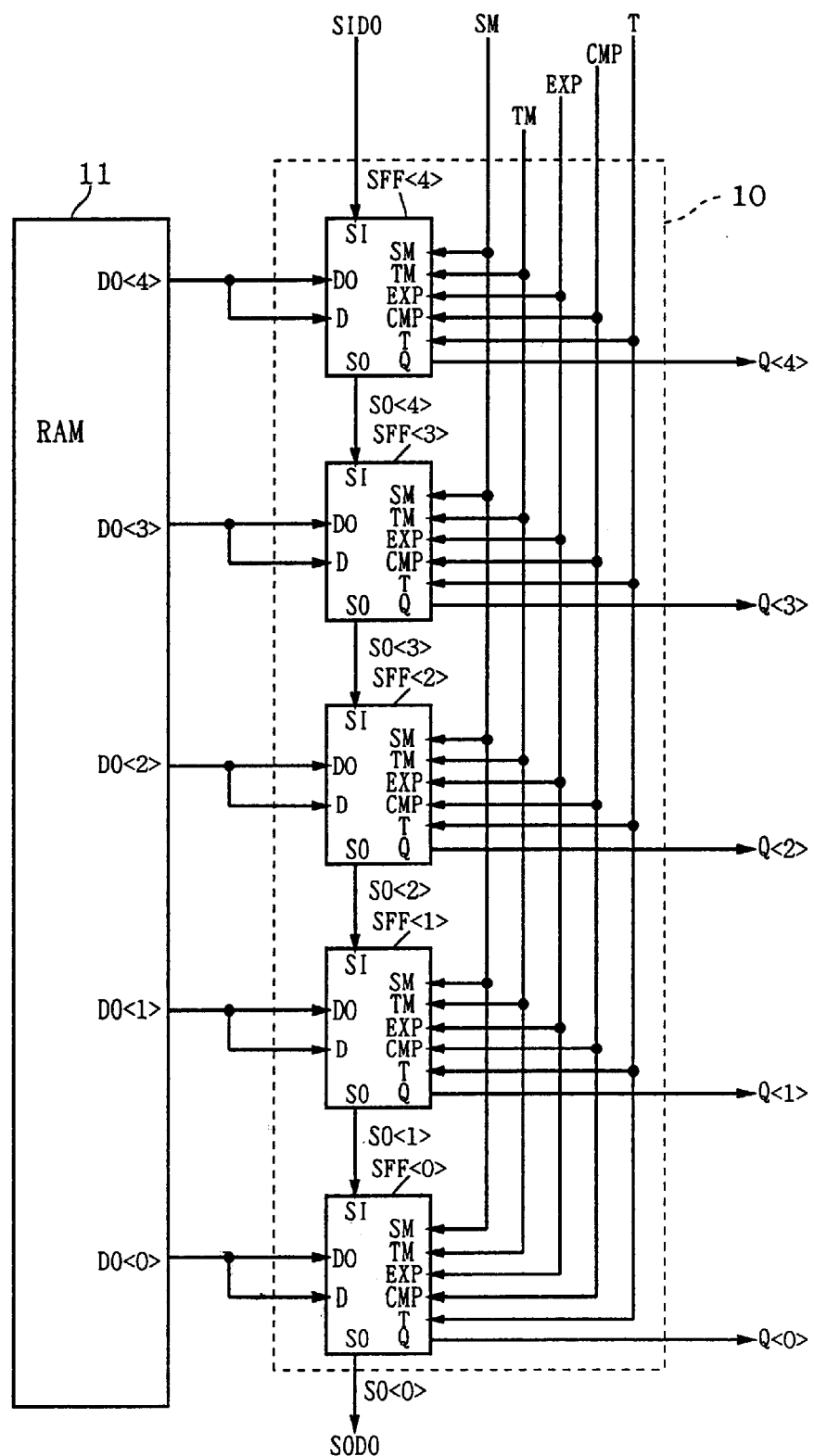
FIG. 2 is a circuit diagram showing the first configuration of the test circuit in accordance with the first preferred embodiment of the present invention.

FIG. 2 is a circuit diagram showing the first configuration of a test circuit using the scan flip flop 1 of FIG. 1. A test circuit 10 is provided correspondingly to data outputs DO<0> to DO<4> of a RAM 11.

As shown in FIG. 2, the test circuit 10 has a scan path for RAM test connecting in series five scan flip flops SFF<0> to SFF<4> each of which has the circuit configuration of FIG. 1.

Specifically, the SFF<4> externally receives serial input data SIDO as its serial input SI and its serial output SO is connected to a serial input SI of the SFF<3>, and the SFF<2>, the SFF<1> and the SFF<0> are connected in series likewise. A serial output SO of the last-stage SFF<0> is externally outputted as serial output data SODO.

The SFF<0> to SFF<4> receive the shift-mode signal SM, the test-mode signal TM, the expected value data EXP, the comparison control signal CMP and the timing signal T in common. Further, the SFF<0> to SFF<4> receive data outputs DO<0> to DO<4> as respective input data D and DO and output respective data outputs Q as data outputs Q<0> to Q<4>. The test-mode signal TM of FIG. 2 corresponds to the test-mode signal TM1 of FIG. 1.

With reference to FIG. 2, a RAM test operation of the test circuit 10 for testing the RAM 11 will be discussed below.

(1) Prior to the RAM test, in the shift mode {TM1=0, SM=1}, the serial input data SIDO of "1" is sequentially shifted to latch "1" into all the SFF<0> to SFF<4>.

(2) In the test mode {TM1=1, SM=1}, the RAM test is executed on all the addresses. While test data are written or read out, the test-valid condition is made at a predetermined timing by appropriate control of the expected value data EXP and the comparison control signal CMP (when "1", comparison is made).

If the RAM 11 has a failure, the output DO<i> (i=0 to 4) of the RAM 11 disagrees with the expected value data EXP in the test-valid condition. At this time, the comparison result data of the SFF<i> is "0" indicative of failure and the D-FF 27 of the SFF<i> latches "0" therein in synchronization with the clock signal T to be reset. As a result, the SFF<i> outputs data output Q<i> of "0" and the serial output SO<i> of "0" indicative of failure.

On the other hand, when the serial input SI of the SFF<i–1> subsequent to the SFF<i> (i.e., the serial output SO of the SFF<i>) is "0", since the output of the AND gate 30 forcedly becomes "0", regardless of the comparison data result of the SFF<i–1> (whether it is detected that the corresponding data output DO<i–1> has a failure or not), the D-FF 27 of the SFF<i–1> latches "0" therein in synchronization with the clock signal T to be reset. As a result, the SFF<i−1> outputs data output Q<i−1> of "0" and the serial output SO<i−1> of "0" indicative of failure.

After that, the serial output SO of "0" is sequentially propagated every clock cycle of the timing signal T, and the serial output data SODO of "0" is outputted after four clock cycles of the timing signal T at the latest from the time of failure detection.

For example, when a failure is found in the SFF<2> connected to the output data DO<2> of the RAM 11, the serial output SO<2> becomes "0" (the serial outputs SO<0>, SO<1>, SO<3> and SO<4> are kept "1").

The serial output SO<2> of "0" indicative of failure is latched into the D-FF 27 of the SFF<1> in synchronization with the timing signal T of the next clock cycle and the serial output SO<1> of "0" is latched into the D-FF 27 of the SFF<0> in synchronization with the timing signal T of the further next clock cycle. As a result, the serial output data SODO, or the serial output SO of the SFF<0>, becomes "0" indicative of failure.

Thus, when the SFF<i> detects a failure of the RAM 11, the serial output data SODO becomes "0" after i clock cycles. In this case, the serial outputs are as follows: SO<4>=1, SO<3>=1, SO<2>=0, SO<1>=0 and SO<0>=0.

Since the test circuit for RAM in the semiconductor integrated circuit device of the first preferred embodiment has a configuration for propagating "0" (failure-indicative information) in series on the scan path consisting of the SFF<0> to SFF<4>, when any of the scan flip flops latches "0" indicative of failure during the test mode, the serial output data SODO quickly show "0".

As a result, observing the serial output data SODO during the test mode allows quick detection of a failure of the RAM 11, and therefore the test circuit 10 of the first preferred embodiment needs a shorter time to detect a defective piece than the prior-art one and cuts a test time.

The test circuit 10 having the first configuration can be used as a group of flip flops for outputting data of the RAM 11 during a normal operation.

Figure 3:
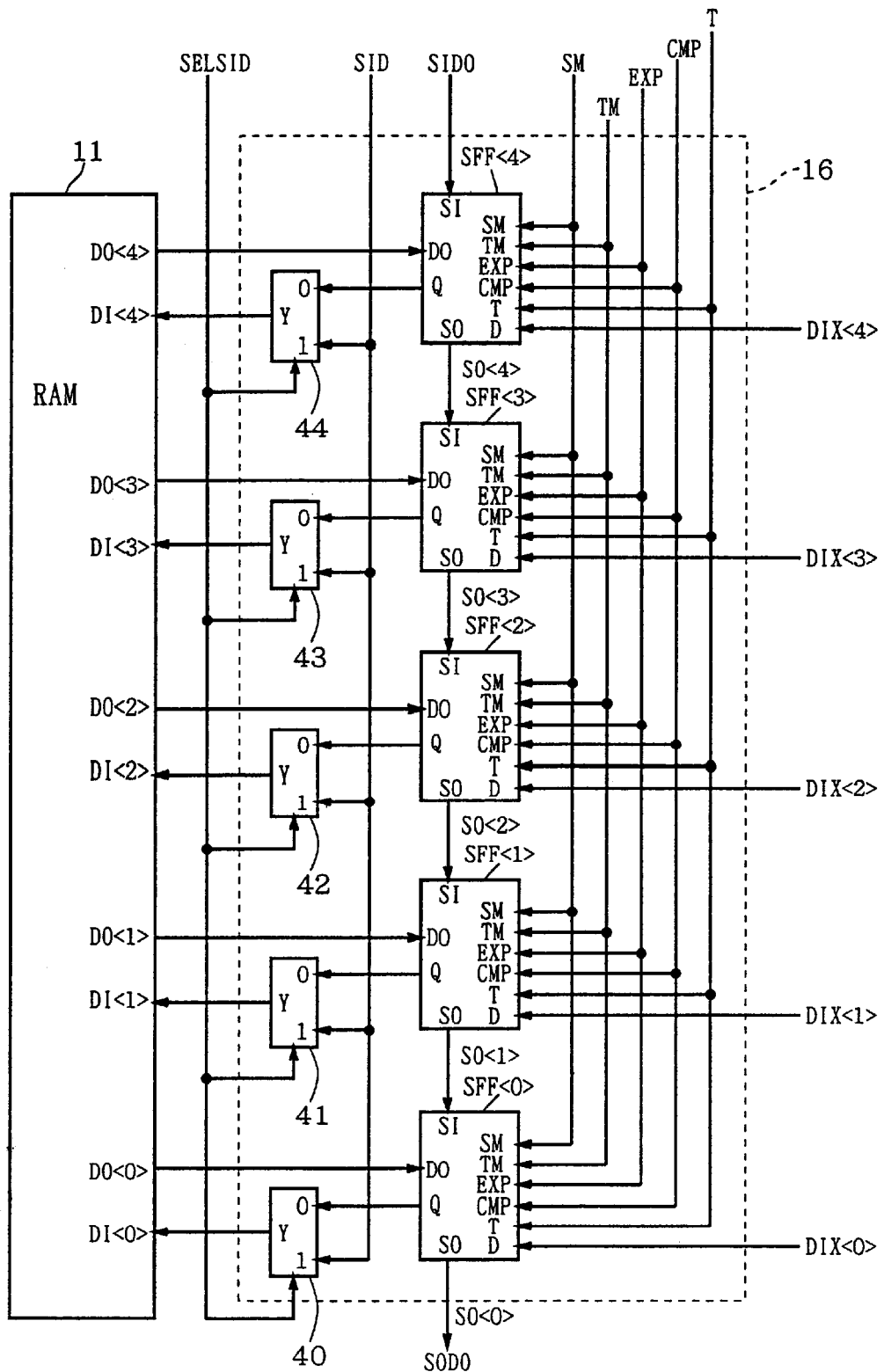
FIG. 3 is a circuit diagram showing the second configuration of the test circuit in accordance with the first preferred embodiment of the present invention.

FIG. 3 is a circuit diagram showing the second configuration of the test circuit using the scan flip flop (S-FF) 1 of FIG. 1. As shown in FIG. 3, a test circuit 16 is provided correspondingly to data outputs DO<0> to DO<4> and data inputs DI<0> to DI<4> of the RAM 11.

As shown in FIG. 3, the test circuit 16 has a scan path for RAM test connecting in series five scan flip flops SFF<0> to SFF<4> each of which has the circuit configuration of FIG. 1, like the test circuit 10 of FIG. 2.

The SFF<0> to SFF<4> receive the shift-mode signal SM, the test-mode signal TM, the expected value data EXP, the comparison control signal CMP and the timing signal T in common. Further, the SFF<0> to SFF<4> receive data outputs DO<0> to DO<4> as respective input data DO, and the respective data outputs Q are connected to "0"-inputs of selectors 40 to 44 and the respective D-inputs are connected to the data inputs DIX<0> to DIX<4>. The test-mode signal TM of FIG. 3 corresponds to the test-mode signal TM1 of FIG. 1.

The selectors 40 to 44 have the "0"-inputs as above, "1"-inputs receiving test data SID in common, control inputs receiving a selection signal SELSID in common and outputs connected to data inputs DI<0> to DI<4>, respectively.

The test circuit 16 having the second configuration of FIG. 3 can perform a test operation for the RAM 11, like the test circuit 10 having the second configuration of FIG. 2. In the test circuit 16, for a write of the test data, the test data SID are applied to the data inputs DI<0> to DI<4>, with the selection signal SELSID of "1".

Further, the test circuit 16 having the second configuration can be used as a group of flip flops for inputting data into the RAM 11 through a normal operation of each scan flip flop, with the selection signal SELSID of "0".

Furthermore, this configuration can be used as a flip flop used for a user logic such as a counter independent of the RAM 11.

<<The Second Preferred Embodiment>>

Figure 4:
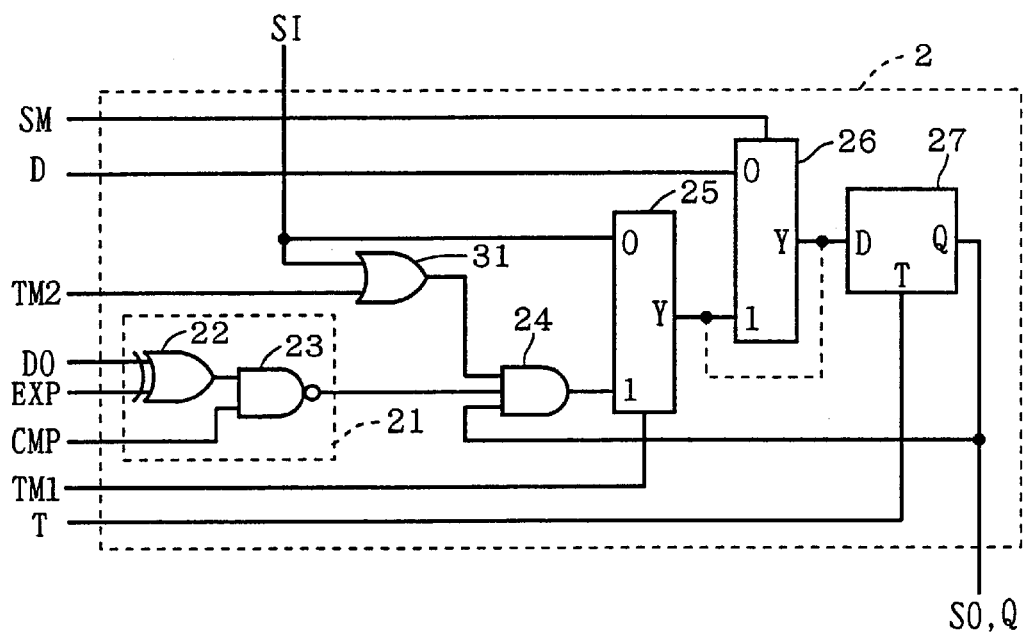
FIG. 4 is a circuit diagram showing an internal configuration of an S-FF in accordance with a second preferred embodiment of the present invention.

FIG. 4 is a circuit diagram showing a configuration of a scan flip flop (S-FF 2) used for a test circuit in a semiconductor integrated circuit device of the second preferred embodiment.

As shown in FIG. 4, the comparator 21 consists of the EX-OR gate 22 and the NAND gate 23. One of the inputs of the EX-OR gate 22 receives the input data DO and the other receives the expected value data EXP, and one of the inputs of the NAND gate 23 is connected to the output of the EX-OR gate 22 and the other receives the comparison control signal CMP. The output of the NAND gate 23 serves as the output of the comparator 21.

One of inputs of an OR gate 31 receives the serial input SI and the other receives a test-mode signal TM2. The first input of a 3-input AND gate 24 is connected to an output of the OR gate 31 and the second input is connected to the output of the comparator 21.

A selector 25 has a "0"-input receiving the serial input SI, a "1"-input connected to an output of the AND gate 24 and a control input receiving the test-mode signal TM1. The selector 25 outputs a signal given from the "1"/"0"-input based on "1"/"0" of the test-mode signal TM1 through its output unit Y.

The selector 26 has a "0"-input receiving the input data D, a "1"-input connected to the output unit Y of the selector 25 and a control input receiving the shift-mode signal SM. The selector 26 outputs a signal given from the "1"/"0" input based on "1"/"0" of the shift-mode signal SM through its output unit Y.

The D-FF 27 has a D-input connected to the output unit Y of the selector 26, a toggle input T receiving the timing signal (clock signal) T and a Q-output for outputting signals. The signals from the output unit Q are given outside and fed back to the third input of the AND gate 24 as the data output Q and the serial output SO.

Figure 43:
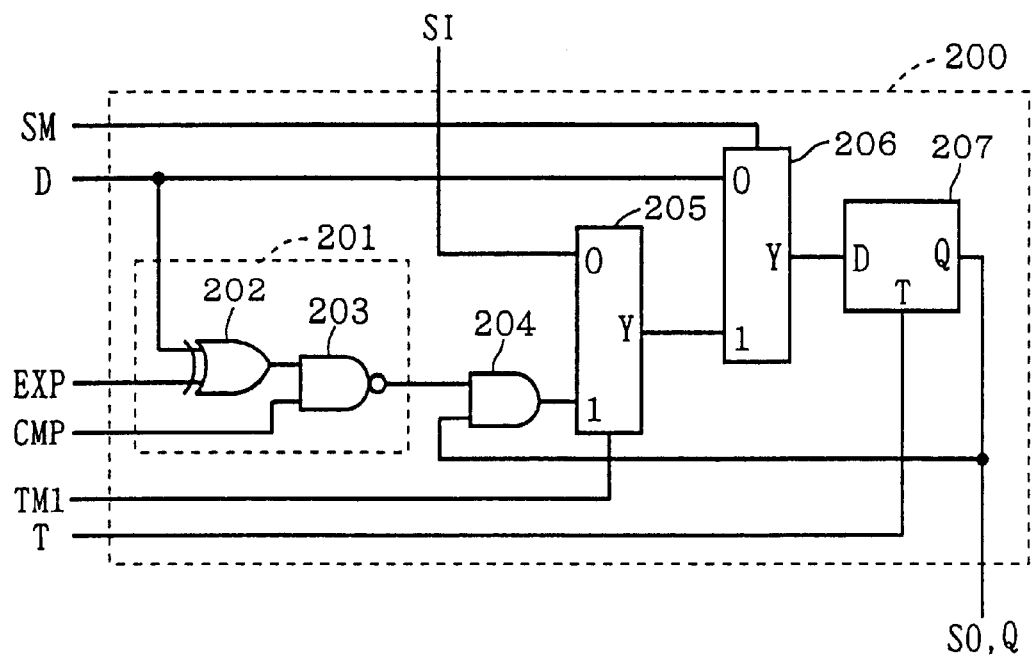
FIG. 43 is a circuit diagram showing an internal configuration of an S-FF in the prior art.

In this configuration, with the test-mode signal TM2 of "1", the S-FF 2 is equivalent to the prior-art S-FF 200 of FIG. 43, performing the same operation as the S-FF 200. On the other hand, with the test-mode signal TM2 of "0", the S-FF 2 performs the following operations.

Supplying the shift-mode signal SM of "0" starts a normal operation to take the input data D into the D-FF 27 in synchronization with the timing signal T. If the normal operation is not needed, the selector 26 may be removed and the output unit Y of the selector 25 may be directly connected to the D-input of the D-FF 27 as indicated by a broken line in FIG. 4.

With the shift-mode signal SM of "1" and the test-mode signal TM1 of "0", the S-FF 2 enters a shift operation mode to take the serial input SI into the D-FF 27 in synchronization with the timing signal T.

With the shift-mode signal SM of "1" and the test-mode signal TM1 of "1", the S-FF 2 enters a test mode. In the test mode, supplying the comparison control signal CMP of "0"

makes a test-invalid condition, and the output of the comparator 21 forcedly becomes "1". Therefore, an AND-operation result between the serial input SI and the Q-output of the D-FF 27 obtained by the AND gate 24 is fed back to the D-input of the D-FF 27.

In the test mode, supplying the comparison control signal CMP of "1" makes a test-valid condition. The input data D is compared with the expected value data EXP and when agrees, the EX-OR gate 22 outputs "0" and the comparator 21 outputs "1" as comparison result data. The AND-operation result between the serial input SI and the Q-output (latch data) of the D-FF 27 is fed back to the D-input of the D-FF 27.

On the other hand, when disagrees, the EX-OR gate 22 outputs "1" and the comparator 21 outputs "0" as comparison result data to forcedly latch "0" indicative of failure into the D-FF 27 (to be reset).

The S-FF 2 having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the second preferred embodiment. The test-mode signal TM of FIGS. 2 and 3 corresponds to the test-mode signals TM1 and TM2 of FIG. 4.

Since the test circuit of the second preferred embodiment has a configuration, like the first preferred embodiment, for propagating "0" indicative of failure in series on the scan path consisting of the SFF<0> to SFF<4> during the test mode with the test-mode signal TM2 set to "0", it is possible to quickly detect a failure of the RAM 11, and therefore the test circuit of the second preferred embodiment needs a shorter time to detect a defective piece than the prior-art one and cuts a test time.

Moreover, since the test circuit of the second preferred embodiment can switch between an operation mode {TM2= "1", the second test mode) for easy failure analysis by latching "0" only to the SFF<i> corresponding to the data output DO<i> having a failure and that for shorter test time as discussed above {TM2="0", the first test mode) according to "1"/"0" of the test-mode signal TM2, it is possible to select an appropriate test as required, for example, depending on whether for development or for mass production.

<<The Third Preferred Embodiment >>

Figure 5:
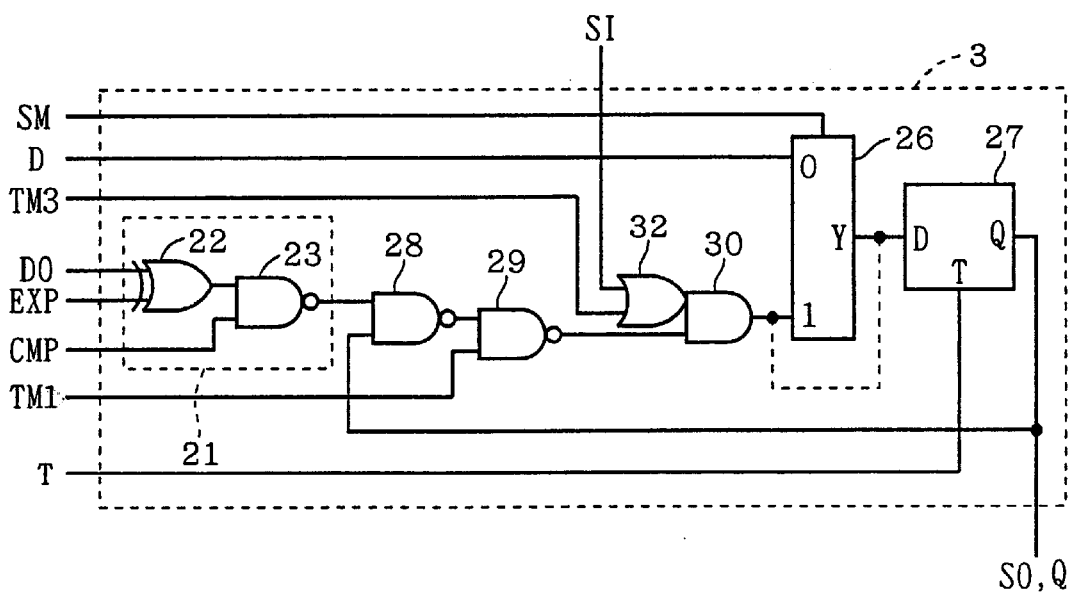
FIG. 5 is a circuit diagram showing an internal configuration of an S-FF in accordance with a third preferred embodiment of the present invention.

FIG. 5 is a circuit diagram showing a configuration of a scan flip flop (S-FF 3) used for a test circuit in a semiconductor integrated circuit device in accordance with the third preferred embodiment.

As shown in FIG. 5, one of inputs of an OR gate 32 receives the serial input SI and the other receives a test-mode signal TM3. An output of the OR gate 32 is connected to one of the inputs of the AND gate 30. Other constituent elements are the same as those of the S-FF 1 of FIG. 1.

With this configuration, supplying the test-mode signal TM3 of "1" makes the serial input SI invalid to start a test operation of no propagation of the serial output SO during the test mode (the second test mode), like the prior-art S-FF 200 of FIG. 43. The shift operation has to be executed with the test-mode signal TM3 of "0", the test-mode signal TM1 of "0" and the shift-mode signal SM of "1", unlike the prior-art S-FF 200.

On the other hand, with the test-mode signal TM3 of "0", the S-FF 3 is equivalent in circuit configuration to the S-FF 1 of FIG. 1, to perform the same operation as the S-FF 1.

The S-FF 3 having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the third preferred embodiment. The test-mode signal TM of FIGS. 2 and 3 corresponds to the test-mode signals TM1 and TM3 of FIG. 5.

Since the test circuit of the third preferred embodiment has a configuration, like the first preferred embodiment, for propagating "0" indicative of failure in series on the scan path consisting of the SFF<0> to SFF<4> during the test mode with the test-mode signal TM3 set to "0", it is possible to quickly detect a failure of the RAM 11, and therefore the test circuit of the third preferred embodiment needs a shorter time to detect a defective piece than the prior-art one and cuts a test time.

Moreover, since the test circuit of the third preferred embodiment can switch between an operation mode {TM3= "1", the second test mode) for easy failure analysis by latching "0" only to the SFF<i> corresponding to the data output DO<i> having a failure and that for shorter test time as discussed above {TM3="0" the first test mode) according to "1"/"0" of the test-mode signal TM3, it is possible to select an appropriate test as required, for example, depending on whether for development or for mass production.

Figure 44:
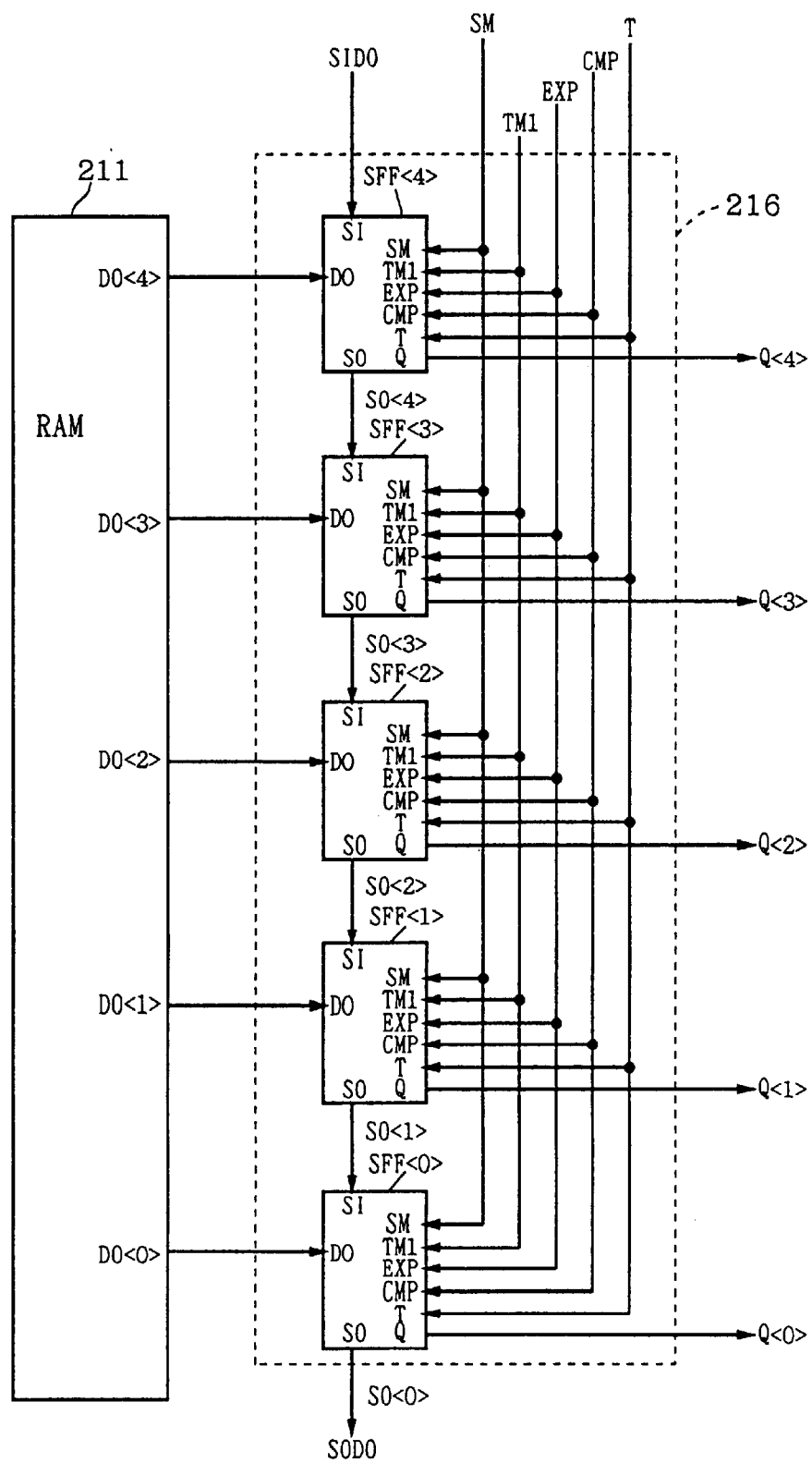
FIG. 44 is a circuit diagram showing a configuration of a test circuit used for a RAM with test function in the prior art.
Figure 45:
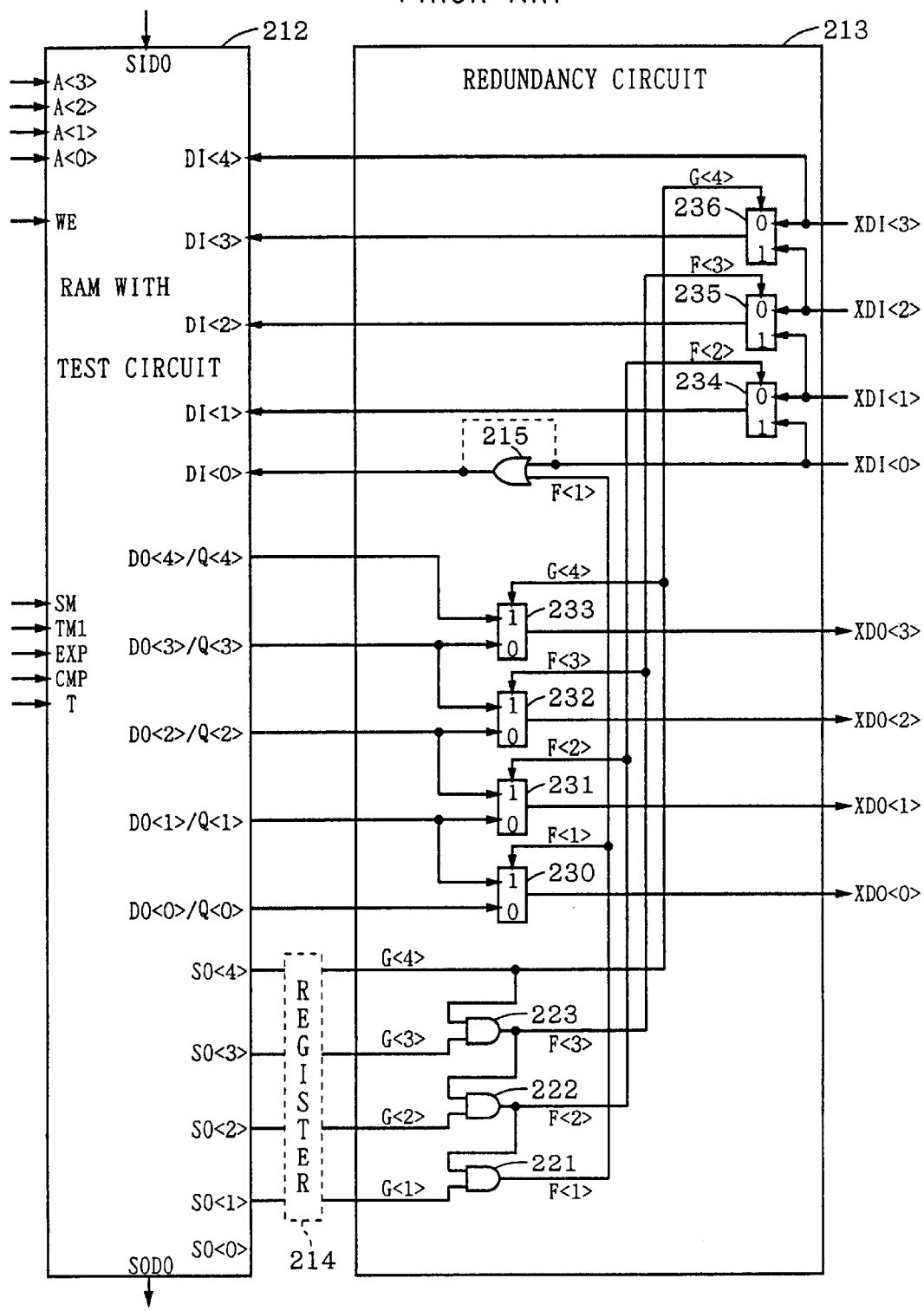
FIG. 45 is a circuit diagram showing a configuration of a redundancy circuit used for a RAM with test function and redundancy function in the prior art.

Further, with the test-mode signal TM3 of "1", the test-mode signal TM1 of "0" and the shift-mode signal SM of "1", the S-FF 3 of the third preferred embodiment forcedly brings the output of the AND gate 30 into "1" to latch "1" to the D-FF 27. Though the prior-art test circuit of FIG. 44 needs to set "1" to each of the scan flip flops through the serial shift operation prior to the test of the RAM, the test circuit having the scan path consisting of the S-FFs 3 of FIG. 5 can set "1" to all the SFF<0> to SFF<4> at a time for one clock cycle of the timing signal T with the above-set signals, thereby further cutting the test time.

<<The Fourth Preferred Embodiment>>

Figure 6:
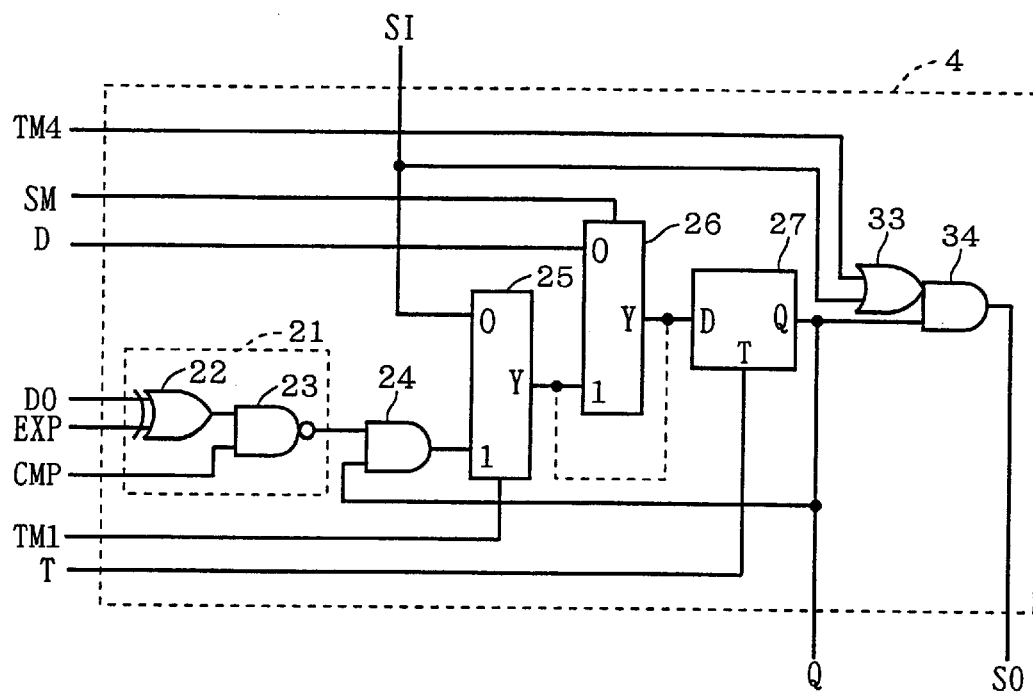
FIG. 6 is a circuit diagram showing an internal configuration of an S-FF in accordance with a fourth preferred embodiment of the present invention.

FIG. 6 is a circuit diagram showing a configuration of a scan flip flop (S-FF 4) used for a test circuit in a semiconductor integrated circuit device in accordance with the fourth preferred embodiment.

As shown in FIG. 6, one of inputs of an OR gate 33 receives a test-mode signal TM4 and the other receives the serial input SI. One of inputs of an AND gate 34 is connected to an output of the OR gate 33 and the other receives the data output Q of the D-FF 27. An output of the AND gate 34 serves as the serial output SO.

The S-FF 4 has the same configuration as the S-FF 2 of FIG. 4 except that the above-described elements are additionally provided and the test-mode signal TM2, the OR gate 31 and the input/output connections therefor are omitted.

In this configuration, with the test-mode signal TM4 of "1" the S-FF 4 is equivalent to the prior-art S-FF 200 of FIG. 43, performing the same operation as the S-FF 200. On the other hand, with the test-mode signal TM4 of "0", the S-FF 2 performs the following operations.

With the shift-mode signal SM of "0", a normal operation starts to take the input data D into the D-FF 27 in synchronization with the timing signal T. If the normal operation is not needed, the selector 26 may be removed and the output unit Y of the selector 25 may be directly connected to the D-input of the D-FF 27 as indicated by a broken line in FIG. 6.

With the shift-mode signal SM of "1" and the test-mode signal TM1 of "0", the S-FF 4 enters a shift operation mode to take the serial input SI into the D-FF 27 in synchronization with the timing signal T.

With the shift-mode signal SM of "1" and the test-mode signal TM1 of "1", the S-FF 4 enters a test mode (the first test mode). In the test mode, supplying the comparison control signal CMP of "0" makes a test-invalid condition, and the output of the comparator 21 forcedly becomes "1". Therefore, the data output Q of the D-FF 27 is fed back to the D-input and an AND-operation result between the serial input SI and the Q-output of the D-FF 27 (latch data) obtained by the AND gate 34 is outputted as the serial output SO.

In the test mode, supplying the comparison control signal CMP of "1" makes a test-valid condition. The input data D is compared with the expected value data EXP and when agrees, the EX-OR gate 22 outputs "0" and the comparator 21 outputs "1" as comparison result data. Therefore, the data output Q of the D-FF 27 is fed back to the D-input and the AND-operation result between the serial input SI and the Q-output of the D-FF 27 (latch data) is outputted as the serial output SO.

On the other hand, when disagrees, the EX-OR gate 22 outputs "1" and the comparator 21 outputs "0" as comparison result data to forcedly latch "0" into the D-FF 27 (to be reset). Therefore, both the data output Q and the serial output SO become "0".

The S-FF 4 having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the fourth preferred embodiment. The test-mode signal TM of FIGS. 2 and 3 corresponds to the test-mode signals TM1 and TM4 of FIG. 6.

Since the test circuit of the fourth preferred embodiment has a configuration, like the first preferred embodiment, for propagating "0" indicative of failure in series on the scan path consisting of the SFF<0> to SFF<4> during the test mode with the test-mode signal TM4 set to "0" (the second test mode), it is possible to quickly detect a failure of the RAM 11, and therefore the test circuit of the fourth preferred embodiment needs a shorter time to detect a defective piece than the prior-art one and cuts a test time.

Moreover, since the test circuit of the fourth preferred embodiment latches "0" only to the SFF<i> corresponding to the data output DO<i> having a failure also during the test mode with the test-mode signal TM4 set to "0" (the first test mode), it is possible to specify the defective portion by shifting the latch data of the SFF<0> to SFF<4> out as the serial output data SODO after the test.

<<The Fifth Preferred Embodiment>>

Figure 7:
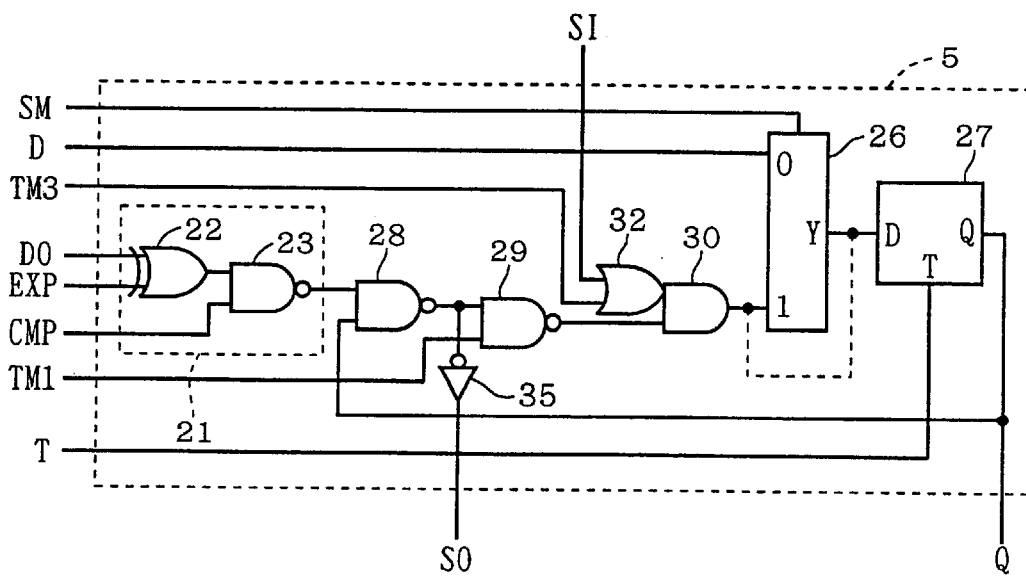
FIG. 7 is a circuit diagram showing an internal configuration of an S-FF in accordance with a fifth preferred embodiment of the present invention.

FIG. 7 is a circuit diagram showing a configuration of a scan flip flop (S-FF 5) used for a test circuit in a semiconductor integrated circuit device in accordance with the fifth preferred embodiment.

As shown in FIG. 7, an input of an inverter 35 is connected to the output of the NAND gate 28 and an output of the inverter 35 is given as the serial output SO. Other constituent elements are the same as those of the S-FF 3 of FIG. 5.

With this configuration, supplying the test-mode signal TM3 of "1" makes the serial input SI invalid to start a test operation of no propagation of the serial output SO during the test mode (the second test mode), like the prior-art S-FF 200 of FIG. 43.

The shift operation has to be executed with the test-mode signal TM3 of "0", the test-mode signal TM1 of "0", the shift-mode signal SM of "1" and the comparison control signal CMP="1", unlike the prior-art S-FF 200.

On the other hand, with the test-mode signal TM3 of "0", the S-FF 5 is equivalent in circuit configuration to the S-FF 1, to perform the same operation as the S-FF 1. Furthermore, when the comparator 21 outputs "0" indicative of failure as comparison result data, the inverter 35 outputs "0" indicative of failure as the serial output SO until the D-FF 27 latches "0" therein.

The S-FF 5 of the fifth preferred embodiment having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the fifth preferred embodiment. The test-mode signal TM of FIGS. 2 and 3 corresponds to the test-mode signals TM1 and TM3 of FIG. 7.

Since the test circuit of the fifth preferred embodiment has a configuration, like the first preferred embodiment, for propagating "0" indicative of failure in series on the scan path consisting of the SFF<0> to SFF<4> during the test mode with the test-mode signal TM3 set to "0", it is possible to quickly detect a failure of the RAM 11, and therefore the test circuit of the fifth preferred embodiment needs a shorter time to detect a defective piece than the prior-art one and cuts a test time.

Since the test circuit of the fifth preferred embodiment has a configuration for instantaneously showing the comparison result data outputted from the comparator 21 as the serial output SO outputted from the inverter 35, it can propagate "0" indicative of failure to the following scan flip flop earlier than the test circuit of the third preferred embodiment shown in FIG. 5 by one cycle of the timing signal T, thus further cutting the test time.

Further, with the test-mode signal TM3 of "1", the test-mode signal TM1 of "0" and the shift-mode signal SM of "1", the S-FF 5 of the fifth preferred embodiment can forcedly brings the output of the AND gate 30 into "1" to latch "1" to the D-FF 27, thereby further cutting the test time.

Moreover, since the test circuit of the fifth preferred embodiment can switch between an operation mode {TM3= "1", the second test mode) for easy failure analysis and that for shorter test time {TM3="0", the first test mode) according to "1"/"0" of the test-mode signal TM3, it is possible to select an appropriate test as required, for example, depending on whether for development or for mass production.

<<The Sixth Preferred Embodiment>>

Figure 8:
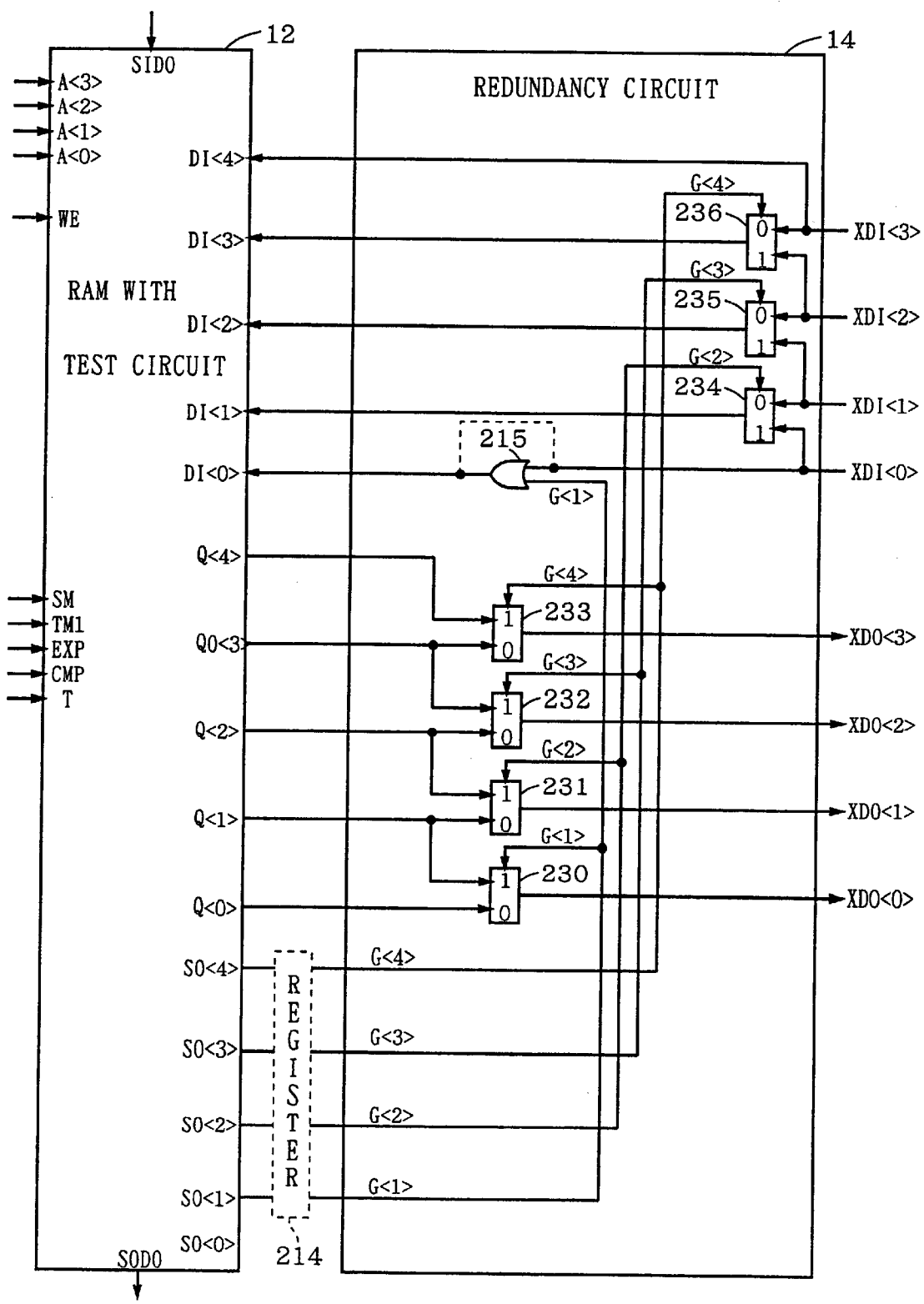
FIG. 8 is a circuit diagram showing a configuration of a redundancy circuit in a RAM with test and redundancy functions in accordance with a sixth preferred embodiment of the present invention.

FIG. 8 is a circuit diagram showing a configuration of a semiconductor integrated circuit device having a RAM 12 with test circuit and a redundancy circuit 14 in accordance with the sixth preferred embodiment. The RAM 12 with test circuit of FIG. 8 corresponds to a combination of the RAM 11 and the test circuit 10 of FIG. 2, for example.

Any of the S-FFs 1 to 5 of FIGS. 1 and 4 to 7 can be used as each of the SFF<0> to SFF<4> in the test circuit 10.

As shown in FIG. 8, the serial outputs SO<1> to SO<4> of the SFF<1> to SFF<4> are taken into the register 214 and stored therein as the store data G<1> to G<4>.

The redundancy circuit 14 is provided with the selectors 230 to 234 correspondingly to the data outputs Q<0> to Q<4> of the RAM 12 with test circuit. The selectors 230 to 233 have "0"-inputs receiving the data outputs Q<0> to Q<3>, "1"-inputs receiving the data outputs Q<1> to Q<4> and control inputs receiving the store data G<1> to G<4>, respectively. The outputs of the selectors 230 to 233 are the redundancy data outputs XDO<0> to XDO<3>, respectively.

On the other hand, the OR gate 215 and the selectors 234 to 236 are provided correspondingly to the data inputs DI<0> to DI<4> of the RAM 12 with test circuit. One of the inputs of the OR gate 215 receives the redundancy data input XDI<0> and the other receives the store data G<1>. The selectors 234 to 236 have "0"-inputs receiving the redundancy data inputs XDI<1> to XDI<3>, "1"-inputs receiving the redundancy data inputs XDI<0> to XDI<2> and the control inputs receiving the store data G<2> to G<4>, respectively.

The output of the OR gate 215 is applied to the data input DI<0>, the outputs of the selectors 234 to 236 are applied to the data inputs DI<1> to DI<3>, respectively, and the redundancy data output XDO<3> is applied to the data input DI<4>.

With this configuration, if the data output DO<2> of the RAM 12 with test circuit, for example, has a failure, the test operation of the first test mode for propagating the serial output SO is executed to latch "0" into the SFF<2> corresponding to the data output DO<2> and the serial output SO of "0" indicative of failure is propagated through the SFF<1> and the SFF<0>.

As a result, the serial output SO<2>=SO<1>=SO<0>="0" (the serial outputs SO<3> and SO<4> are kept "1").

When the serial outputs SO<1> to SO<3> are taken into the register 214, the store data are as follows: G<1>=0, G<2>=0, G<3>=1 and G<4>=1. As a result, the redundancy data outputs XDO<0> to XDO<3> are outputted according to such a correspondence as {DO<4>/Q<4> to XDO<3>, DO<3>/Q<3> to XDO<2>, DO<1>/Q<1> to XDO<1> and DO<0>/Q<0> to XDO<0>} through the signal selection by the selectors 230 to 233 based on the store data G<1> to G<4>. In short, the data output DO<2> having a failure is not used.

Similarly, the redundancy data inputs XDI<0> to XDI<3> are inputted according to such a correspondence as {XDI<3> to DI<4>, XDI<2> to DI<3> and DI<2>, XDI<1> to DI<1> and XDI<0> to DI<0>} through the signal selection by the selectors 234 to 236 based on the store data G<2> to G<4>. In short, the redundancy data input XDI<2> is inputted also to the data input DI<3> besides the data input DI<2> corresponding to the data output DO<2> having a failure.

Thus, even when the RAM 12 with test circuit provided with the data output DO<2> has a failure, it works normally as a 4-bit input/output RAM by using the RAM 12 with test circuit and the redundancy circuit 14 through connection change of the redundancy circuit 14.

As discussed above, observing the serial outputs SO<0> to SO<4> of the RAM 12 with test circuit clearly reveals the border between a bit indicative of failure and that indicative of no failure.

Therefore, the redundancy circuit 14 of the sixth preferred embodiment has a simple circuit configuration since it can use the store data G<1> to G<4>, or the serial outputs SO<1> to SO<4> of the RAM 12 with test circuit for controlling the selectors 230 to 236.

When the D-FFs 27 in the SFF<0> the SFF<4> are not used as flip flops for output during the normal operation, the register 214 can be omitted by using the D-FFs 27 as registers for storing the redundancy control data of the redundancy circuit 14. Further, by omitting the OR gate 215, the data input DI<0> and the redundancy data input XDI<0> may be shorted as indicated by a broken line of FIG. 8.

<<The Seventh Preferred Embodiment>>

Figure 9:
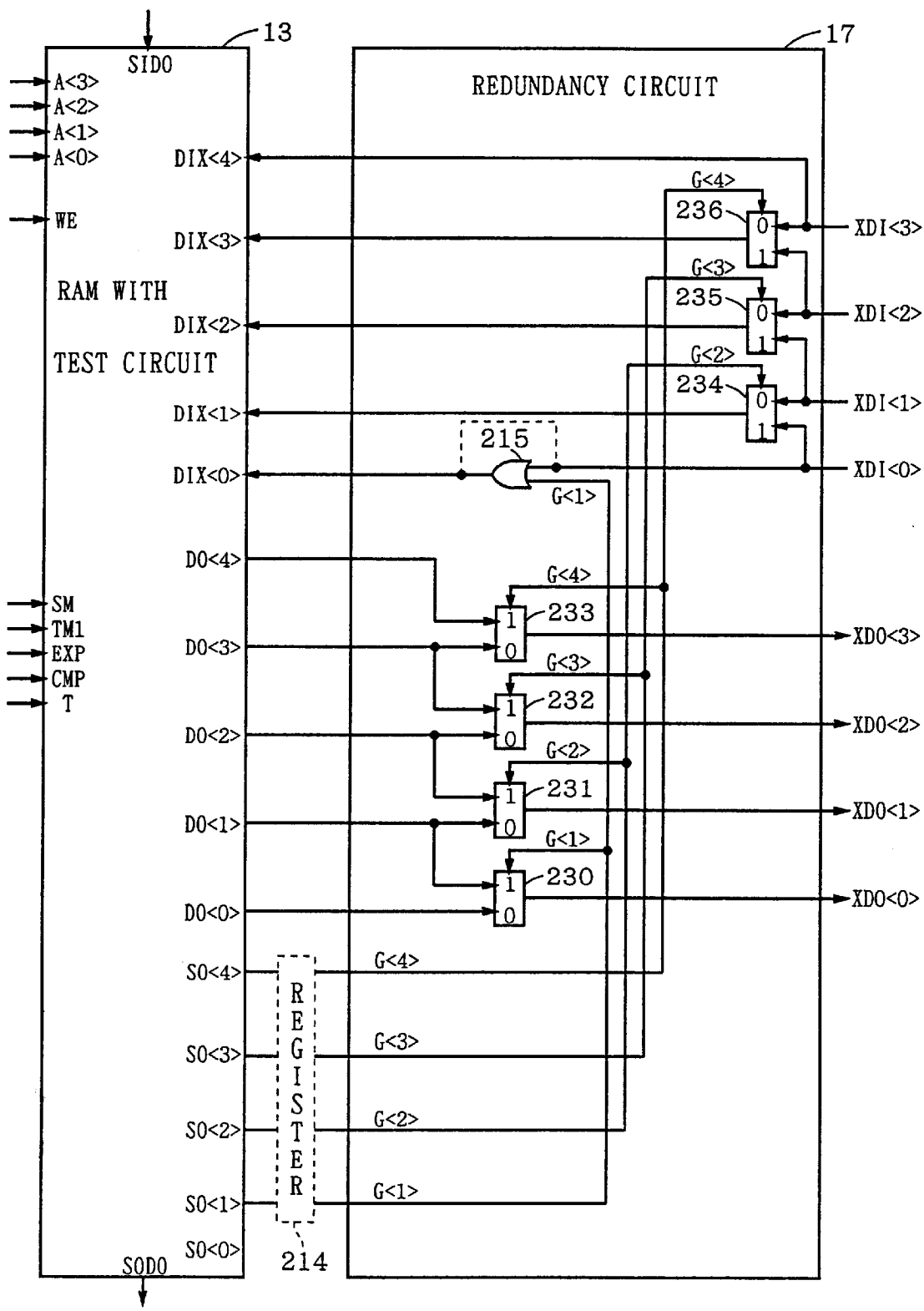
FIG. 9 is a circuit diagram showing a configuration of a redundancy circuit in a RAM with test and redundancy functions in accordance with a seventh preferred embodiment of the present invention.

FIG. 9 is a circuit diagram showing a configuration of a semiconductor integrated circuit device having a RAM 13 with test circuit and a redundancy circuit 17 in accordance with the seventh preferred embodiment. The RAM 13 with test circuit of FIG. 9 corresponds to a combination of the RAM 11 and the test circuit 16 of FIG. 3, for example.

Any of the S-FFs 1 to 5 of FIGS. 1 and 4 to 7 can be used as each of the SFF<0> to SFF<4> in the test circuit 10.

As shown in FIG. 9, the serial outputs SO<1> to SO<4> of the SFF<1> to SFF<4> are taken into the register 214 and stored therein as the store data G<1> to G<4>.

The redundancy circuit 17 is provided with the selectors 230 to 234 correspondingly to the data outputs DO<0> to DO<4> of the RAM 13 with test circuit. The selectors 230 to 233 have "0"-inputs receiving the data outputs DO<0> to DO<3>, "1"-inputs receiving the data outputs DO<1> to DO<4> and control inputs receiving the store data G<1> to G<4>, respectively. The outputs of the selectors 230 to 233 are the redundancy data outputs XDO<0> to XDO<3>, respectively.

On the other hand, the OR gate 215 and the selectors 234 to 236 are provided correspondingly to the data inputs DIX<0> to DIX<4> of the RAM 13 with test circuit. One of the inputs of the OR gate 215 receives the redundancy data input XDI<0> and the other receives the store data G<1>. The selectors 234 to 236 have "0"-inputs receiving the redundancy data inputs XDI<1> to XDI<3>, "1"-inputs receiving the redundancy data inputs XDI<0> to XDI<2> and the control inputs receiving the store data G<2> to G<4>, respectively.

The output of the OR gate 215 is applied to the data input DIX<0>, the outputs of the selectors 234 to 236 are applied to the data inputs DIX<1> to DIX<3>, respectively, and the redundancy data output XDO<3> is applied to the data input DIX<4>.

With this configuration, if the data output DO<2> of the RAM 13, for example, has a failure, the test operation of the first test mode for propagating the serial output SO is executed, like the sixth preferred embodiment, and consequently, the serial output SO<2> =SO<1> =SO<0> ="0" (the serial outputs SO<3> and SO<4> are kept "1").

As a result, the data output DO<2> having a failure is not used through the signal selection by the selectors 230 to 233 based on the store data G<1> to G<4>, like the sixth preferred embodiment.

Similarly, the redundancy data input XDI<2> is inputted also to the data input DIX<3> besides the data input DIX<2> corresponding to the data output DO<2> having a failure through the signal selection by the selectors 234 to 236 based on the store data G<2> to G<4>, like the sixth preferred embodiment.

Thus, even when the RAM 13 with test circuit provided with the data output DO<2> has a failure, it works normally as a 4-bit input/output RAM by using the RAM 13 with test circuit and the redundancy circuit 17 through connection change of the redundancy circuit 17.

Therefore, the redundancy circuit 17 of the seventh preferred embodiment has a simple circuit configuration since it can use the serial outputs SO<1> to SO<4> of the RAM 13 with test circuit for controlling the selectors 230 to 236, like the sixth preferred embodiment.

When the D-FFs 27 in the SFF<0> the SFF<4> are not used as flip flops for output during the normal operation, the register 214 can be omitted by using the D-FFs 27 as registers for storing the redundancy control data of the redundancy circuit 17. Further, by omitting the OR gate 215, the data input DI<0> and the redundancy data input XDI<0> may be shorted as indicated by a broken line of FIG. 9.

<<The Eighth Preferred Embodiment>>

Figure 10:
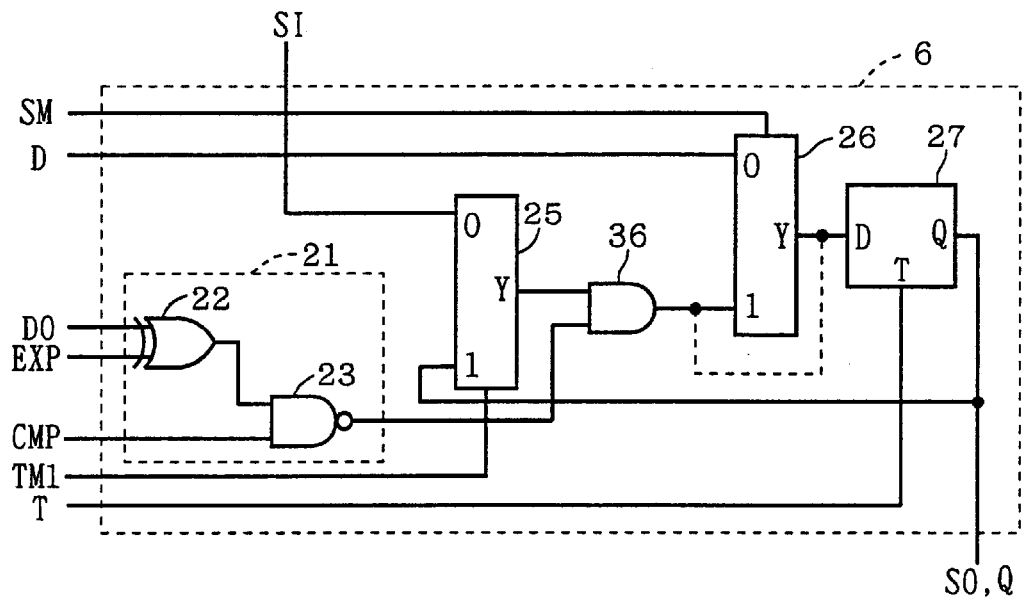
FIG. 10 is a circuit diagram showing an internal configuration of an S-FF in accordance with an eighth preferred embodiment of the present invention.

FIG. 10 is a circuit diagram showing a configuration of a scan flip flop (S-FF 6) used for a test circuit in a semiconductor integrated circuit device in accordance with the eighth preferred embodiment.

As shown in FIG. 10, one of inputs of an AND gate 36 is connected to the output unit Y of the selector 25 and the other is connected to the output of the comparator 21.

The S-FF 6 has the same configuration as the S-FF 2 of the second preferred embodiment shown in FIG. 4 except that the above-described elements are additionally provided and the test-mode signal TM2, the OR gate 31 and the input/output connections therefor are omitted.

With this configuration, supplying the shift-mode signal SM of "0" starts a normal operation to take the input data D into the D-FF 27 in synchronization with the timing signal T. If the normal operation is not needed, the selector 26 may be removed and the output unit Y of the selector 25 may be directly connected to the D-input of the D-FF 27 as indicated by a broken line in FIG. 10.

With the shift-mode signal SM of "1", the test-mode signal TM1 of "0" and the comparison control signal CMP of "0", the S-FF 6 enters a shift operation mode to take the serial input SI into the D-FF 27 in synchronization with the timing signal T.

With the shift-mode signal SM of "1" and the test-mode signal TM1 of "1", the S-FF 6 enters a test mode (the second test mode) with the serial input SI being invalid, to perform the same operation as the S-FF 200 of FIG. 43.

On the other hand, with the shift-mode signal SM of "1" and the test-mode signal TM1 of "0", the S-FF 6 enters a test mode (the first test mode) with the serial input SI being valid. In the test mode, supplying the comparison control signal CMP of "0" makes a test-invalid condition, and the output of the comparator 21 forcedly becomes "1". Then, the serial input SI is latched into the D-FF 27 and outputted as the Q-output of the D-FF 27 and the serial output SO.

In the test mode with the serial input SI being valid, supplying the comparison control signal CMP of "1" makes a test-valid condition. The input data D is compared with the expected value data EXP and when agrees, the EX-OR gate 22 outputs "0" and the comparator 21 outputs "1" as comparison result data. Then, the serial input SI is latched into the D-FF 27 and outputted as the Q-output of the D-FF 27 and the serial output SO.

On the other hand, when disagrees, the EX-OR gate 22 outputs "1" and the comparator 21 outputs "0" as comparison result data to forcedly latch "0" into the D-FF 27 (to be reset). Therefore, both the data output Q of the D-FF 27 and the serial output SO become "0" indicative of failure.

The S-FF 6 of the eighth preferred embodiment having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the eighth preferred embodiment. The test-mode signal TM of FIGS. 2 and 3 corresponds to the test-mode signal TM1 of FIG. 10.

Since the test circuit of the eighth preferred embodiment has a configuration, like the first preferred embodiment, for propagating "0" indicative of failure in series on the scan path consisting of the SFF<0> to SFF<4> during the test mode with the serial input SI being valid, it is possible to quickly detect a failure of the RAM 11, and therefore the test circuit of the eighth preferred embodiment needs a shorter time to detect a defective piece than the prior-art one and cuts a test time.

Further, the S-FF 6 of the eighth preferred embodiment can be advantageously achieved with a simpler circuit configuration than the prior-art S-FF 200 of FIG. 43, without requiring more circuits (specifically made of three logic gates, two selectors and one D-FF).

Moreover, since the test circuit of the eighth preferred embodiment can switch between an operation mode {TM1="1", the second test mode) for easy failure analysis and that for shorter test time {TM1="0", the first test mode) according to "1"/"0" of the test-mode signal TM1, it is possible to select an appropriate test as required, for example, depending on whether for development or for mass production, like the third preferred embodiment.

The S-FF 6 of the eighth preferred embodiment has a characteristic feature of not having "0" indicative of failure left therein since the AND operation between the comparison result data outputted from the comparator 21 and the serial input SI is executed by the AND gate 36 and the data output Q of the D-FF 27 is not cared in the test mode with the serial input SI being valid.

<<The Ninth Preferred Embodiment>>

Figure 11:
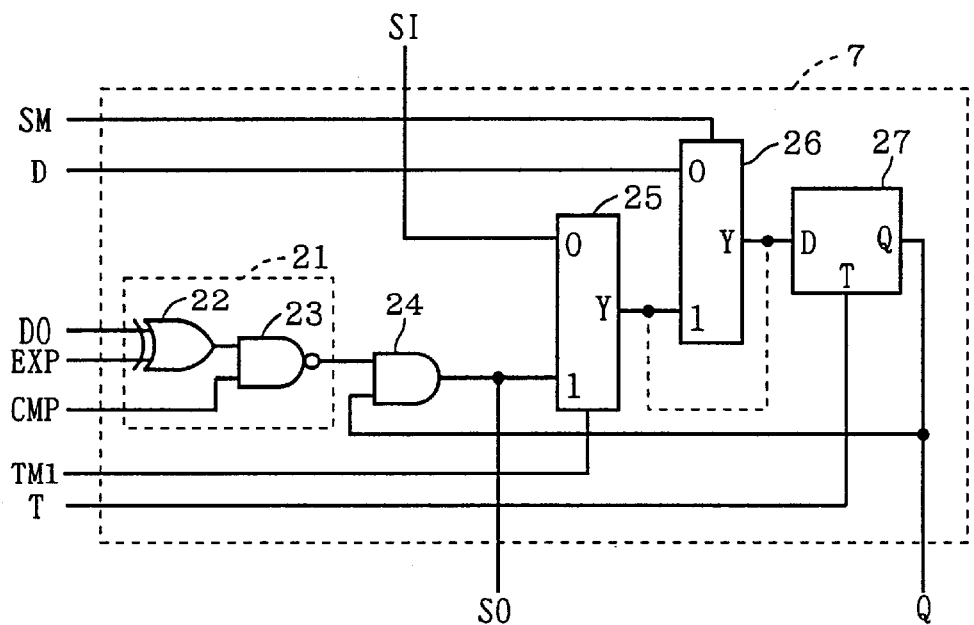
FIG. 11 is a circuit diagram showing an internal configuration of an S-FF in accordance with a ninth preferred embodiment of the present invention.

FIG. 11 is a circuit diagram showing a configuration of a scan flip flop (S-FF 7) used for a test circuit in a semiconductor integrated circuit device in accordance with the ninth preferred embodiment.

As shown in FIG. 11, the S-FF 7 has the same configuration as the S-FF 2 of FIG. 4 except that the test-mode signal TM2, the OR gate 31 and the input/output connections therefor are omitted and the output of the AND gate 24 is outputted as the serial output SO.

With this configuration, supplying the shift-mode signal SM of "0" starts a normal operation to take the input data D into the D-FF 27 in synchronization with the timing signal T. If the normal operation is not needed, the selector 26 may be removed and the output unit Y of the selector 25 may be directly connected to the D-input of the D-FF 27 as indicated by a broken line in FIG. 11.

With the shift-mode signal SM of "1", the test-mode signal TM1 of "0" and the comparison control signal CMP of "0", the S-FF 7 enters a shift operation mode to take the serial input SI into the D-FF 27 in synchronization with the timing signal T.

With the shift-mode signal SM of "1" and the test-mode signal TM1 of "1", the S-FF 7 enters a test mode (the second test mode) with the serial input SI being invalid, to perform the same test operation as the S-FF 200 of FIG. 43.

On the other hand, with the shift-mode signal SM of "1" and the test-mode signal TM1 of "0", the S-FF 7 enters a test mode (the first test mode) with the serial input SI being valid. In the test mode, supplying the comparison control signal CMP of "0" makes a test-invalid condition, and the output of the comparator 21 forcedly becomes "1". Then, the serial input SI is latched into the D-FF 27 and the Q-output of the D-FF 27 is outputted as the serial output SO.

In the first test mode with the serial input SI being valid, supplying the comparison control signal CMP of "1" makes a test-valid condition. The input data D is compared with the expected value data EXP and when agrees, the EX-OR gate 22 outputs "0" and the comparator 21 outputs "1" as comparison result data. Then, the serial input SI is latched into the D-FF 27 and the Q-output of the D-FF 27 is outputted as the serial output SO.

On the other hand, when disagrees, the EX-OR gate 22 outputs "1" and the comparator 21 outputs "0" as comparison result data to forcedly output "0" as the serial output SO. The serial input SI is latched into the D-FF 27 and outputted as the Q-output of the D-FF 27.

The S-FF 7 of the ninth preferred embodiment having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the ninth preferred embodiment. The test-mode signal TM of FIGS. 2 and 3 corresponds to the test-mode signal TM1 of FIG. 11.

Since the test circuit of the ninth preferred embodiment has a configuration, like the first preferred embodiment, for propagating "0" indicative of failure in series on the scan path consisting of the SFF<0> to SFF<4> during the first test mode with the serial input SI being valid, it is possible to quickly detect a failure of the RAM 11, and therefore the test circuit of the ninth preferred embodiment needs a shorter time to detect a defective piece than the prior-art one and cuts a test time.

Further, the S-FF 7 of the ninth preferred embodiment can be advantageously achieved with a simpler circuit configuration than the prior-art S-FF 200 of FIG. 43, without requiring more circuits (specifically made of three logic gates, two selectors and one D-FF).

Moreover, since the test circuit of the eighth preferred embodiment can switch between an operation mode {TM1= "1", the second test mode) for easy failure analysis and that for shorter test time {TM1="0", the first test mode) according to "1"/"0" of the test-mode signal TM1, it is possible to select an appropriate test as required, for example, depending on whether for development or for mass production, like the third preferred embodiment.

The S-FF 7 of the ninth preferred embodiment has a characteristic feature of not having "0" indicative of failure left therein since the AND operation between the comparison result data outputted from the comparator 21 and the data output Q of the D-FF 27 is executed by the AND gate 24 to output the serial output SO and the data output Q of the D-FF 27 is not fed back to the D-input thereof in the test mode with the serial input SI being valid.

<<The Tenth Preferred Embodiment>>

A scan flip flop used for a test circuit in a semiconductor integrated circuit device of the tenth preferred embodiment employs a multi-input comparator, instead of the comparator 21 used in each of the S-FFs 1 to 7. The S-FF of the tenth preferred embodiment effectively works in a RAM of multi-bit output (DRAM/SRAM).

Figure 12:
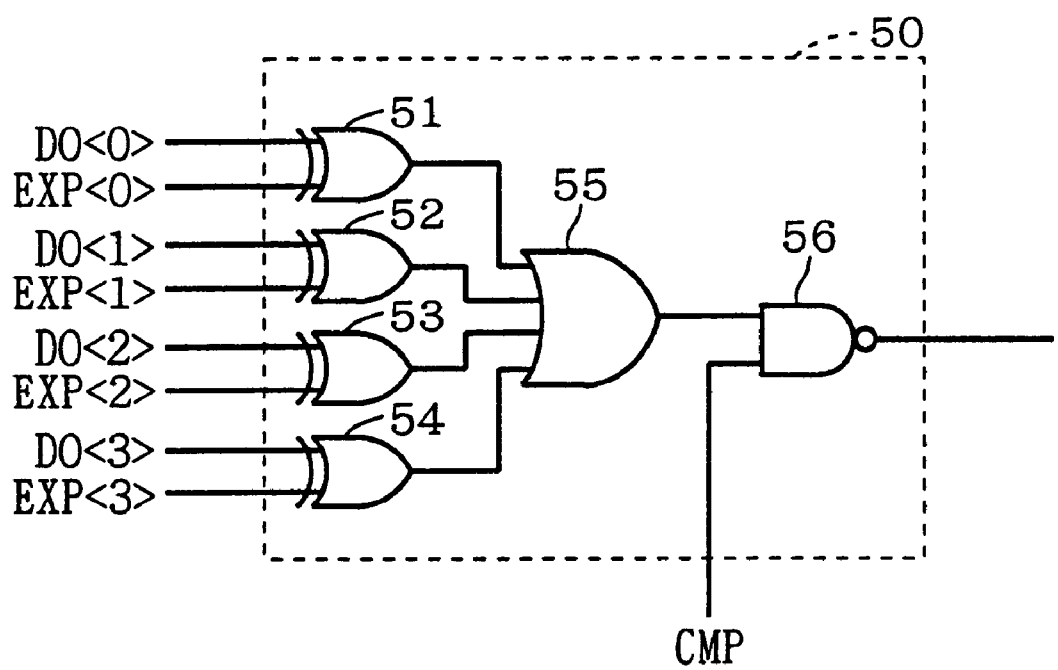
FIG. 12 is a circuit diagram showing a configuration of a comparator in an S-FF in accordance with a tenth preferred embodiment of the present invention.

FIG. 12 illustrates a comparator 50 with 4-bit input (DO<0>, DO<1>, DO<2> and DO<3>). As shown in FIG. 12, the comparator 50 consists of EX-OR gates 51 to 54, an OR gate 55 and a NAND gate 56.

Respective one inputs of the EX-OR gates 51 to 54 receive the input data DO<0> to DO<3> and the others receive expected value data EXP<0> to EXP<3>. The 4-input OR gate 55 is connected to outputs of the EX-OR gates 51 to 54. One of inputs of the NAND gate 56 is connected to an output of the OR gate 55 and the other receives the comparison control signal CMP.

The comparator 50 having the above configuration is used, instead of the comparator 21 used in each of the S-FFs 1 to 7, to achieve the S-FF of the tenth preferred embodiment. The S-FF of the tenth preferred embodiment can compare four bits at a time. Therefore, using the S-FF of the tenth preferred embodiment to constitute the scan path in the test circuit reduces the number of S-FFs 1 to 7 internally having the comparator 21 to one quarter.

The expected value data (EXP<0>, EXP<1>, EXP<2> and EXP<3>) may be applied independently or commonly in appropriate groups (depending on configurations of the RAMs).

Figure 13:
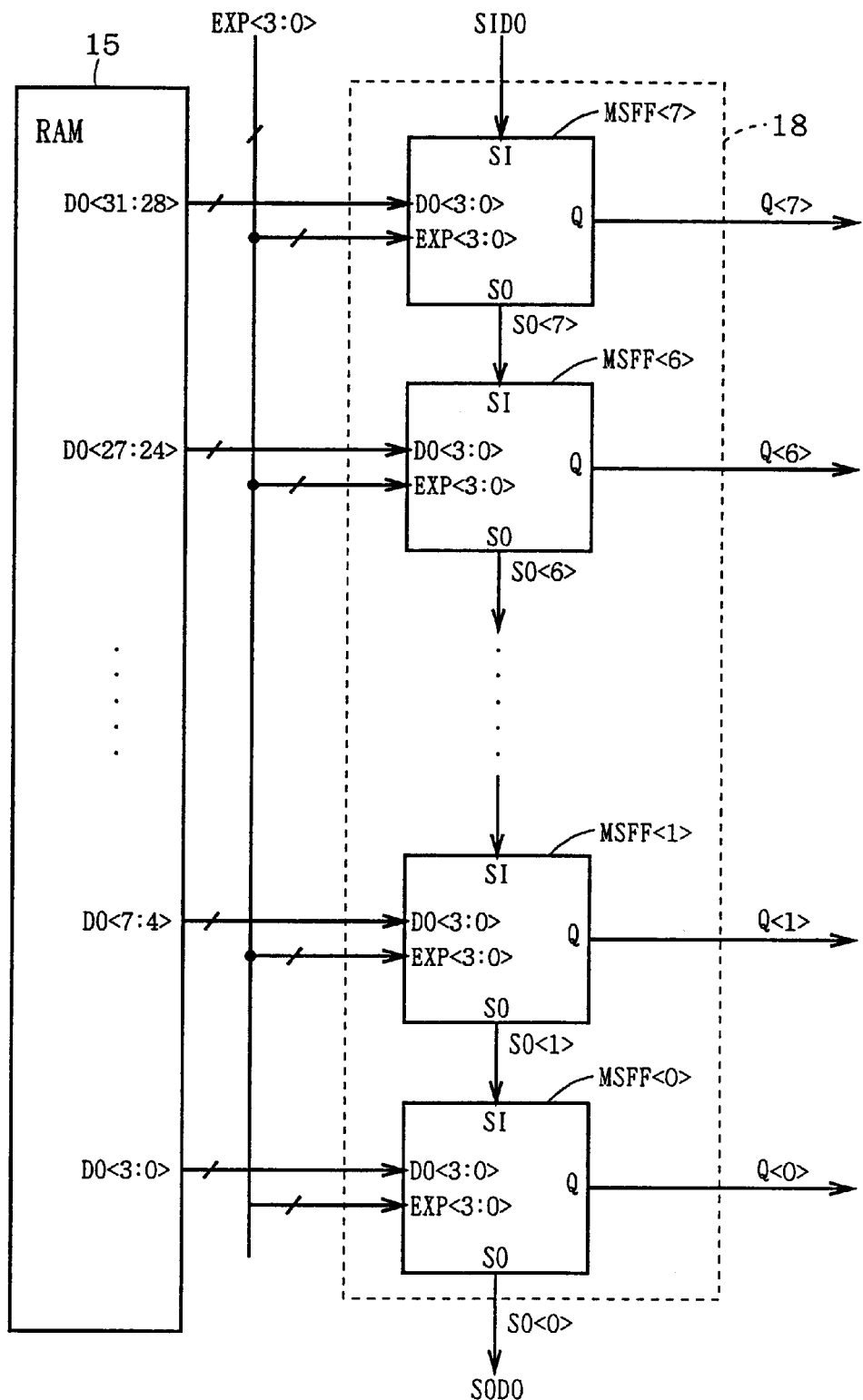
FIG. 13 is a circuit diagram showing a configuration of a test circuit in accordance with the tenth preferred embodiment of the present invention.

FIG. 13 is a circuit diagram showing a configuration of a test circuit 18 in a semiconductor integrated circuit device using the S-FF of the tenth preferred embodiment. The test circuit 18 is provided correspondingly to the data outputs DO<0> to DO<31> of a RAM 15.

As shown in FIG. 13, the test circuit 18 has a scan path for RAM test connecting in series eight scan flip flops MSFF<0> to MSFF<7> each of which uses the S-FF of the tenth preferred embodiment having the comparator 50 of FIG. 12.

Specifically, the MSFF<7> externally receives the serial input data SIDO as its serial input SI and its serial output SO is connected to the serial input SI of the MSFF<6>, and the MSFF<5>, . . . the MSFF<1> and the MSFF<0> are connected in series likewise. A serial output SO of the last-stage MSFF<0> is externally outputted as serial output data SODO.

The MSFF<0> to MSFF<7> receive the expected value data EXP<3:0> (EXP<3> to EXP<0>) in common and further, not shown in FIG. 13, receive the shift-mode signal SM, the test-mode signal TM, the comparison control signal CMP and the timing signal T in common, like the SFF<0> to SFF<4> of FIG. 2.

The MSFF<0> receives the output data DO<3:0> (DO<3> to DO<0>) of the RAM 15 as its input data DO<3:0> (DO<3> to DO<0>), the MSFF<1> receives the output data DO<7:4> as its input data DO<3:0>, and the MSFF<2>, . . . , MSFF<6> and MSFF<7> receive the output data DO<11:8>, . . . , DO<27:24> and DO<31:28> as respective input data DO<3:0> likewise.

The MSFF<0> to MSFF<7> output data outputs Q as data output Q<0> to Q<7>, respectively.

Hereafter, like the test circuit 10 of FIG. 2, the test circuit 18 performs the test on the data outputs DO<0> to DO<31> of the RAM 15.

Since the test circuit 18 of the tenth preferred embodiment has a configuration for propagating "0" (failure-indicative information) in series on the scan path consisting of the MSFF<0> to MSFF<7>, when any of the MS-FFs latches "0" during the test mode, the serial output data SODO quickly show "0" indicative of failure.

As a result, observing the serial output data SODO during the test mode allows quick detection of a failure of the RAM 15, and therefore the test circuit 18 needs a shorter time to detect a defective piece than the prior-art one and cuts a test time.

That needs only to provide eight MSFF<0> to MSFF<7> for 32-bit data, i.e., the data output DO<0> to DO<31>.

Figure 14:
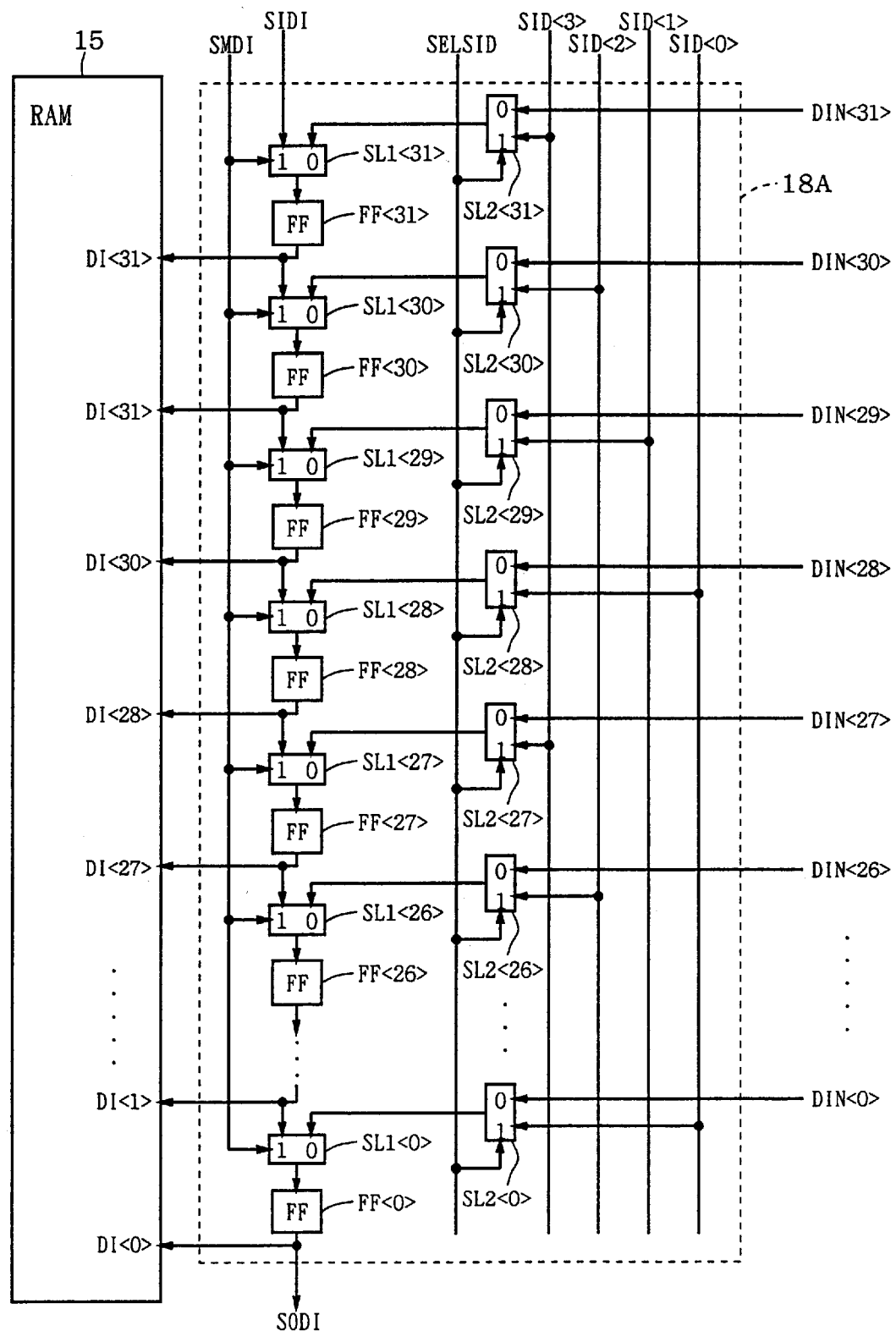
FIGS. 14 and 15 are circuit diagrams showing a configuration of a data input unit in accordance with the tenth preferred embodiment of the present invention.
Figure 15:
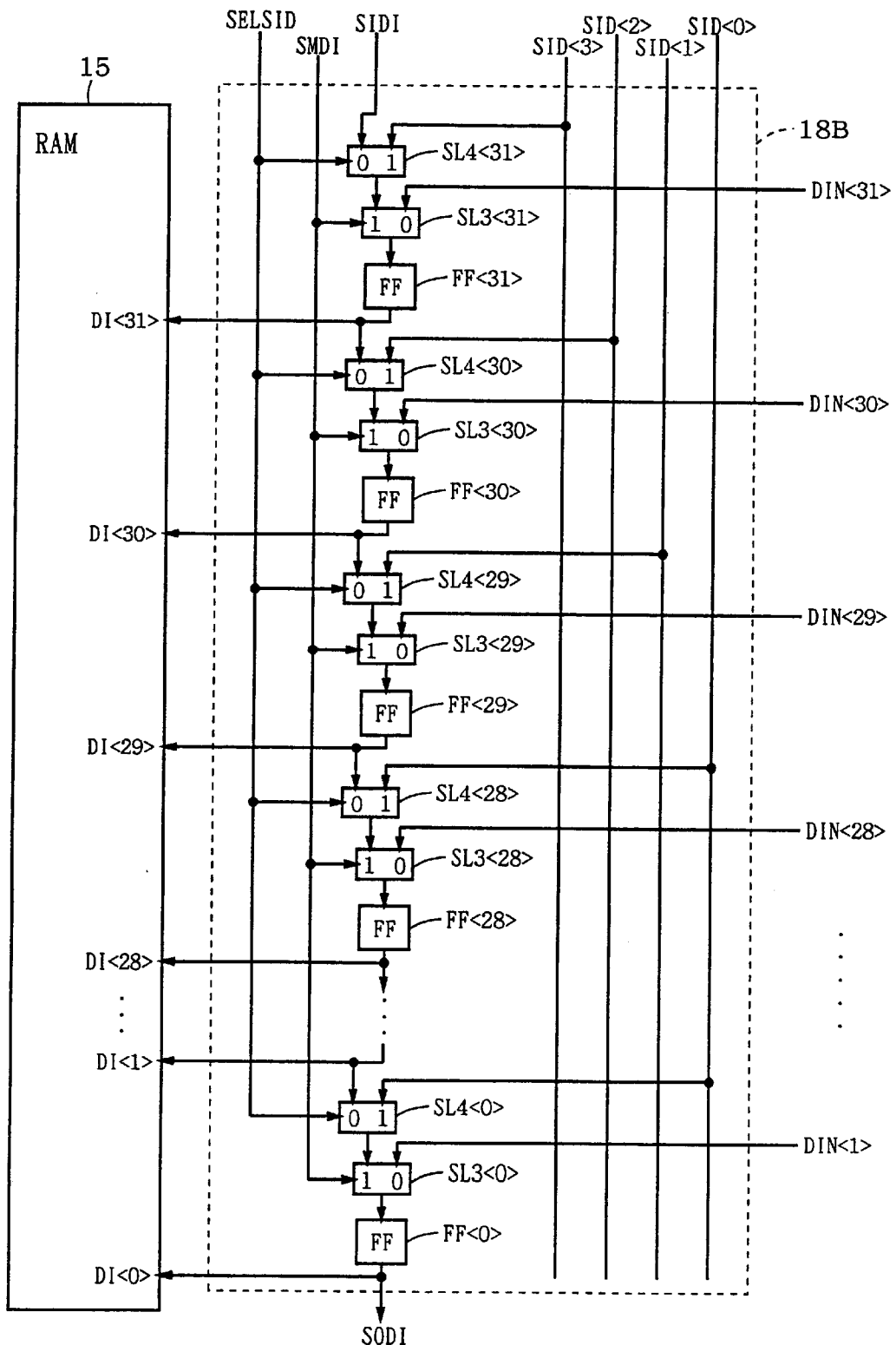

Though FIG. 13 does not show the data input DI<0> to DI<31> of the RAM 15 in the test circuit 18, a data input unit 18A of FIGS. 14 and 15, for example, may be used.

As shown in FIG. 14, the data input unit 18A in the test circuit 18 consists of flip flops FF<0> to FF<31>, selectors SL1<0> to SL1<31> and selectors SL2<0> to SL2<31>.

The selectors SL2<0> to SL2<31> have "0"-inputs receiving the input data DIN<0> to DIN<31> respectively, "1"-inputs as discussed below and control inputs receiving the selection signal SELSID in common.

The "1"-inputs of the selectors SL2<0>, SL2<4>, . . . , and SL2<28> receive the test data SID<0>, the "1"-inputs of the selectors SL2<1>, SL2<5>, . . . , and SL2<29> receive the test data SID<1>, the "1"-inputs of the selectors SL2<2>, SL2<6>, . . . , SL2<26> and SL2<30> receive the test data SID<2> and the "1"-inputs of the selectors SL2<3>, SL2<7>, . . . , SL2<27> and SL2<31> receive the test data SID<3>.

Respective "0"-inputs of the selectors SL1<0> to SL1<31> are connected to outputs of the selectors SL2<0> to SL2<31>, and therefore the outputs of the selectors SL2<0> to SL2<31> are connected to inputs of the flip flops FF<0> to FF<31>.

The "1"-input of the selector SL1<31> receives the serial input SIDI and the "1"-inputs of the selectors SL1<0> to SL1<30> receive outputs of the flip flops FF<1> to FF<31>, respectively. The control inputs of the selectors SL1<0> to SL1<31> receive a control signal SMDI in common.

Respective outputs of the flip flops FF<0> to FF<31> are given to the data inputs DI<0> to DI<31> and the output of the flip flop FF<31> is also given outside as serial output SODI. FIG. 14 does not show a timing control line for the flip flops FF<0> to FF<31> and the like.

With this configuration, the data input unit 18A can give the input data DIN<0> to DIN<31> to the data inputs DI<0> to DI<31> of the RAM 15 through the flip flops FF<0> to FF<31>, respectively, with the control signal SMDI of "0" and the selection signal SELSID of "0" during a normal operation (or an operation of capturing data in a scan test for user logic). The input data DIN<0> to DIN<31> are output results of random logics.

During the shift operation, with the control signal SMDI of "1", the flip flops FF<31> to FF<0> serve as a series shift register from the serial input SIDI to the serial output SODI.

During the RAM test, with the control signal SMDI of "0" and the selection signal SELSID of "1", the test data SID<j> corresponding to the data input DI<i> are propagated to the data input DI<i> through the flip flop FF<i> so as to compare the output data DO<i> (i=0 to 31) with the expected value data EXP<J> k=0 to 3). In short, the data are given as the test data SID<j> to be written during the test for the RAM 15.

On the other hand, as shown in FIG. 15, a data input unit 18B of the test circuit 18 consists of the flip flops FF<0> to FF<31>, selectors SL3<3> to SL3<31> and selectors SL4<0> to SL4<31>.

The "1"-inputs of the selectors SL4<0>, SL4<4>, . . . , and SL4<28> receive the test data SID<0>, the "1"-inputs of the selectors SL4<1>, SL4<5>, and SL4<29> receive the test data SID<1>, the "1"-inputs of the selectors SL4<2>, SL4<6>, . . . , SL4<26> and SL4<30> receive the test data SID<2> and the "1"-inputs of the selectors SL4<3>, SL4<7>, . . . , SL4<27> and SL4<31> receive the test data SID<3>.

The "0"-input of the selector SL4<31> receives the serial input SIDI and the "0"-inputs of the selectors SL4<0> to SL4<30> receive the outputs of the flip flops FF<1> to FF<31>. The control inputs of the selectors SL4<0> to SL4<31> receive the selection signal SELSID in common.

The selectors SL3<0> to SL3<31> have "0"-inputs receiving the input data DIN<0> to DIN<31>, "1"-inputs connected to outputs of the selectors SL4<0> to SL4<31>, respectively, and control inputs receiving the control signal SMDI in common. Outputs of the selectors SL3<0> to SL3<31> are connected to the inputs of the flip flops FF<0> to FF<31>.

The respective outputs of the flip flops FF<0> to FF<31> are given to the data input DI<0> to DI<31> and the output of the flip flop FF<0> is also given outside as the serial output SODI. FIG. 15 does not show a timing control line for the flip flops FF<0> to FF<31> and the like.

With this configuration, the data input unit 18B can give the input data DIN<0> to DIN<31> to the data inputs DI<0> to DI<31> of the RAM 15 through the flip flops FF<0> to FF<31> with the control signal SMDI of "0" during a normal operation (or an operation of capturing data in a scan test for user logic). The input data DIN<0> to DIN<31> are output results of random logics.

During the shift operation, with the control signal SMDI of "1" and the selection signal SELSID="1", the flip flops FF<31> to FF<0> serve as a series shift register from the serial input SIDI to the serial output SODI.

During the RAM test, with the control signal SMDI of "1" and the selection signal of "1", the test data SID<j> corresponding to the data input DI<i> are propagated to the data input DI<i> through the flip flop FF<i> so as to compare the output data DO<i> (i=0 to 31) with the expected value data EXP<j> (j=0 to 3). In short, the data are given as the test data SID<j> to be written during the test for the RAM 15.

The data input unit 18B of FIG. 15 in which one selector, or the selector SL4<i> is provided between the input data DIN<i> and the flip flop FF<i> needs a shorter time to propagate signals than the data input unit 18A in which two selectors, or the selectors SL1<i> and SL2<i> are provided between the input data DIN<i> and the flip flop FF<i>, and therefore the data input unit 18B can reduce the set-up time of the flip flop for the input data DIN<i>, thereby improving its performance.

In the test circuit 18 of FIG. 13, it is desirable to decide connection of the data outputs DO<0> to DO<4> and the MSFF<0> to MSFF<7> in consideration of the configuration of the RAM for high-rate failure detection.

Figure 16:
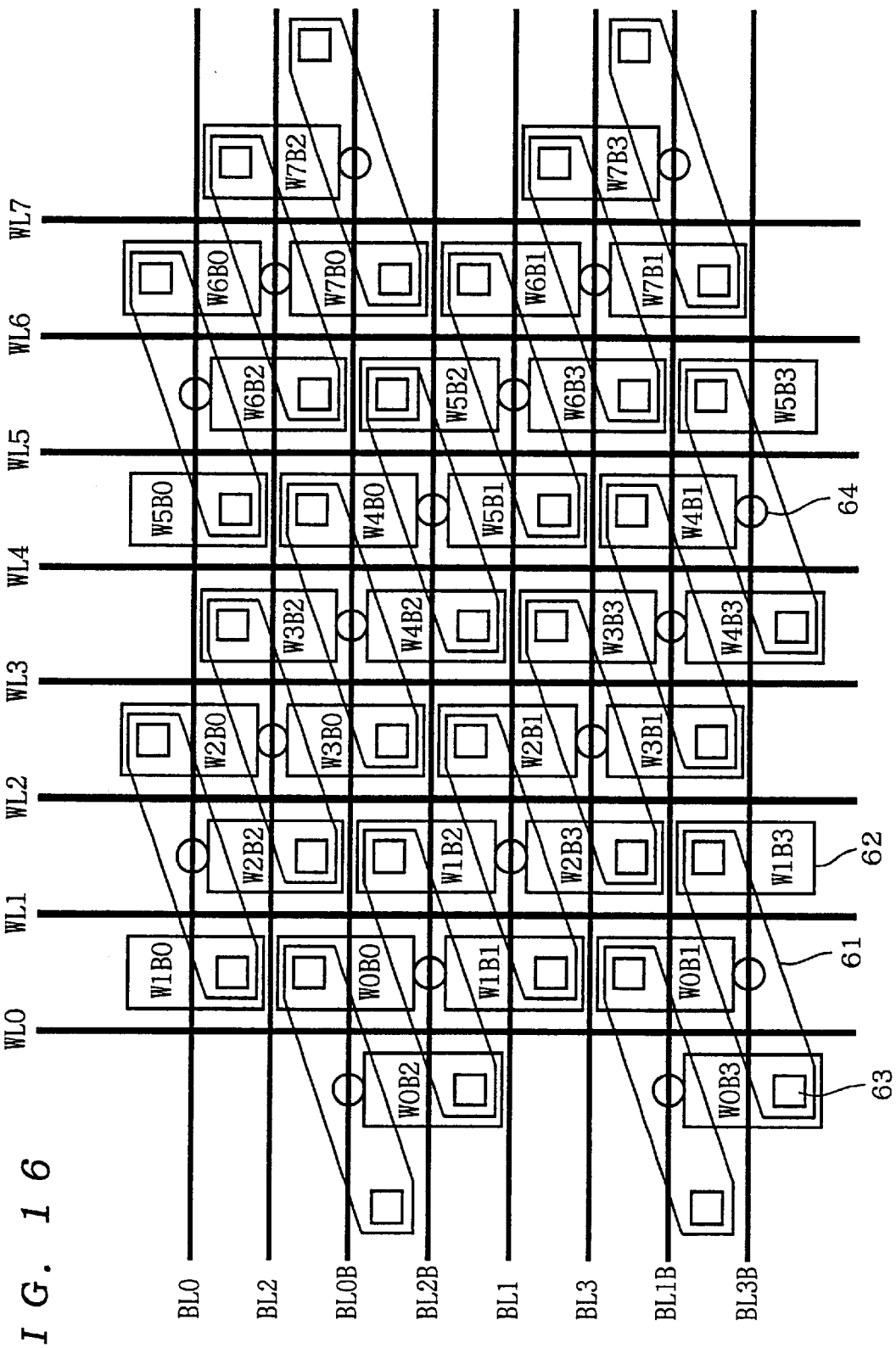
FIG. 16 is a plan view showing a memory cell array organization of a RAM.

FIG. 16 shows a layout of part of memory cell array in a semiconductor integrated circuit device. As shown in the figure, word lines WL are provided in the order of WL0 to WL7 and bit lines BL are provided in the order of BL0, BL2, WL0B, BL2B, BL1, BL3, BLLB, BL3B to perpendicularly cross the word lines WL. The bit lines BLi (i=0 to 3) and the bit lines BLiB are paired and connected in common to a differential sense amplifier, as discussed later.

A plurality of active regions 61 are provided in a diagonal direction of FIG. 16, each two-dimensionally crossing one of the bit lines BL and one or two of the word lines WL and a plurality of storage nodes 62 are provided in parallel with the word lines WL, each two-dimensionally crossing one of the bit lines BL.

A center region of each of the active regions 61 is electrically connected to the bit line BL through a bit-line contact 64 and an end region of each of the active regions 61 is electrically connected to the storage node 62 through a storage-node contact 63.

A one-bit memory cell consists of a selection transistor and the storage node 62 (one of electrodes of a capacitor). The selection transistor is provided in the active region 61 and uses the word line WL as a gate electrode. Most of the active regions 61 are each internally provided with two selection transistors and electrically connected to two of the storage nodes 62, having the bit-line contact 64 in common.

Thus, the bit-line contact 64 electrically contacts one of the electrode regions of the selection transistor and the bit line BL, and the storage-node contact 63 electrically contacts the other of the electrode regions of the selection transistor and the storage node 62.

In FIG. 16, identification numbers (as WiBj corresponding to the word line WLi and the bit line BLj(B)) are given for identification of memory cells.

Figure 17:
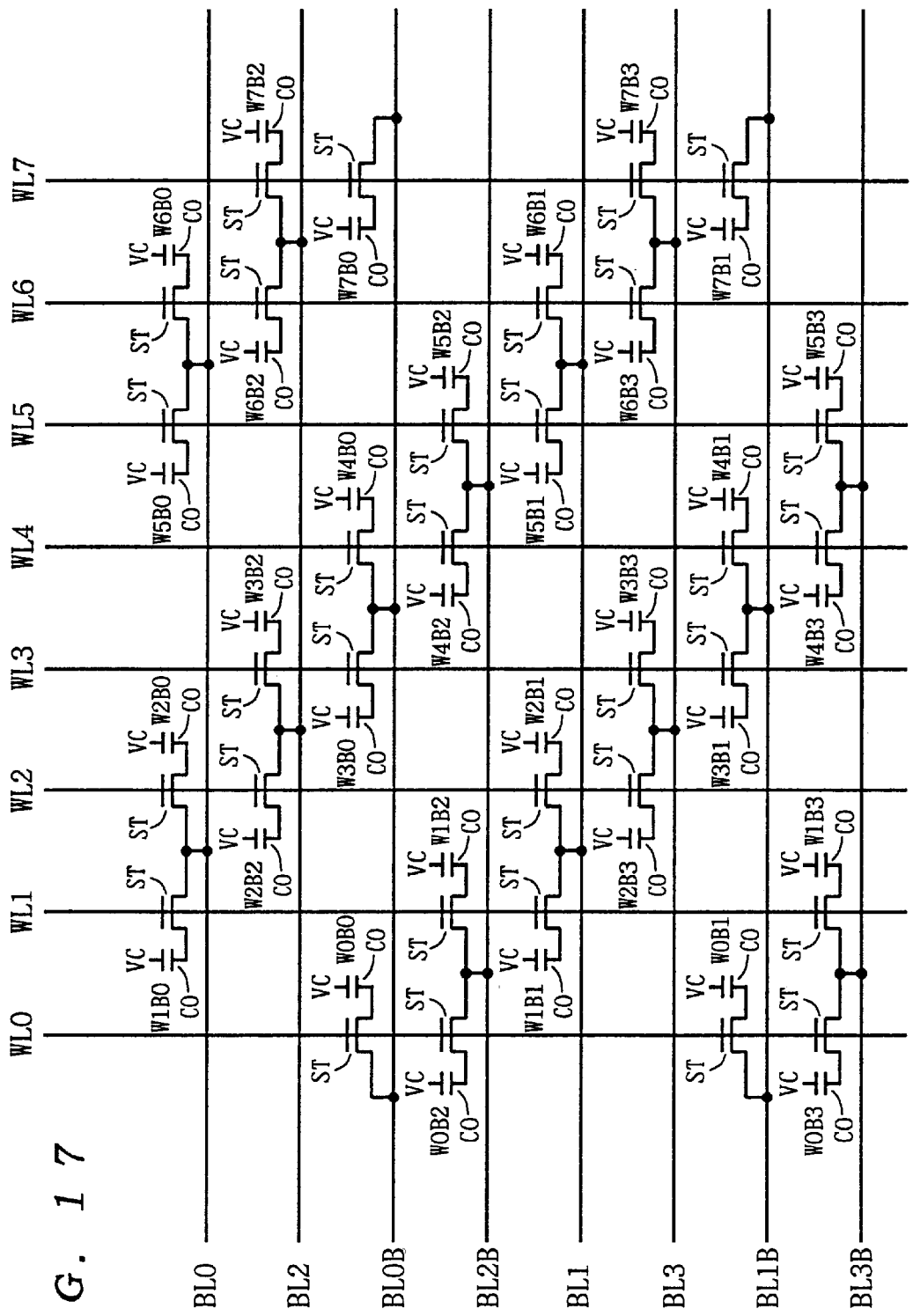
FIG. 17 is a circuit diagram showing the memory cell array organization of the RAM.

FIG. 17 is an equivalent circuit diagram showing a two-dimensional configuration of FIG. 16. Though not shown in FIG. 16, the DRAM has the other electrode (cell plate electrode) of the memory cell capacitor. In FIG. 17, a potential of the cell plate electrode is represented as VC.

As shown in FIG. 17, a memory cell consists of a memory cell capacitor C0 and a selection transistor ST, and two memory cells are connected to the bit line BL, sharing one node.

Figure 18:
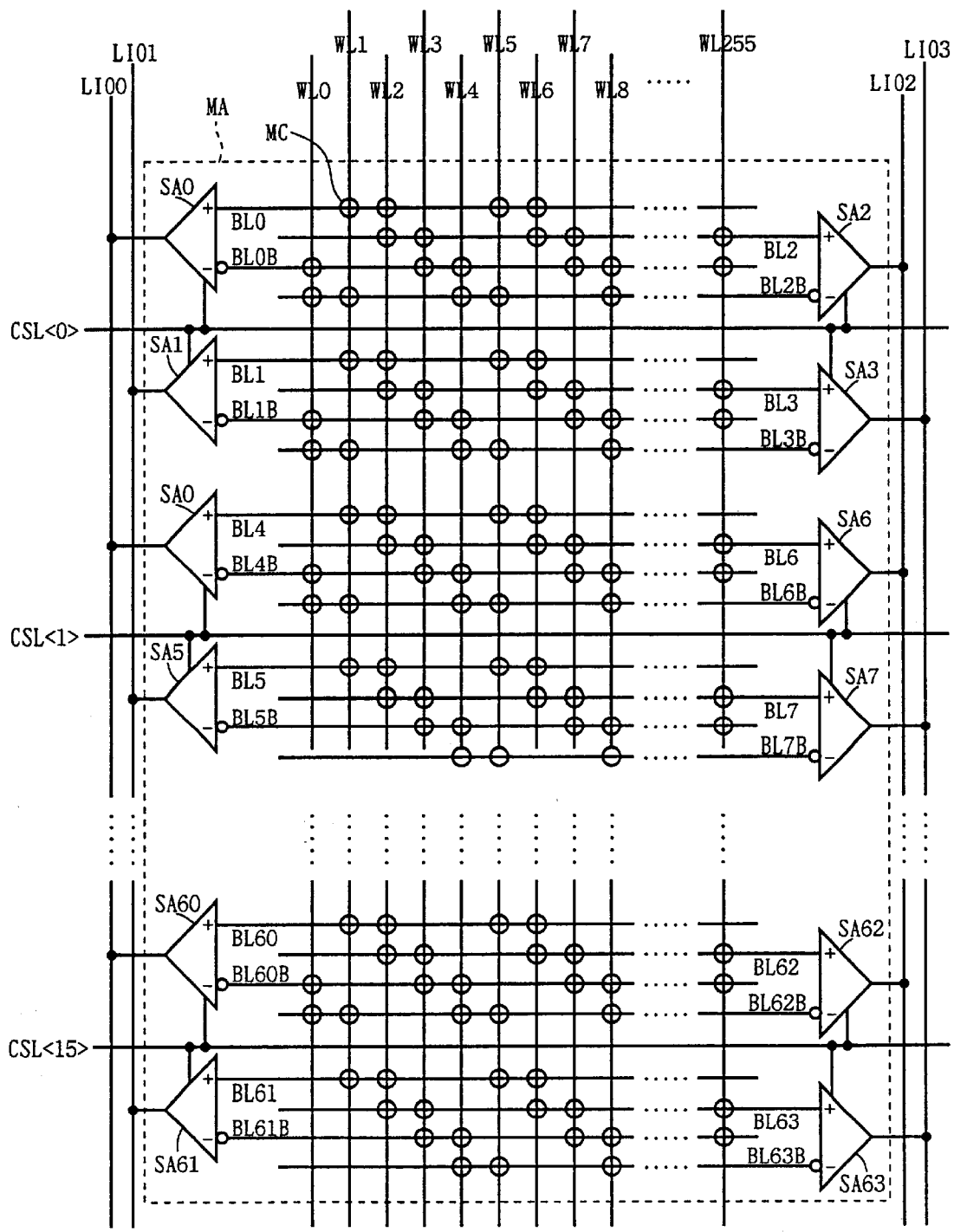
FIG. 18 is a circuit diagram showing the memory cell array organization of the RAM and its peripheral circuits.

FIG. 18 is a circuit diagram showing a configuration of an upper memory cell array MA including the circuit configuration of FIG. 17 and a sense amplifier. As shown in this figure, the configuration of FIG. 17 is enlarged and the memory cell array MA is constituted of the word lines WL0 to WL255, the bit line pairs BL0 and BL0B to BL63 and BL63B and sense amplifiers SA0 to SA61. The pair of bit lines BLi and BLiB (i=0 to 63) are connected in common to the differential sense amplifier SAi.

A column selection signal CSL<0> controls activation/non-activation of the sense amplifiers SA0 to SA3, a column selection signal CSL<1> controls activation/non-activation of the sense amplifiers SA4 to SA7, and a column selection signal CSL<k> (k=2 to 15) controls activation/non-activation of the sense amplifiers SA(4k) to SA(4k+3).

Outputs of the sense amplifiers SA0, SA4, . . . , SA60 are connected to a local input/output line LIO0, outputs of the sense amplifiers SA1, SA5, . . . , SA61 are connected to a local input/output line LIO1, outputs of the sense amplifiers SA2, SA6, . . . , SA62 are connected to a local input/output line LIO2, and outputs of the sense amplifiers SA3, SA7, . . . , SA63 are connected to a local input/output line LIO3.

A plurality of memory cells MC are arranged so that any of the word lines WL1 to WL255 which is activated may be connected to only one of the bit line pair BLi and BLiB which are connected to the sense amplifier SAi.

For example, when the word line WL1 is activated, a subtle potential change is caused on the bit line BL0 by data read out from the memory cell MC and no potential change is caused on the bit line BL0B because no memory cell MC is connected thereto. Then, the sense amplifier SA0 detects a subtle potential difference between the bit lines BL0 and BL0B in an active state and amplifies the potential difference to output it to the local input/output line LIO1, thus performing a read operation.

Thus, when the word line WLj (j=0 to 255) is selected, the sense amplifiers SA0 to SA63 are each supplied with potential difference based on the data of the corresponding memory cell MC.

Then, amplified outputs of the four sense amplifiers SA(4m) to SA(4m+3) which are activated by one column selection signal CSL<m> out of the column selection signals CSL<0> to CSL<15> are given to local inputs/outputs of the local input/output lines LIO0 to LIO3.

The sense amplifier SAi has a function of sensing and amplifying the potential difference between the bit line pairs BLi and BLiB in a read operation and also has a write driving function of bringing one of the bit line pair BLi and BLiB into "H" and the other into "L" based on a signal inputted in a write operation.

Figure 19:
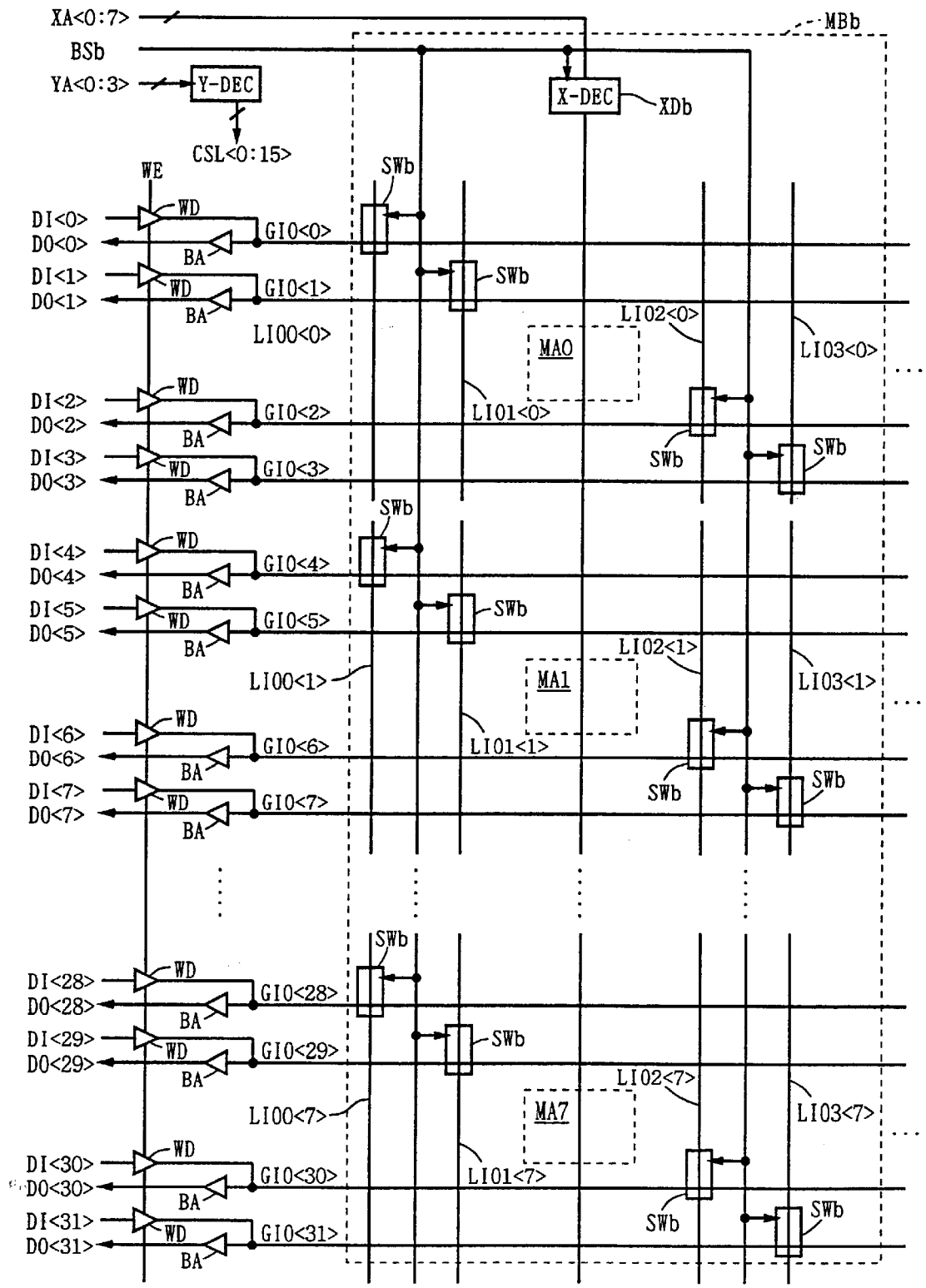
FIG. 19 is a circuit diagram mainly showing the peripheral circuits of the memory cell array of the RAM.

FIG. 19 is a circuit diagram showing a configuration of an upper DRAM having a plurality of memory cell arrays as shown in FIG. 18 and including peripheral circuits (such as a decoder and a write driver).

Eight memory cell arrays MA0 to MA7 each having the configuration of FIG. 18 are arranged as shown in FIG. 19. Each memory cell array MAi (i=0 to 7) is connected to the local input/output lines LIO0<i> to LIO3<i> in such a connecting manner as shown in FIG. 18 (not shown in FIG. 19).

The local input/output lines LIO0<i> to LIO3<i> are connected to global input/output lines GIO<4i> to GIO<4i+3> through switching circuits SWb. All the switching circuits SWb receive a block selection signal BSb and come into an ON-state when the block selection signal BSb indicates activation.

An X-decoder XDb receives the block selection signal BSb and X-addresses XA<0:7> (XA<0> to XA<7>) and selects one word line WL out of the word lines WL<0:255> (WL0 to WL255) based on the X-addresses XA<0:7> when the block selection signal BSb indicates activation.

The X-decoder XDb, the memory cell arrays MA0 to MA7, the local input/output lines LIO0<i> to LIO3<i> and the switching circuits SWb constitute a memory cell array block MBb. Though, actually, there are a plurality of memory cell array blocks MBb, FIG. 19 shows only one of the memory cell blocks MBb.

A Y-decoder YD activates one of the column selection signals CSL<0> to CSL<15> based on Y-addresses YA<0:3> (YA<0> to YA<3>).

The data inputs DI<0> to DI<31> are connected to the global input/output lines GIO<0> to GIO<31> through write drivers WD, and the global input/output lines GIO<0> to GIO<31> are outputted as the data outputs DO<0> to DO<31> through buffer amplifiers BA.

A write enable signal WE controls activation/non-activation of each write driver WD.

When the block selection signal BSb indicates activation, the X-decoder XDb is activated and the switching circuit SWb comes into an ON-state, to select the memory cell array block MBb.

As a result, data read out from the memory cell array MAi are given to the global input/output lines GIO<0> to GIO<31> through the local input/output lines LIO0<i>, LIO1<i>, LIO2<i> and LIO3<i> in a read operation (the write enable signal WE indicates non-activation). Since the write driver WE is non-active in the read operation, the data read out from the memory cell array MAi are outputted as the data outputs DO<0> to DO<31> of the DRAM.

On the other hand, in a write operation (the write enable signal WE indicates activation), with the write driver WD activated, data from the data inputs DI<0> to DI<31> are written into the memory cells of the memory cell array MAi through the global input/output lines GIO<0> to GIO<31> and the local input/output lines LIO0<i>, LIO1<i>, LIO2<i> and LIO3<i>.

In this example, data are written into the four memory cells in the memory cell array MAi having the configuration of FIG. 18 at a time. In order to write any test data into the four memory cells selected in the memory cell array MAi, it is necessary to design a test circuit so that data can be independently written into the four memory cells. Each of the data input units 18A and 18B of FIGS. 14 and 15, which can each independently input the test data SID<0> to SID<3>, allows independent writing of data into the four memory cells in the memory cell array MAi.

Further, it is necessary to design a test circuit so that any four expected values may be set when the test data (corresponding to the written data) are read out. The test circuit 18 of FIG. 13, which can independently input the expected value data EXP<0> to EXP<3>, allows setting of any four expected values.

Thus, the test circuit 18 (the data input units 18A and 18B) of the tenth preferred embodiment shown in FIGS. 13 to 15 allows the RAM test with any test data applied to the memory cells in the memory cell arrays.

Therefore, the test circuit 18 of the tenth preferred embodiment has a connection of the data outputs DO<0> to DO<31> of the RAM and the MSFF<0> to MSFF<7> in consideration of the configuration of the RAM shown in FIGS. 16 to 19, and therefore it can perform an effective test on the RAM of FIGS. 16 to 19.

<<The Eleventh Preferred Embodiment>>

Figure 20:
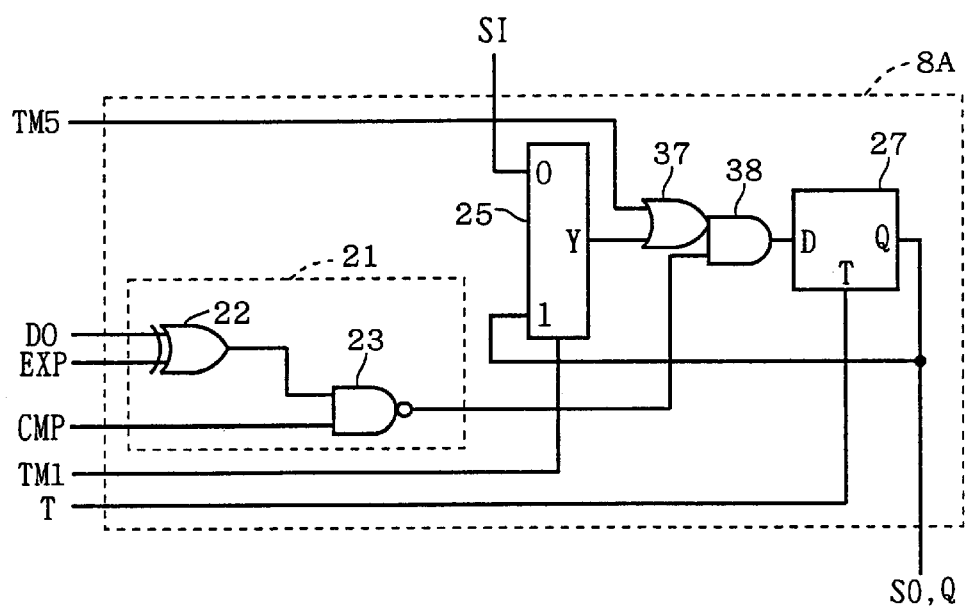
FIG. 20 is a circuit diagram showing an internal configuration of a 1-bit SFF in accordance with an eleventh preferred embodiment of the present invention.
Figure 21:
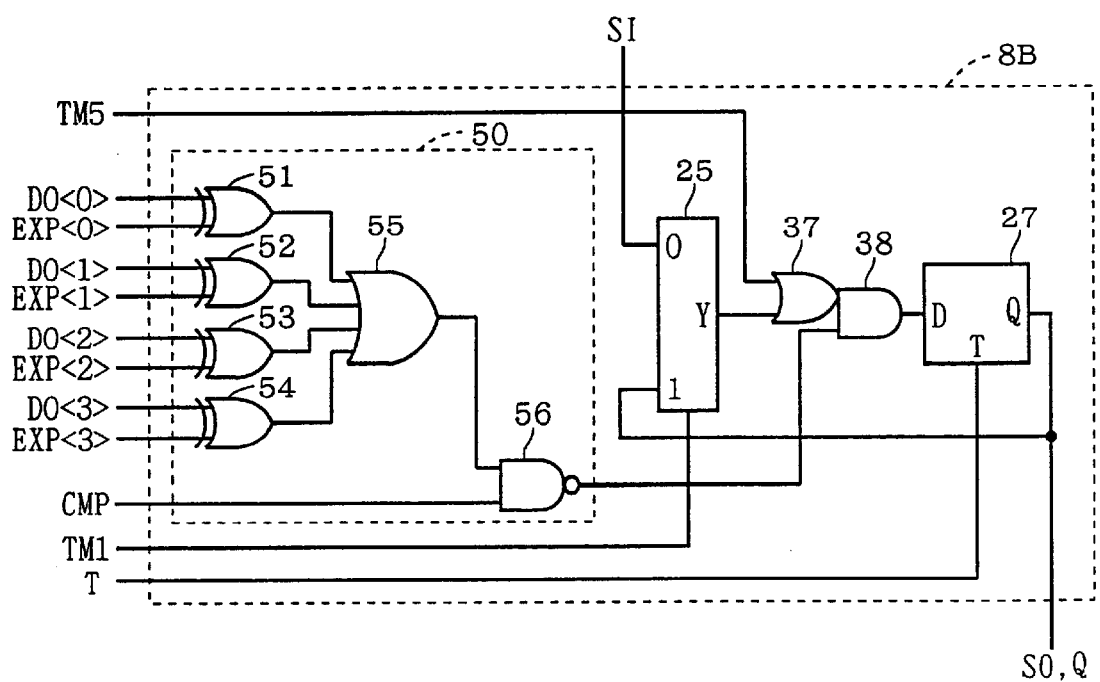
FIG. 21 is a circuit diagram showing an internal configuration of a multi-bit S-FF in accordance with the eleventh preferred embodiment of the present invention.

FIGS. 20 and 21 are circuit diagrams showing configurations of scan flip flops (S-FFs 8A and 8B) in accordance with the eleventh preferred embodiment. The configuration of FIG. 20 employs the one-bit input comparator 21 and that of FIG. 21 employs the multi-bit input comparator 50.

As shown in FIG. 20, one of inputs of an OR gate 37 receives a test-mode signal TM5 and the other is connected to the output unit Y of the selector 25. One of inputs of an AND gate 38 is connected to an output of the OR gate 37 and the other is connected to the output of the comparator 21. An output of the AND gate 38 is connected to the D-input of the D-FF 27.

The S-FF 8A has the same configuration as the S-FF 6 of the eighth preferred embodiment shown in FIG. 10 except that the above-described elements are additionally provided and the selector 26 and the input/output connections therefor and the AND gate 36 and the input/output connections therefor are omitted.

In this configuration, with the test-mode signal TM5 of "0", the S-FF 8A is equivalent in circuit configuration to the S-FF 6 of the eighth preferred embodiment with the shift-mode signal SM of "1".

With the test-mode signal TM1 of "0" and the comparison control signal CMP of "0", the S-FF 8A enters a shift operation mode to take the serial input SI into the D-FF 27 in synchronization with the timing signal T.

With the test-mode signal TM1 of "1", the S-FF 8A enters a test mode with the serial input SI being invalid (the second test mode), performing the same test operation as the S-FF 200 of FIG. 43. On the other hand, with the test-mode signal TM1 of "0", the S-FF 8A enters a test mode with the serial input SI being valid (the first test mode).

With the test-mode signal TM5 of "1", the S-FF 8A enters a failure observation mode, and the output from the output unit Y of the selector 25 is made invalid and the output of the comparator 21, or the comparison result data, is taken into the D-FF 27.

Therefore, observing the data output Q of the D-FF 27 by an external test apparatus in the failure observation mode allows an easy failure analysis. Further, it is possible to obtain a fail bit map information needed for a switching operation of the redundancy circuits (e.g., cutting a fuse by a laser apparatus) in a mass-storage RAM such as a DRAM The S-FF 8A of the eleventh preferred embodiment is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the eleventh preferred embodiment. The test-mode signal TM of FIGS. 2 and 3 corresponds to the test-mode signals TM1 and TM5 of FIG. 20.

Further, the S-FF 8A of the eleventh preferred embodiment can be advantageously achieved with less elements (specifically made of two logic gates, one selector and one D-FF) than the prior-art S-FF 200 of FIG. 43.

Moreover, since the test circuit of the eleventh preferred embodiment can switch between an operation mode {TM1= "1", the second test mode) for easy failure analysis and that for shorter test time {TM1="0", the first test mode) according to "1"/"0" of the test-mode signal TM1, it is possible to select an appropriate test as required, for example, depending on whether for development or for mass production, like the third preferred embodiment.

The S-FF 8A of the eleventh preferred embodiment has a characteristic feature of not having "0" indicative of failure left therein since the AND operation between the comparison result data outputted from the comparator 21 and the serial input SI is executed by the AND gate 38 and the data output Q of the D-FF 27 is not cared in the test mode with the serial input SI being valid.

The S-FF SB of FIG. 21 has the same configuration and performs the same operation as the S-FF 8A of FIG. 20 except that the comparator 50 is used instead of the comparator 21.

Therefore, with the test-mode signal TM5 of "1", a compressed fail bit map information is obtained.

For example, when the test circuit 18 of FIG. 13 is constituted of the MSFF<0> to MSFF<7> using the S-FFs 8B to test the DRAM of FIG. 19, four bits of the failure information corresponding to one column selection signal CSL<i> (i=0 to 15) are compressed to one bit and the compressed one-bit failure information is given as the data output Q of the D-FF 27 in each of the MSFF<0> to MSFF<7>, to be observed by the external test apparatus. The compressed failure information (fail bit map information) is processed to switch the redundancy circuit (cut a fuse and so on) by the laser apparatus.

Furthermore, a microprocessor within an LSI may be used instead of the external test apparatus, and the switching of redundancy circuit may be made by electrical means instead of the laser apparatus.

<<The Twelfth Preferred Embodiment>>

Figure 22:
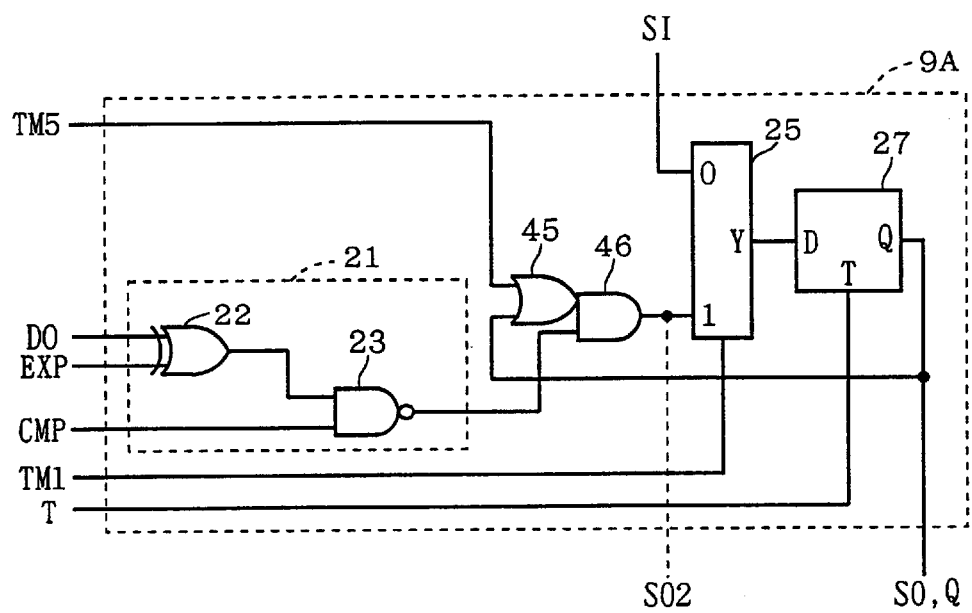
FIG. 22 is a circuit diagram showing an internal configuration of a 1-bit SFF in accordance with a twelfth preferred embodiment of the present invention.
Figure 23:
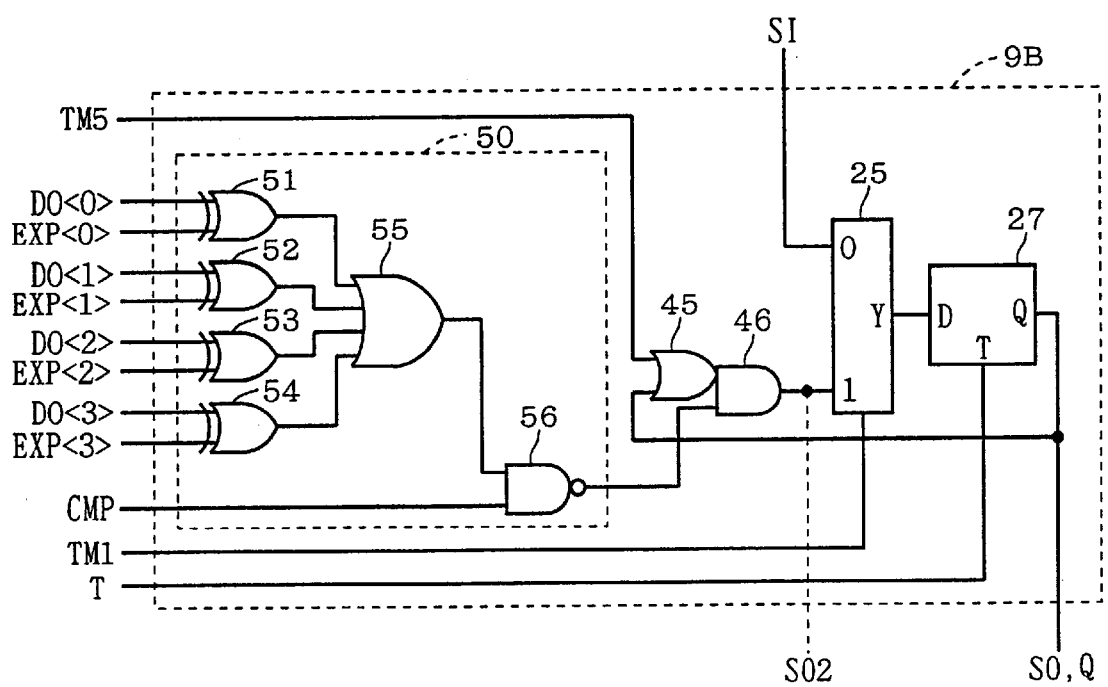
FIG. 23 is a circuit diagram showing an internal configuration of a multi-bit S-FF in accordance with the twelfth preferred embodiment of the present invention.

FIGS. 22 and 23 are circuit diagrams showing configurations of scan flip flops (S-FFs 9A and 9B) in accordance with the twelfth preferred embodiment. The configuration of FIG. 22 employs the one-bit input comparator 21 and that of FIG. 23 employs the multi-bit input comparator 50.

As shown in FIG. 22, one of inputs of an OR gate 45 receives the test-mode signal TM5 and the other receives the data output Q of the D-FF 27. One of inputs of an AND gate 46 is connected to an output of the OR gate 45 and the other is connected to the output of the comparator 21. An output of the AND gate 46 is connected to the "1"-input of the selector 25 and outputted as a serial output (data) SO2.

The S-FF 9A has the same configuration as the S-FF 6 of the eighth preferred embodiment shown in FIG. 10 except that the above-described elements are additionally provided and the selector 26 and the input/output connections therefor and the AND gate 36 and the input/output connections therefor are omitted.

In the S-FF 9A having this configuration, either of the serial outputs SO and SO2 may be used as the serial output. If the serial output SO2 is used, it is necessary to supply the test-mode signal TM5 of "11" and the comparison control signal CMP of "0" for the shift operation.

An operation of the S-FF 9A will be discussed below. With the test-mode signal TM5 of "0" and the test-mode signal TM1 of "1", the S-FF 9A enters the test mode with the serial input SI being invalid (the second test mode) to perform the same operation as the S-FF 200 of FIG. 43. That allows an easy failure analysis.

With the test-mode signal TM5 of "1" and the test-mode signal TM1 of "1", both the serial input SI and the data output Q of the D-FF 27 are made invalid and only the comparison result data outputted from the comparator 21 is taken into the D-FF 27, to bring the S-FF 9A into a failure observation mode. In this mode, the S-FF 9A produces the same effect of obtaining the fail bit map information as the S-FF 8A of the eleventh preferred embodiment.

With the test-mode signal TM5 of "0" and the test-mode signal TM1 of "0", an AND-operation result between the data output Q (latch data) of the D-FF 27 receiving the serial input SI and the comparison result data is outputted as the serial output SO2. Therefore, if the serial output SO2 is used as the serial output, the S-FF 9A enters the test mode with the serial input SI being valid (the first test mode). On the other hand, if the serial output SO is used as the serial output, the S-FF 9A enters the shift mode to perform the serial shift operation.

With the test-mode signal TM5 of "1" and the test-mode signal TM1 of "0", the output of the comparator 21 is outputted as the serial output SO2. Therefore, if the serial output SO2 is used as the serial output, the output of the comparator 21 can be used as the serial input SI of the following scan flip flop. On the other hand, if the serial output SO is used as the serial output, the S-FF 9A enters the shift mode to perform the serial shift operation.

The S-FF 9A of the twelfth preferred embodiment having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the twelfth preferred embodiment. The test-mode signal TM of FIGS. 2 and 3 corresponds to the test-mode signals TM 1 and TM5 of FIG. 22.

Further, the S-FF 9A of the twelfth preferred embodiment can be advantageously achieved with less elements (specifically made of two logic gates, one selector and one D-FF) than the prior-art S-FF 200 of FIG. 43.

Moreover, since the test circuit of the twelfth preferred embodiment can switch between an operation mode {TM1= "1", the second test mode) for easy failure analysis and that for shorter test time {TM1="0", the first test mode) according to "1"/"0" of the test-mode signal TM1, it is possible to select an appropriate test as required, for example, depending on whether for development or for mass production, like the third preferred embodiment.

The S-FF 9B of FIG. 23 has the same configuration and performs the same operation as the S-FF 9A of FIG. 22 except that the comparator 50 is used instead of the comparator 21.

Therefore, with the test-mode signal TM5 of "1", the compressed fail bit map information is obtained, like in the S-FF 8B of FIG. 21.

<<The Thirteenth Preferred Embodiment >>

Figure 24:
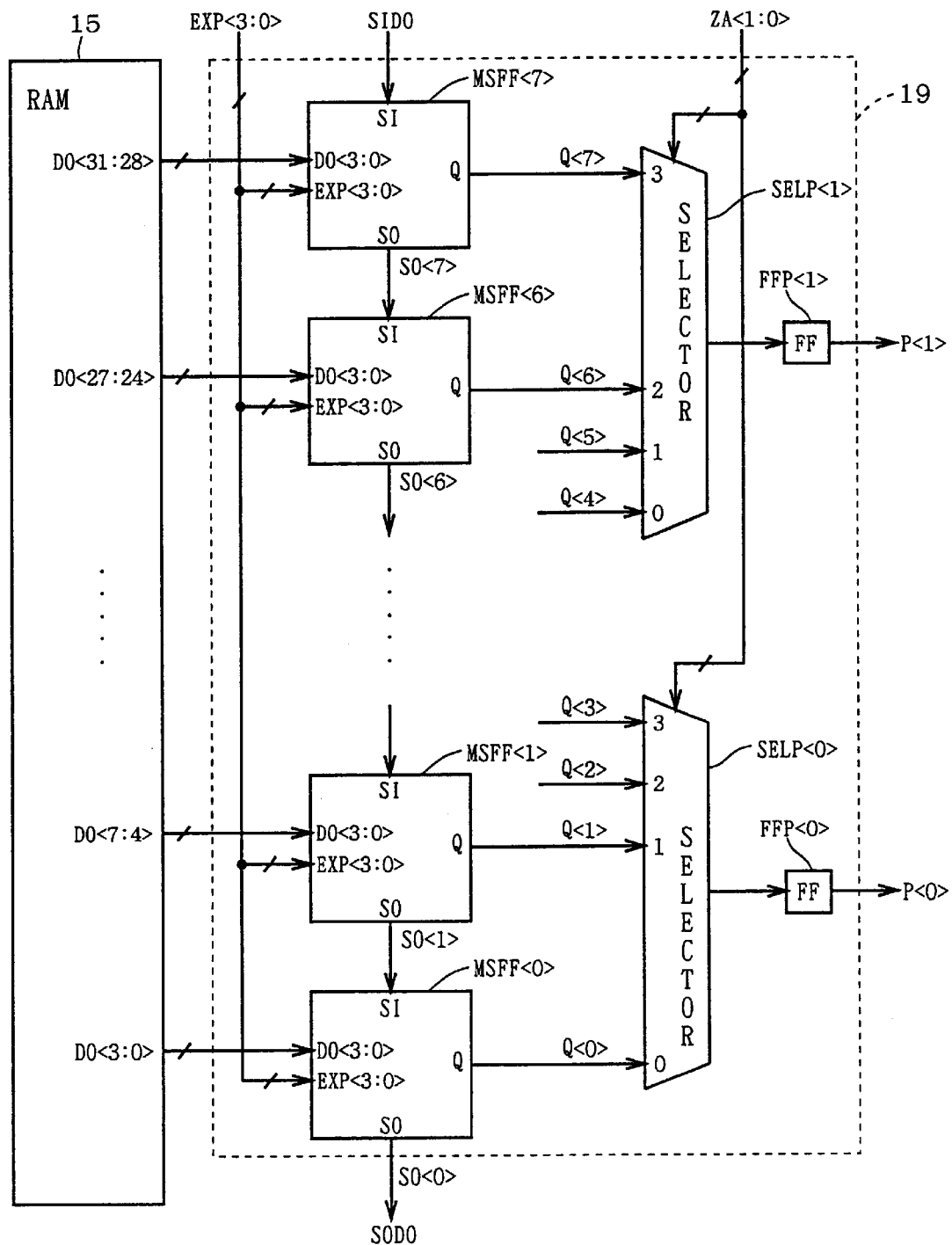
FIG. 24 is a circuit diagram showing a configuration of a test circuit used for a RAM with test function in accordance with a thirteenth preferred embodiment of the present invention.

FIG. 24 is a circuit diagram showing a configuration of a test circuit 19 in a semiconductor integrated circuit device using the S-FF 8B or 9B of the thirteenth preferred embodiment. The test circuit 19 is provided correspondingly to the data outputs DO<0> to DO<31> of the RAM 15.

As shown in FIG. 24, the test circuit 19 has a scan path for RAM test connecting in series eight scan flip flops MSFF<0> to MSFF<7> each of which uses the S-FF 8B or 9B, like the test circuit 18, and is additionally provided with selectors SELP<0> and SELP<1> and flip flops FFP<0> and FFP<1>.

Among the data outputs Q<0> to Q<7> of the MSFF<0> to MSFF<7>, the selector SELP<0> receives the data outputs Q<0> to Q<3> and the selector SELP<1> receives the data outputs Q<4> to Q<7>. The selectors SELP<0> and SELP<1> receives in common a selection control signals ZA<1:0> (ZA<0> and ZA<1>).

The selector SELP<0> outputs one of the data outputs Q<0> to Q<3> indicated by the selection control signal ZA<1:0> to the flip flop FFP<0>. The selector SELP<1> outputs one of the data outputs Q<4> to Q<7> indicated by the selection control signal ZA<1:0> to the flip flop FFP<1>.

The flip flops FFP <0> and FFP<1> take the outputs of the selectors SELP<0> and SELP<1> in synchronization with a timing signal not shown in this figure and output signals as outputs P<0> and P<1>, respectively. Other constituent elements are the same as those of the test circuit 18 of FIG. 13.

An operation for obtaining the fail bit map information by the test circuit 19 will be discussed below.

In order to obtain the fail bit map information, it is necessary to bring the MSFF<0> to MSFF<7> into the failure observation mode where the outputs of the respective comparators 50 are taken into the D-FFs 27 (with the test-mode signal TM5 of "1" in the S-FF 8B of FIG. 21, with the test-mode signal TM5 of "1" and the test-mode signal TM1 of "1" in the S-FF 9B of FIG. 23).

In the failure observation mode, the external test apparatus observes the outputs P<0> and P<1> of the flip flops FFP<0> and FFP<1>, to obtain the fail bit map information.

In the failure observation mode, it is general that the comparison control signal CMP should be appropriately controlled (set to "1" only in the read of data from the RAM 15). In this case, during any operation other than the read operation, the comparison control signal CMP is "0" to latch "1" into the D-FF 27 and therefore the failure information "0" is not observed from the output P<0> or P<1>.

The comparison control signal CMP may be fixed to "1" in the failure observation mode. In this case, it is necessary to provide the test apparatus with a mask function of observing the outputs P<0> and P<1> only during the read of data from the RAM 15.

The test operation in the failure observation mode is actually executed more than one times for one test algorithm while changing the selection control signal ZA<1:0>.

For example, four tests are executed in the following manner: (1) the first test for the RAM 15 is executed with the selection control signals ZA(1) of "0" and ZA(0) of "0", (2) the second test with the selection control signals ZA(1) of "0" and ZA(0) of "1", (3) the third test with the selection control signals ZA(1) of "1" and ZA(0) of "0" and (4) the fourth test with the selection control signals ZA(1) of "1" and ZA(0) of "1".

The test circuit 19 can thereby obtain the same fail bit map information as the test circuit 18 of FIG. 13 obtains from the outputs P<0> and P<1>.

By additionally providing the selectors SELP<0> and SELP<1> and the flip flops FFP<0> and FFP<1> and using only the outputs P<0> and P<1> for obtaining the fail bit map information, the test circuit 19 reduces the number of signals connected to the external test apparatus from eight in the test circuit 18 to two, allowing a cut in test cost.

Specifically, a lower price is expected by reduction in the number of pins for observation of the test apparatus and better cost performance is expected by an increase in the number of integrated circuits such as RAMs simultaneously testable by a test apparatus.

Further, since it becomes possible to perform a pipelined transfer of the failure information by additionally providing the flip flops FFP<0> and FFP<1>, the failure observation test can be executed at higher speed.

Though FIG. 24 shows the 4-input selectors SELP<0> and SELP<1>, other types of multi-input selectors (8-input selector, 16-input selector and the like) may be used.

Further, a selector may be provided to each of the outputs P<0> and P<1> to reduce the number of output signals for failure observation. Furthermore, a flip flop FF for pipelined processing may be provided to the output of the additional selector.

<<The Fourteenth Preferred Embodiment>>

Figure 25:
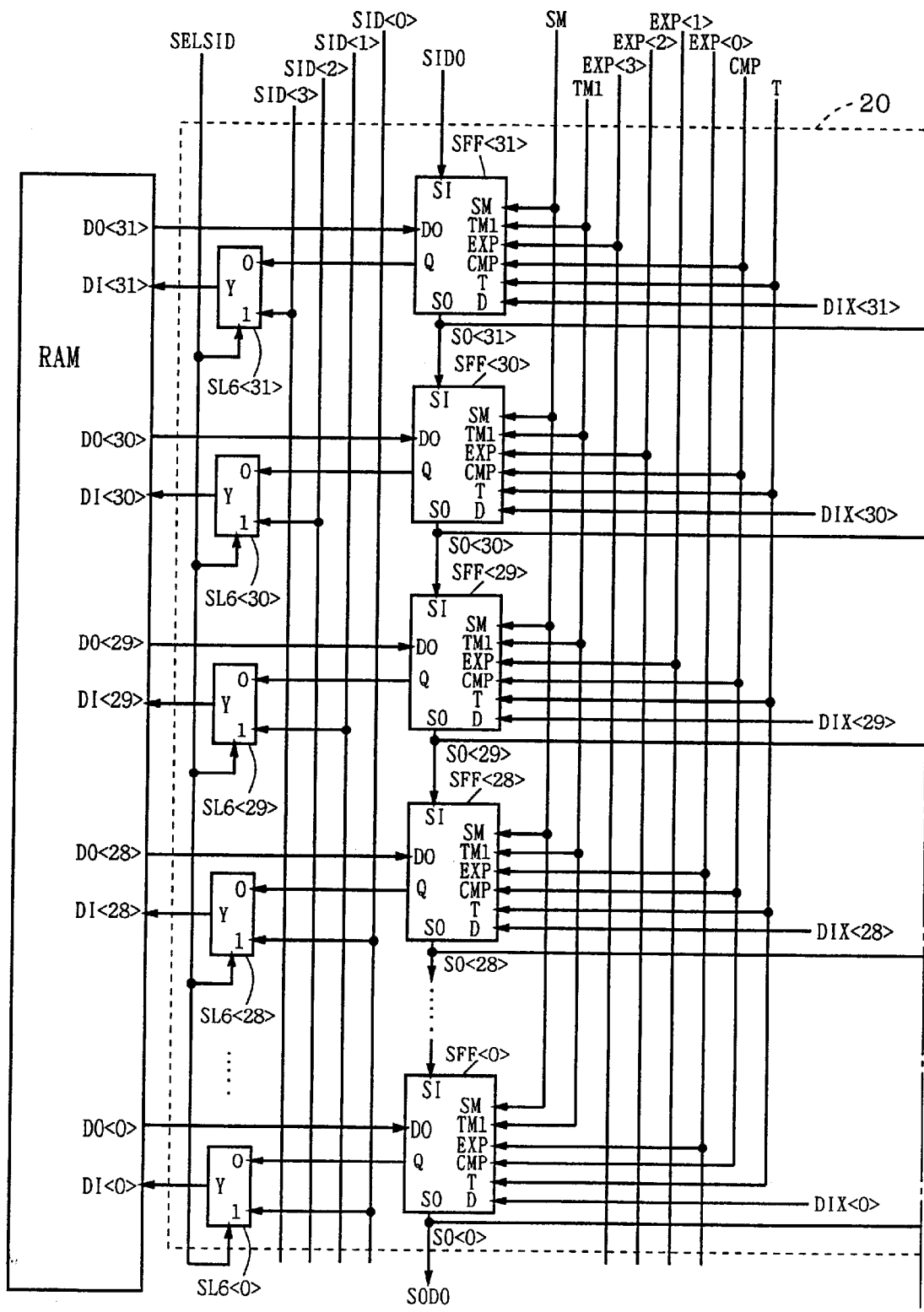
FIGS. 25 and 26 are circuit diagrams showing a configuration of a test circuit used for a RAM with test function in accordance with a fourteenth preferred embodiment of the present invention.
Figure 26:
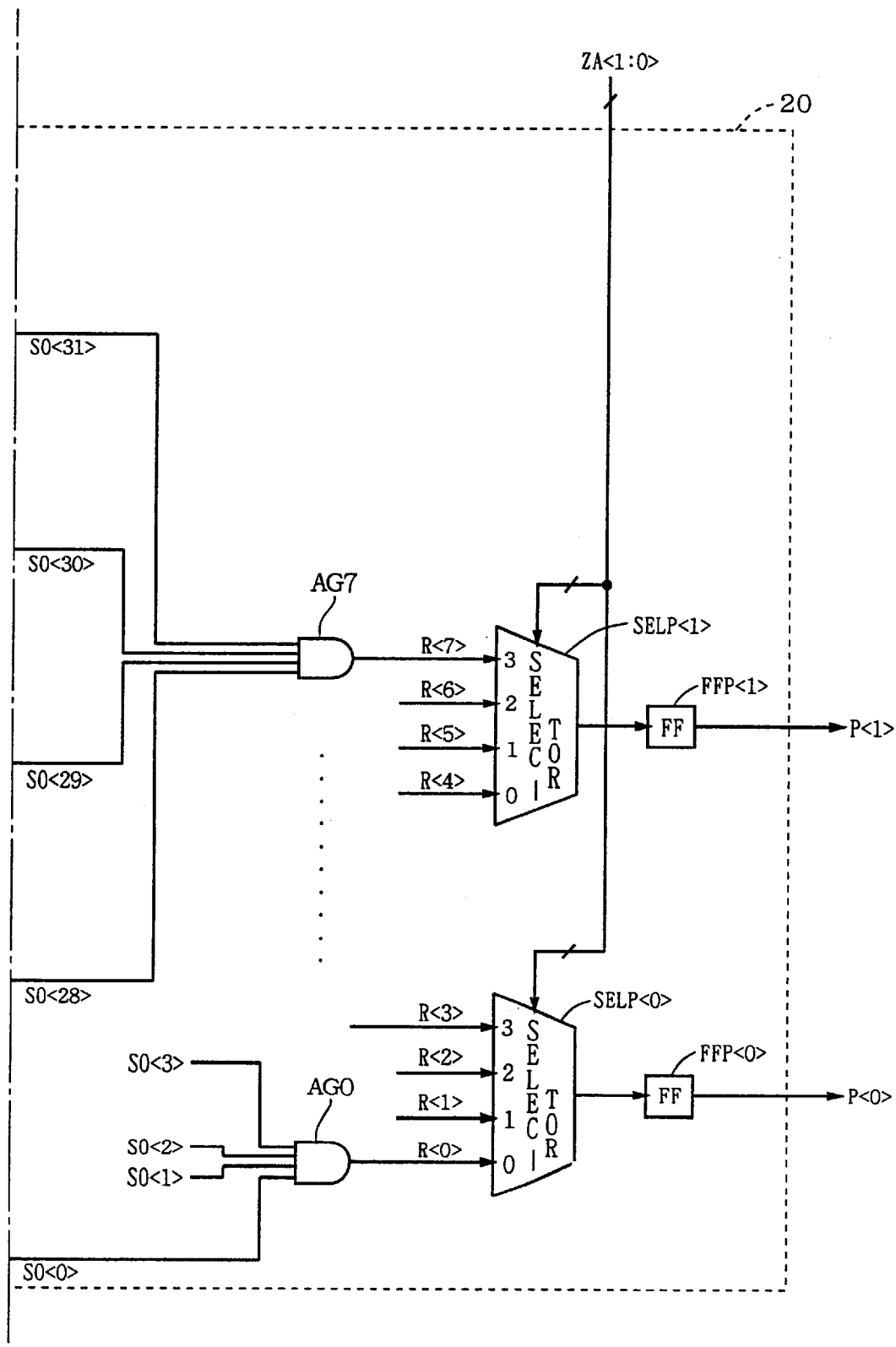

FIGS. 25 and 26 are circuit diagrams showing a configuration of a test circuit 20 in a semiconductor integrated circuit device using the S-FF 8A FIG. 20 or the S-FF 9A of FIG. 22 of the fourteenth preferred embodiment. As shown in these figures, the test circuit 20 is provided correspondingly to the data outputs DO<0> to DO<31> and the data inputs DI<0> to DI<31> of the RAM 15.

As shown in FIGS. 25 and 26, the test circuit 20 has a scan path for RAM test connecting in series thirty-two scan flip flops MSFF<0> to MSFF<31> each of which uses the S-FF 8A or S-FF 9A.

The S-FF<0> to S-FF<31> receive in common the shift-mode signal SM, the test-mode signal TM, the expected value data EXP<0> to EXP<3>, the comparison control signal CMP and the timing signal T. Further, the S-FF<0> to S-FF<31> receive the data outputs DO<0> to DO<31> as input data DO, respectively, the respective data outputs Q are connected to the "0"-inputs of selectors SL6<0> to SL6<31> and the respective D-inputs are connected to the data inputs DIX<0> to DIX<31>. The test-mode signal TM of FIGS. 25 and 26 corresponds to the test-mode signals TM1 and TM5.

The "1"-inputs of the selectors SL6<0>, SL6<4>, ..., SL6<28> each receive the data input SID<0>, the "1"-inputs of the selectors SL6<1>, SL6<5>, SL6<29> each receive the data input SID<1>, the "1"-inputs of the selectors SL6<2>, SL6<6>, ..., SL6<30> each receive the data input SID<2> and the "1"-inputs of the selectors SL6<3>, SL6<7>, ..., SL6<27> and SL6<31> each receive the data input SID<3>.

The control inputs of the selectors SL6<0> to SL6<31> receive in common the selection signal SELSID and the outputs thereof are connected to the data inputs DI<0> to DI<31>, respectively. The above configuration is basically the same as that of the test circuit 16 for the RAM 11.

The test circuit 20 further has 4-input AND gates AG0 to AG7, the 4-input selectors SELP<0> and SELP<1> and the flip flops FFP<0> and FFP<1>.

The AND gate AGi (i=0 to 7) receives the serial output SO<4i> to SO<4i+3> of the SFF<4i> to SFF<4i+3> and outputs an AND output R<i> which is an AND-operation result.

The selector SELP<0> outputs one of the AND outputs R<0> to R<3> indicated by the selection control signal ZA<1:0> to the flip flop FFP<0>. The selector SELP<1> outputs one of the AND outputs R<4> to R<7> indicated by the selection control signal ZA<1:0> to the flip flop FFP<1>.

The flip flops FFP<0> and FFP<1> take the outputs of the selectors SELP<0> and SELP<1> in synchronization with a timing signal not shown in this figure and output signals as outputs P<0> and P<1>, respectively.

In this configuration, the AND gate AGi outputs the AND-operation result of the outputs of the four S-FFs to the selector SELFPO> or SELP<1>. For example, if a failure is detected in any one of the SFF<31>, SFF<30>, SFF<29> and SFF<28> during the failure observation test of the RAM 15, the corresponding serial output SO becomes "0" and therefore the output R<7> of the AND gate AG7 becomes "0".

It is desirable to decide connection of the AND gates AG0 to AG7 and the SFF<0> to SFF<31> in consideration of the configuration of the RAM, like in the test circuit 18 of the tenth preferred embodiment as shown in FIGS. 16 to 19.

Through observation of the outputs P<0> and P<1> of the flip flops FFP<0> and FFP<1> by the external test apparatus, the fail bit map information is obtained. Based on the information, the switching of redundancy circuit is made by the laser apparatus and the like.

An operation of obtaining the fail bit map information by using the test circuit 20 will be discussed below.

In order to obtain the fail bit map information, it is necessary to bring the SFF<0> to SFF<31> into the failure observation mode where the outputs of the respective comparators 21 are taken into the D-FFs 27 (with the test-mode signal TM5 of "1" in the S-FF 8A of FIG. 20 and with the test-mode signal TM5 of "1" and the test-mode signal TM1 of "1" in the S-FF 9A of FIG. 22).

In the failure observation mode, the external test apparatus observes the outputs P<0> and P<1> of the flip flops FFP<0> and FFP<1>, to obtain the fail bit map information.

In the failure observation mode, like in the test circuit 19 of the thirteenth preferred embodiment, the comparison control signal CMP may be either appropriately controlled or fixed to "1".

The test operation in the failure observation mode is actually executed more than one times for one test algorithm while changing the selection control signal ZA<1:0>, like in the test circuit 19 of the thirteenth preferred embodiment.

For example, four tests are executed in the following manner: (1) the first test for the RAM 15 is executed with the selection control signals ZA(1) of "0" and ZA(0) of "0", (2) the second test with the selection control signals ZA(1) of "0" and ZA(0) of "1", (3) the third test with the selection control signals ZA(1) of "1" and ZA(0) of "0" and (4) the fourth test with the selection control signals ZA(1) of "1" and ZA(0) of "1".

The test circuit 20 can thereby obtain the same fail bit map information as the test circuit 18 of FIG. 13 obtains from the outputs P<0> and P<1>.

By additionally providing the AND gates AG1 to AG7, the selectors SELP<0> and SELP<1> and the flip flops FFP<0> and FFP<1> and using only the outputs P<0> and P<1> for obtaining the fail bit map information, the test circuit 20 reduces the number of signals connected to the external test apparatus from eight in the test circuit 18 to two, allowing a cut in test cost.

Further, since it becomes possible to perform a pipelined transfer of the failure information by additionally providing the flip flops FFP<0> and FFP<1>, the failure observation test can be executed at higher speed.

Though FIGS. 25 and 26 show the 4-input selectors SELP<0> and SELP<1>, other types of multi-input selectors (8-input selector, 16-input selector and the like) may be used.

Further, a selector may be provided to each of the outputs P<0> and P<1> to reduce the number of output signals for failure observation. Furthermore, a flip flop FF for pipelined processing may be provided to the output of the additional selector.

<<The Fifteenth Preferred Embodiment>>

Figure 27:
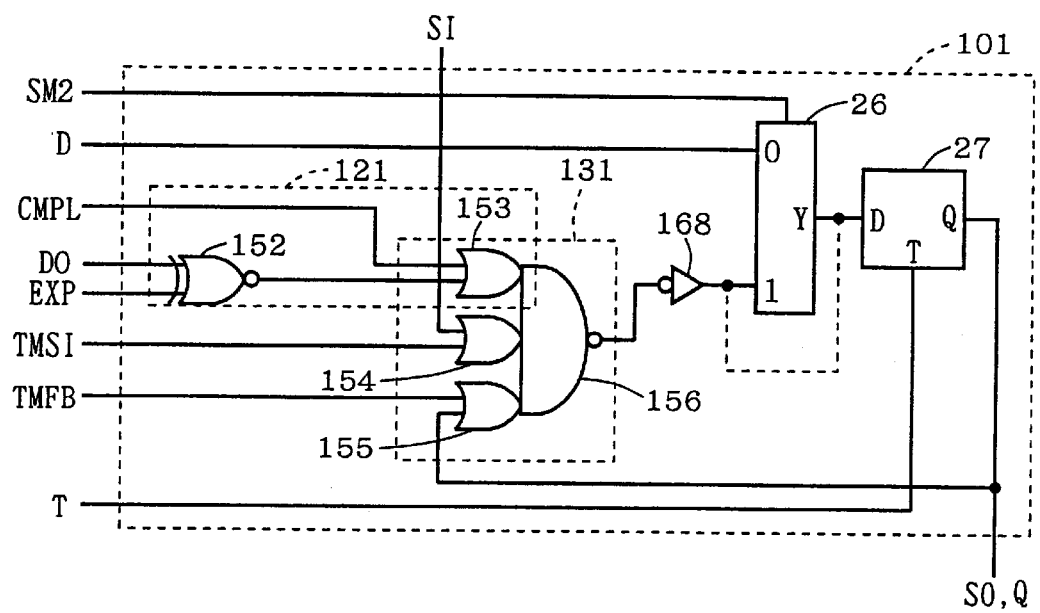
FIG. 27 is a circuit diagram showing an internal configuration of an S-FF in accordance with a fifteenth preferred embodiment of the present invention.

FIG. 27 is a circuit diagram showing a configuration of a scan flip flop 101 used for a test circuit in a semiconductor integrated circuit device such as a DRAM and an SRAM in accordance with the fifteenth preferred embodiment.

As shown in FIG. 27, a comparator 121 consists of an EX-NOR gate 152 and an OR gate 153. One of inputs of the EX-NOR gate 152 receives the input data D0 and the other receives the expected value data EXP, and one of inputs of the OR gate 153 is connected to an output of the EX-NOR gate 152 and the other receives a comparison control signal CMPL.

One of inputs of an OR gate 154 receives the serial input SI and the other receives a test-mode signal TMSI. One of inputs of an OR gate 155 receives a test-mode signal TMFB.

A NAND gate 156 receives outputs of the OR gates 153 to 155, performs a NAND operation of the three OR-operation results, i.e., the outputs of the OR gates 153 to 155, and outputs the operation result to an input of an inverter 168.

The NAND gate 156 and the OR gates 153 to 155 are united to constitute an OR-NAND compound gate 131. Therefore, the comparator 121 and the OR-NAND compound gate 131 share the OR gate 153. An output of the OR-NAND compound gate 131 is connected to the input of the inverter 168.

The selector 26 has a "0"-input receiving the input data D, and a "1"-input connected to an output of the inverter 168 and a control input receiving a shift-mode signal SM2. The selector 26 outputs a signal given from the "1"/"0"-input based on "1"/"0" of the shift-mode signal SM2 through its output unit Y.

The D-FF 27 has a D-input connected to the output unit Y of the selector 26, a toggle input T receiving the timing signal T and a Q-output for outputting signals. The signals from the output unit Q are given outside and fed back to the other input of the OR gate 155 as the data output Q and the serial output SO.

Figure 28:
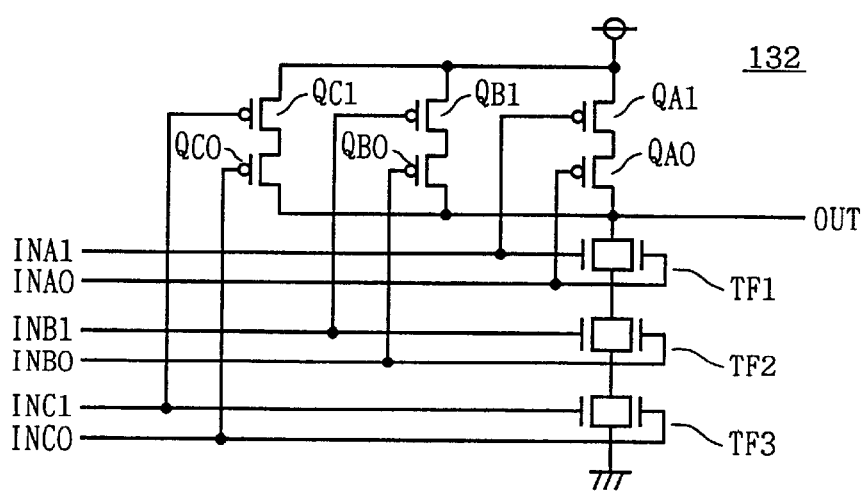
FIG. 28 is a circuit diagram showing an internal configuration of an OR-NAND compound gate of FIG. 27.

FIG. 28 is a circuit diagram showing an internal configuration of the OR-NAND compound gate 131. As shown in FIG. 28, PMOS transistors QA1 and QA0 and transfer gates TF1 to TF3 are connected in series between a power supply $V_{DD}$ and a ground level.

Further, PMOS transistors QB1 and QB0 and PMOS transistors QC1 and QC0 are connected in parallel in a pair unit to the PMOS transistors QA1 and QA0.

The first A-input INA1 and the zeroth A-input INA0 are inputted to one of two NMOS gates of the transfer gate TF1 and the other and gates of the PMOS transistors QA1 and QA0, respectively. The first B-input INB1 and the zeroth B-input INB0 are inputted to one of two NMOS gates of the transfer gate TF2 and the other and gates of the PMOS transistors QB1 and QB0, respectively. The first C-input INC1 and the zeroth C-input INC0 are inputted to one of two NMOS gates of the transfer gate TF3 and the other and gates of the PMOS transistors QC1 and QC0, respectively.

With this configuration, the OR-NAND compound gate 131 is achieved to perform the OR-NAND operation of signals from the first A-input INA1 and the zeroth A-input INA0, the first B-input INB1 and the zeroth B-input INB0 and the first C-input INC1 and the zeroth C-input INC0 and output the operation result from its output OUT.

The first A-input INA1 and the zeroth A-input INA0, the first B-input INB1 and the zeroth B-input INB0 and the first C-input INC1 and the zeroth C-input INC0 are logically equivalent to one another and therefore can be used as any of the inputs of the OR gates 153 to 155.

For example, the first B-input INB1 and the zeroth B-input INB0 may be used as the input of the OR gate 154 to receive the serial input SI and the test-mode signal TMSI, respectively. Alternatively, the first C-input INC1 and the zeroth C-input INC0 may be used as the input of the OR gate 154 to receive the serial input SI and the test-mode signal TMSI, respectively.

Further, when the first B-input INB1 and the zeroth B-input INB0 are used as the input of the OR gate 154, in reverse to the above, the first B-input INB1 may receive the test-mode signal TMSI and the zeroth B-input INB0 may receive the serial input SI.

In the configurations of FIGS. 27 and 28, when the shift-mode signal SM2 is "0", the S-FF 101 enters a normal (capture) mode to take the input data D into the D-FF 27 in synchronization with a timing signal T. If the normal operation is not needed, the selector 26 may be removed and the output of the inverter 168 may be directly connected to the D-input of the D-FF 27 as indicated by a broken line in FIG. 27.

With the shift-mode signal SM2 of "1", the test-mode signal TMSI of "1", the test-mode signal TMFB of "0" and the comparison control signal CMPL of "1", the S-FF 101 enters a hold mode and the outputs of the OR gates 153 and 154 forcedly become "1" to feed the Q-output of the D-FF 27 back to the D-input, thereby holding the content of the D-FF 27.

With the shift-mode signal SM2 of "1", the test-mode signal TMSI of "0", the test-mode signal TMFB of "1" and the comparison control signal CMPL of "1", the S-FF 101 enters the shift operation mode and the outputs of the OR gates 153 and 155 forcedly become "1" to take the serial input SI into the D-FF 27 in synchronization with the timing signal T.

With the shift-mode signal SM2 of "1", the test-mode signal TMSI of "0" and the test-mode signal TMFB of "0", the S-FF 101 enters the first test (TEST1) mode. In the first test mode, supplying the comparison control signal CMPL of "1" makes the test-invalid condition, and the output of the comparator 121 forcedly becomes "1". Therefore, the AND-operation result between the serial input SI and the Q-output of the D-FF 27 is fed back to the D-input of the D-FF 27 through the OR-NAND compound gate 131 and the inverter 168.

In the first test mode, supplying the comparison control signal CMPL of "0" makes the test-valid condition. The input data D is compared with the expected value data EXP and when agrees, the EX-NOR gate 152 outputs "1" and the comparator 121 outputs "1" as comparison result data. The AND-operation result between the serial input SI and the Q-output of the D-FF 27 is fed back to the D-input of the D-FF 27. On the other hand, when disagrees, the EX-NOR gate 152 outputs "0" and the comparator 121 outputs "0" as comparison result data to forcedly latch "0" into the D-FF 27.

With the shift-mode signal SM2 of "1", the test-mode signal TMSI of "1" and the test-mode signal TMFB of "0", the S-FF 101 enters the second test (TEST2) mode. In the second test mode, the S-FF 101 can perform the test operation without propagating the serial output SO like the S-FF 200 of FIG. 43.

With the shift-mode signal SM2 of "1", the test-mode signal TMSI of "1" and the test-mode signal TMFB of "1", the S-FF 101 enters the third test (TEST3) mode. In the third test mode, supplying the comparison control signal CMPL of "1" makes the test-invalid condition, and the output of the comparator 121 forcedly becomes "1". Therefore, the serial input SI is fed back to the D-input of the D-FF 27 through the OR-NAND compound gate 131 and the inverter 168.

In the third test mode, supplying the comparison control signal CMPL of "0" makes the test-valid condition. The input data D is compared with the expected value data EXP and when agrees, the EX-NOR gate 152 outputs "1" and the comparator 121 outputs "1" as comparison result data. The serial input SI is fed back to the D-input of the D-FF 27. On the other hand, when disagrees, the EX-NOR gate 152 outputs "0" and the comparator 121 outputs "0" as comparison result data to forcedly latch "0" into the D-FF 27.

In short, after the failure information "0" is outputted as the serial output SO in the third test mode, the failure information is not left in the S-FF 101.

With the shift-mode signal SM2 of "1", the test-mode signal TMSI of "1", the test-mode signal TMFB of "1" and the comparison control signal CMPL of "1", the S-FF 101 enters a set (SET1) mode. In the set mode, "1" can be set to the D-FF 27.

Writing "1" into the D-FF 27 in the set mode provides an advantage in a scan test for random logic connected to the output of the RAM.

The prior-art test circuit for RAM has the following problems in the scan test for random logic.

The prior-art test circuit for RAM takes the output data from the RAM therein during the normal operation in the normal mode (SM="1"). If the RAM is not initialized, the test circuit takes an indefinite value (X) therein and therefore must not care the value when performs the shift-out operation. Further, when the self-test for random logic is executed, a circuit to prevent the indefinite value from being cared is needed, which arises a problem of complex control circuit for self-test.

This problem is solved by initializing the RAM, but a test pattern for initialization is needed, which arises a problem of complex scan test for random logic and complex control circuit for self-test.

Since the test circuit of the fifteenth preferred embodiment can write "1" into the internal D-FF 27 only by the setting for the set mode, it surely takes "1" instead of the indefinite value X. As a result, the above problems are solved and it is possible to ensure an easier test for random logic and simplification of control circuit for self-test.

<Test Circuit>

The S-FF 101 having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the fifteenth preferred embodiment. The test-mode signal TM of FIGS. 2 and 3 corresponds to the test-mode signals TMSI and TMFB of FIG. 27, the shift-mode signal SM of FIGS. 2 and 3 corresponds to the shift-mode signal SM2 of FIG. 27 and the comparison control signal CMP of FIGS. 2 and 3 corresponds to the comparison control signal CMPL of FIG. 27.

Since the test circuit of the fifteenth preferred embodiment has a configuration for propagating "0" indicative of failure in series on the scan path consisting of the SFF<0> to SFF<4> during the first or third test mode, it is possible to quickly detect a failure of the RAM 11, and therefore the test circuit of the fifteenth preferred embodiment needs a shorter time to detect a defective piece than the prior-art one and cuts a test time.

The test circuit of the fifteenth preferred embodiment has "0" indicative of failure left therein in the first test mode and does not have "0" left therein i the third test mode.

Moreover, since the test circuit of the fifteenth preferred embodiment can latch "0" only into the SFF<i> corresponding to a defective data output DO<i> by the setting for the second test mode, it is possible to execute the test in an appropriate test mode selected out of the first to third test modes, depending on whether for development or for mass production.

Further, the test circuit can write "1" direct into the D-FF 27 of the S-FF 101 by the setting for the set mode.

The OR-NAND compound gate 131 executes the NAND operation of the respective OR-operation results based on the comparison result of the comparator 121, the serial input SI and the Q-output of the D-FF 27, thereby improving the speed for detecting the failure information, "0".

The OR-NAND compound gate 131 includes relatively less transistors as shown in FIG. 28, thus achieving a simpler circuit configuration than a circuit of equivalent function constituted of separate formation of an OR gate and a NAND gate or constituted of a combination of a selector and a logic gate. Therefore, it is possible to largely reduce the whole circuit configuration of the S-FF 101.

Furthermore, it is natural that the redundancy circuit 14 can be controlled by connecting the test circuit of the fifteenth preferred embodiment thereto, as shown in FIG. 8.

<Control-Signal Generation Circuit>

Figure 29:
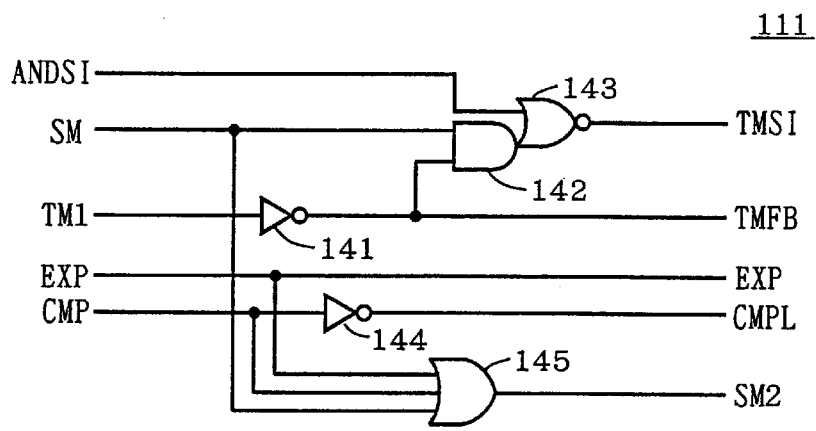
FIG. 29 is a circuit diagram showing a configuration of a control-signal generation circuit in accordance with the fifteenth preferred embodiment of the present invention.

FIG. 29 is a circuit diagram showing a configuration of a control-signal generation circuit 111 of the fifteenth preferred embodiment.

As shown in this figure, an inverter 141 receives the test-mode signal TM1 and outputs a signal as the test-mode signal TMFB.

One of inputs of an AND gate 142 receives the shift-mode signal SM and the other receives the output of the inverter 141. One of inputs of a NOR gate 143 receives a serial-propagation-mode signal ANDSI and the other receives an output of the AND gate 142. The NOR gate 143 outputs a signal as the test-mode signal TMSI.

The expected value data EXP is outputted without any processing and also inputted to the first input of an OR gate 145. The comparison control signal CMP is inverted by an inverter 144 ($\overline{\text{CMP}}$), and then outputted as the comparison control signal CMPL and inputted to the second input of OR gate 145.

The OR gate 145 receives the shift-mode signal SM by its third input, and executes an OR operation of the signals received by its first to third inputs and outputs the shift-mode signal SM2.

Table 1 is a truth table showing a relation between a group of input signals (SM, EXP, CMP, TM1 and ANDSI) and a group of output signals (TMSI, TMFB, CMPL, SM2 and EXP) of the control-signal generation circuit 111 by mode. With reference to Table 1, a mode setting with the group of input signals of the control-signal generation circuit 111 will be discussed.

TABLE 1

| MODE | SM | EXP | CMP | TM1 | ANDSI | TMSI | TMFB | CMPL | SM2 |
|---|---|---|---|---|---|---|---|---|---|
| NORMAL (CAPTURE) | 0 | 0 | 0 | 0 | 0 | 1 | 1 | 1 | 0 |
| HOLD | 1 | X | 0 | 1 | 0 | 1 | 0 | 1 | 1 |
| SHIFT | 1 | X | 0 | 0 | 0 | 0 | 1 | 1 | 1 |
| TEST1 | 1 | EXP | CMP | 1 | 1 | 0 | 0 | $\overline{CMP}$ | 1 |
| TEST2 | 1 | EXP | CMP | 1 | 0 | 1 | 0 | $\overline{CMP}$ | 1 |
| TEST3 | 1 | EXP | CMP | 0 | 1 | 0 | 1 | $\overline{CMP}$ | 1 |
| SET1 | 0 | 1 | 0 | 0 | 0 | 1 | 1 | 1 | 1 |

With the shift-mode signal SM of "0", the expected value data EXP of "0", the comparison control signal CMP of "0", the test-mode signal TM1 of "0" and the serial-propagation-mode signal ANDSI of "0", the test circuit enters the normal mode.

With the shift-mode signal SM of "1", the comparison control signal CMP of "0", the test-mode signal TM1 of "1" and the serial-propagation-mode signal ANDSI of "0", the test circuit enters the hold mode.

With the shift-mode signal SM of "1", the comparison control signal CMP of "0", the test-mode signal TM1 of "0" and the serial-propagation-mode signal ANDSI of "0", the test circuit enters the shift mode.

With the shift-mode signal SM of "1", the test-mode signal TM1 of "1" and the serial-propagation-mode signal ANDSI of "1", the test circuit enters the first test mode.

With the shift-mode signal SM of "1", the test-mode signal TM1 of "1" and the serial-propagation-mode signal ANDSI of "0", the test circuit enters the second test mode.

With the shift-mode signal SM of "1", the test-mode signal TM1 of "0" and the serial-propagation-mode signal ANDSI of "1", the test circuit enters the third test mode.

With the shift-mode signal SM of "0", the expected value data EXP of "1", the comparison control signal CMP of "0", the test-mode signal TM1 of "0" and the serial-propagation-mode signal ANDSI of "0", the test circuit enters the set mode.

The test circuit of the fifteenth preferred embodiment can be used together with the prior-art RAM with test function by providing the control-signal generation circuit 111 having this configuration between input pins of the semiconductor integrated circuit device and the test circuit. Specifically, with the serial-propagation-mode signal ANDSI of "0", a group of other input signals (SM, TM1, EXP, CMP and T) are the same as those in the prior-art test circuit for RAM with test function, and the test circuit of the fifteenth preferred embodiment can share the input pins other than that for the serial-propagation-mode signal ANDSI with the prior-art test circuit.

<<The Sixteenth Preferred Embodiment >>

Figure 30:
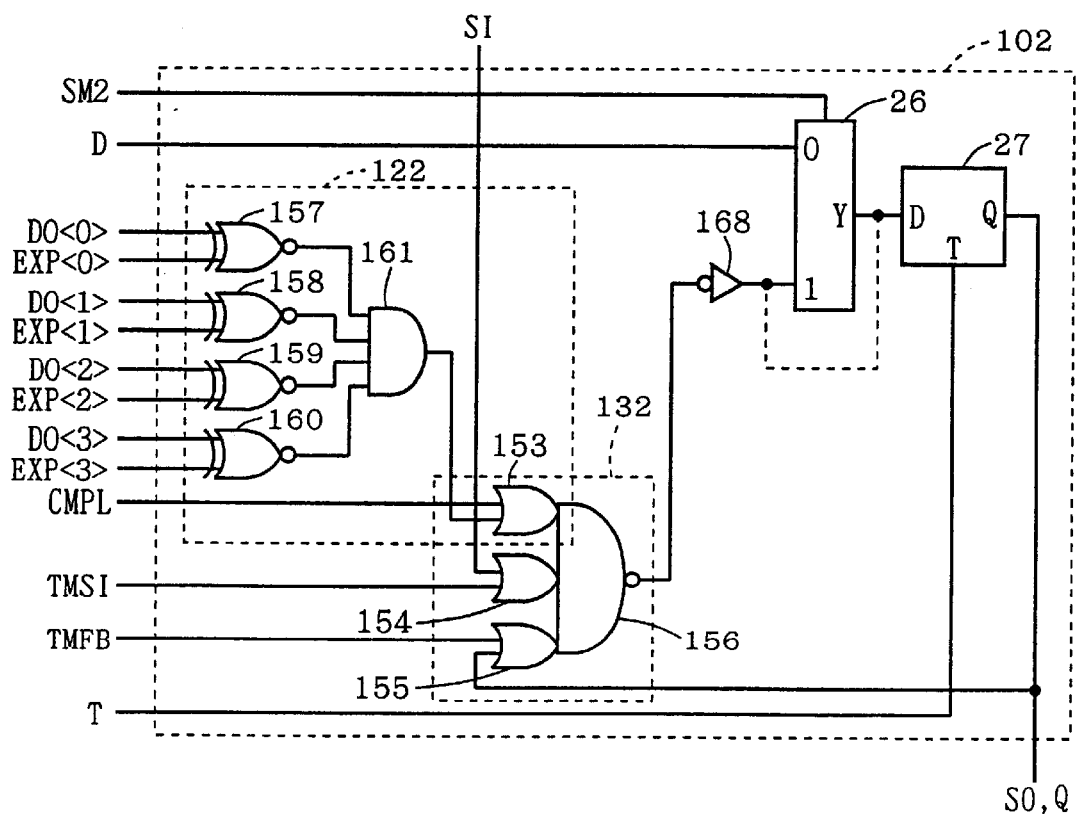
FIG. 30 is a circuit diagram showing an internal configuration of an S-FF in accordance with a sixteenth preferred embodiment of the present invention.

FIG. 30 is a circuit diagram showing a configuration of a scan flip flop 102 used for a test circuit in a semiconductor integrated circuit device such as a DRAM and an SRAM in accordance with the sixteenth preferred embodiment.

As shown in this figure, a comparator 122 consists of EX-NOR gates 157 to 160, an AND gate 161 and the OR gate 153.

Respective ones of inputs of the EX-NOR gates 157 to 160 receive the input data DO<0> to DO<3> and the others receive the expected value data EXP<0> to EXP<3>, respectively. Four inputs of the AND gate 161 are connected to outputs of the EX-NOR gates 157 to 160. One of the inputs of the OR gate 153 is connected to an output of the AND gate 161 and the other receives the comparison control signal CMPL.

One of the inputs of the OR gate 154 receives the serial input SI and the other receives the test-mode signal TMSI. One of the inputs of the OR gate 155 receives the test-mode signal TMFB.

The NAND gate 156 receives the outputs of the OR gates 153 to 155 and executes a NAND operation of the three OR-operation results, i.e., the outputs of the OR gates 153 to 155, to output the operation result to the inverter 168.

The NAND gate 156 and the OR gates 153 to 155 are united to constitute an OR-NAND compound gate 132. Therefore, the comparator 122 and the OR-NAND compound gate 132 share the OR gate 153. Other than the above, the S5 FF 102 has the same configuration as the S-FF 101 of FIG. 27 and the discussion on the configuration will be omitted. The OR-NAND compound gate 132 has the same internal configuration as shown in FIG. 28.

The S-FF 102 having this configuration can operate in the normal mode, the hold mode, the shift mode, the first to third test modes and the set mode, like the S-FF 101 of the fifteenth preferred embodiment. Therefore, the S-FF 102 of the sixteenth preferred embodiment produces the same effect as the S-FF 101 of the fifteenth preferred embodiment.

<Test Circuit >

The S-FF 102 having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the sixteenth preferred embodiment. The test-mode signal TM of FIGS. 2 and 3 corresponds to the test-mode mode signals TMSI and TMFB of FIG. 30, the shift-mode signal SM of FIGS. 2 and 3 corresponds to the shift-mode signal SM2 of FIG. 30 and the comparison control signal CMP of FIGS. 2 and 3 corresponds to the comparison control signal CMPL of FIG. 30.

Therefore, the test circuit of the sixteenth preferred embodiment can execute the test in an appropriate test m ode selected out of the first to third test modes, depending on whether for development or for mass production. Moreover, the test circuit can write "1" direct into the D-FF 27 of the S-FF 102 by the setting for the set mode.

The OR-NAND compound gate 132 executes the NAND operation of the respective OR-operation results based on the comparison result of the comparator 122, the serial input SI and the Q-output of the D-FF 27, thereby improving the speed for detecting the failure information, "0".

Figure 31:
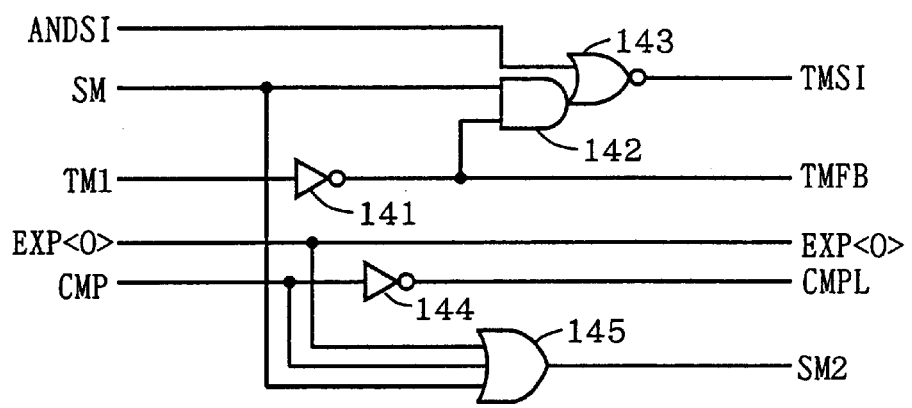
FIG. 31 is a circuit diagram showing a configuration of a control-signal generation circuit in accordance with the sixteenth preferred embodiment of the present invention.

The OR-NAND compound gate 132 includes relatively less transistors as shown in FIG. 31, thus achieving a simpler circuit configuration than a circuit of equivalent function constituted of separate formation of an OR gate and a NAND gate or constituted of a combination of a selector and a logic gate, like in the fifteenth preferred embodiment. Therefore, it is possible to largely reduce the whole circuit configuration of the S-FF 102.

Moreover, the S-FF 102 of the sixteenth preferred embodiment can perform a comparison of four bits at a time. Therefore, constitution of a scan path in the test circuit needs the S-FFs 102 one-quarter times in number as much as the S-FFs 101 including the comparator 121.

Furthermore, it is natural that the redundancy circuit 14 can be controlled by connecting the test circuit of the fifteenth preferred embodiment thereto, as shown in FIG. 8.

<Control-Signal Generation Circuit >

FIG. 31 is a circuit diagram showing a configuration of a control-signal generation circuit 112 of the sixteenth preferred embodiment.

The control-signal generation circuit 112 has the same configuration as the control-signal generation circuit 111 of the fifteenth preferred embodiment except that the expected value data EXP<0> is outputted without any processing and also inputted to the first input of an OR gate 145.

Table 2 is a truth table showing a relation between a group of input signals (SM, EXP<0> to EXP<3>, CMP, TM1 and ANDSI) and a group of output signals (TMSI, TMFB, CMPL, SM2 and EXP<0> to EXP<3>) of the control-signal generation circuit 112 by mode. With reference to Table 2, a mode setting with the group of input signals of the control-signal generation circuit 112 will be discussed.

and the serial-propagation-mode signal ANDSI of "0", the test circuit enters the shift mode.

With the shift-mode signal SM of "1", the test-mode signal TM1 of "1" and the serial-propagation-mode signal ANDSI of "1", the test circuit enters the first test mode.

With the shift-mode signal SM of "1", the test-mode signal TM1 of "1" and the serial-propagation-mode signal ANDSI of "0", the test circuit enters the second test mode.

With the shift-mode signal SM of "1", the test-mode signal TM1 of "0" and the serial-propagation-mode signal ANDSI of "1", the test circuit enters the third test mode.

With the shift-mode signal SM of "0", the expected value data EXP<0> of "1", the comparison control signal CMP of "0", the test-mode signal TM1 of "0" and the serial-propagation-mode signal ANDSI of "0", the test circuit enters the set mode.

The test circuit of the sixteenth preferred embodiment can be used together with the prior-art multi-input RAM with test function of FIG. 13 by providing the control-signal generation circuit 112 having this configuration between the input pins of the semiconductor integrated circuit device and the test circuit. Specifically, with the serial-propagation-mode signal ANDSI of "0", a group of other input signals (SM, TM1, EXP, CMP and T (not shown in FIG. 13)) are the same as those in the prior-art test circuit for multi-input RAM with test function, and the test circuit of the sixteenth preferred embodiment can share the input pins other than that for the serial-propagation-mode signal ANDSI with the prior-art test circuit.

<<The Seventeenth Preferred Embodiment >>

Figure 32:
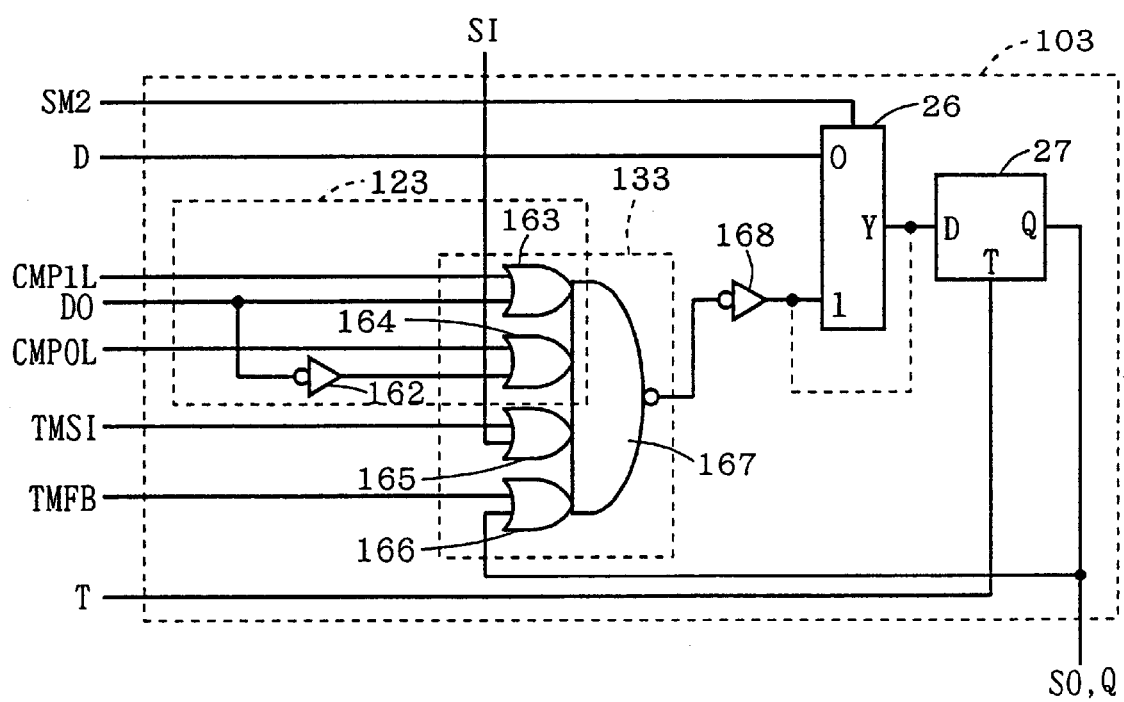
FIG. 32 is a circuit diagram showing an internal configuration of an S-FF in accordance with a seventeenth preferred embodiment of the present invention.

FIG. 32 is a circuit diagram showing a configuration of a scan flip flop 103 used for a test circuit in a semiconductor integrated circuit device such as a DRAM and an SRAM in accordance with the seventeenth preferred embodiment.

As shown in FIG. 32, a comparator 123 consists of an inverter 162 and OR gates 163 and 164. The inverter 162 receives the input data D0. One of inputs of the OR gate 163 receives a comparison control signal CMP1L and the other receives the input data D0, and one of inputs of the OR gate 164 receives a comparison control signal CMP0L and the other is connected to an output of the inverter 162.

TABLE 2

| MODE | SM | EXP<0> | EXP<1> | EXP<2> | EXP<3> | CMP | TM1 | ANDSI | TMSI | TMFB | CMPL | SM2 |
|---|---|---|---|---|---|---|---|---|---|---|---|---|
| NORMAL (CAPTURE) | 0 | 0 | X | X | X | 0 | 0 | 0 | 1 | 1 | 1 | 0 |
| HOLD | 1 | X | X | X | X | 0 | 1 | 0 | 1 | 0 | 1 | 1 |
| SHIFT | 1 | X | X | X | X | 0 | 0 | 0 | 0 | 1 | 1 | 1 |
| TEST1 | 1 | EXP0 | EXP1 | EXP2 | EXP3 | CMP | 1 | 1 | 0 | 0 | $\overline{\text{CMP}}$ | 1 |
| TEST2 | 1 | EXP0 | EXP1 | EXP2 | EXP3 | CMP | 1 | 0 | 1 | 0 | $\overline{\text{CMP}}$ | 1 |
| TEST3 | 1 | EXP0 | EXP1 | EXP2 | EXP3 | CMP | 0 | 1 | 0 | 1 | $\overline{\text{CMP}}$ | 1 |
| SET1 | 0 | 1 | X | X | X | 0 | 0 | 0 | 1 | 1 | 1 | 1 |

With the shift-mode signal SM of "0", the expected value data EXP<0> of "0", the comparison control signal CMP of "0", the test-mode signal TM1 of "0" and the serial-propagation-mode signal ANDSI of "0", the test circuit enters the normal mode.

With the shift-mode signal SM of "1", the comparison control signal CMP of "0", the test-mode signal TM1 of "1" and the serial-propagation-mode signal ANDSI of "0", the test circuit enters the hold mode.

With the shift-mode signal SM of "1", the comparison control signal CMP of "0", the test-mode signal TM1 of "0"

One of inputs of an OR gate 165 receives the serial input SI and the other receives the test-mode signal TMSI. One of inputs of an OR gate 166 receives the test-mode signal TMFB and the other receives the Q-output of the D-FF 27.

A NAND gate 167 receives outputs of the OR gates 163 to 166, performs a NAND operation of the four OR-operation results, i.e., the outputs of the OR gates 163 to 166, and outputs the operation result to the input of an inverter 168.

The NAND gate 167 and the OR gates 163 to 166 are united to constitute an OR-NAND compound gate 133.

Therefore, the comparator 123 and the OR-NAND compound gate 133 share the OR gates 163 and 164. An output of the OR-NAND compound gate 133 is connected to the input of the inverter 168. Other constituent elements are the same as those of the S-FF 101 of the fifteenth preferred embodiment of FIG. 27.

Figure 33:
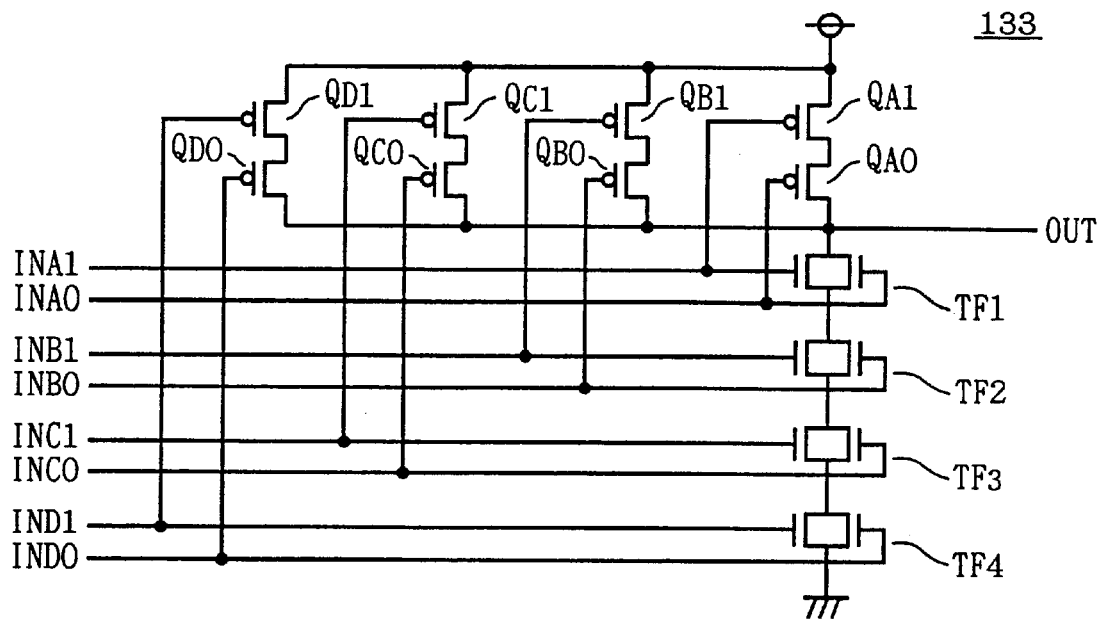
FIG. 33 is a circuit diagram showing an internal configuration of an OR-NAND compound gate of FIG. 32.

FIG. 33 is a circuit diagram showing an internal configuration of the OR-NAND compound gate 133. As shown in this figure, the PMOS transistors QA1 and QA0 and transfer gates TF1 to TF4 are connected in series between the power supply $V_{DD}$ and the ground level.

Further, the PMOS transistors QB1 and QB1, the PMOS transistors QC1 and QC0 and PMOS transistors QD1 and QD0 are connected in parallel in a pair unit to the PMOS transistors QA1 and QA0.

The first A-input INA1 and the zeroth A-input INA0 are inputted to one of two NMOS gates of the transfer gate TF1 and the other and gates of the PMOS transistors QA1 and QA0, respectively. The first B-input INB1 and the zeroth B-input INB0 are inputted to one of two NMOS gates of the transfer gate TF2 and the other and gates of the PMOS transistors QB1 and QB0, respectively. The first C-input INC1 and the zeroth C-input INC0 are inputted to one of two NMOS gates of the transfer gate TF3 and the other and gates of the PMOS transistors QC1 and QC0, respectively. The first D-input IND1 and the zeroth D-input IND0 are inputted to one of two NMOS gates of the transfer gate TF4 and the other and gates of the PMOS transistors QD1 and QD0, respectively.

With this configuration, the OR-NAND compound gate 133 is achieved to perform the OR-NAND operation of signals from the first A-input INA1 and the zeroth A-input INA0, the first B-input INB1 and the zeroth B-input INB0, the first C-input INC1 and the zeroth C-input INC0 and the first D-input INDI and the zeroth D-input IND0 and output the operation result from its output OUT.

The first A-input INA1 and the zeroth A-input INA0, the first B-input INB1 and the zeroth B-input INB0, the first C-input INC1 and the zeroth C-input INC0 and the first D-input IND1 and the zeroth D-input IND0 are logically equivalent to one another and therefore can be used as any of the inputs of the OR gates 163 to 166.

For example, the first B-input INB1 and the zeroth B-input INB0 may be used as the input of the OR gate 165 to receive the serial input SI and the test-mode signal TMSI, respectively. Alternatively, the first C-input INC1 and the zeroth C-input INC0 may be used as the input of the OR gate 165 to receive the serial input SI and the test-mode signal TMSI, respectively.

Further, when the first B-input INB1 and the zeroth B-input INB0 are used as the input of the OR gate 165, in reverse to the above, the first B-input INB1 may receive the test-mode signal TMSI and the zeroth B-input INB0 may receive the serial input SI.

In the configurations of FIGS. 32 and 33, when the shift-mode signal SM2 is "0", the S-FF 103 enters the normal (capture) mode to take the input data D into the D-FF 27 in synchronization with the timing signal T.

With the shift-mode signal SM2 of "1", the test-mode signal TMSI of "1", the test-mode signal TMFB of "0" and the comparison control signals CMP0L and CMP1L of both "1", the S-FF 103 enters the hold mode and the outputs of the OR gates 163 and 165 forcedly become "1" to feed the Q-output of the D-FF 27 back to the D-input, thereby holding the content of the D-FF 27.

With the shift-mode signal SM2 of "1", the test-mode signal TMSI of "0", the test-mode signal TMFB of "1" and the comparison control signals CMP0L and CMP1L of both "1", the S-FF 103 enters the shift operation mode and the outputs of the OR gates 163, 164 and 166 forcedly become "1" to take the serial input SI into the D-FF 27 in synchronization with the timing signal T.

With the shift-mode signal SM2 of "1", the test-mode signal TMSI of "0", the test-mode signal TMFB of "0" and one of the comparison control signals CMP0L and CMP1L of "0" and the other one of "1" according to the expected value data EXP, the S-FF 103 enters the first test (TEST1) mode. In the first test mode, supplying the comparison control signal CMP1L of "0" (CMP0L of "1") starts a test where it is judged to have a failure when the input data D0 through the OR gate 163 is "1" ("1"-failure test). In this case, an AND-operation result of the serial input SI, the Q-output of the D-FF 27 and the output of the OR gate 163 is fed back to the D-input of the D-FF 27. The "1"-failure test corresponds to the test in the S-FF 101 of the fifteenth preferred embodiment with the comparison control signal CMPL of "0" and the expected value data EXP of "0" in the first (to third) test mode.

In the first test mode, supplying the comparison control signal CMP0L of "0" (CMP1L of "1") starts a test where it is judged to have a failure when the input data D0 through the OR gate 164 is "0" ("0"-failure test). In this case, an AND-operation result of the serial input SI, the Q-output of the D-FF 27 and the output of the OR gate 164 is fed back to the D-input of the D-FF 27. The "0"-failure test corresponds to the test in the S-FF 101 of the fifteenth preferred embodiment with the comparison control signal CMPL of "0" and the expected value data EXP of "1" in the first (to third) test mode.

With the shift-mode signal SM2 of "1", the test-mode signal TMSI of "1" and the test-mode signal TMFB of "0", the S-FF 103 enters the second test (TEST2) mode. In the second test mode, the S-FF 103 can perform a test operation without propagating the serial output SO ("0"-failure test or "1"-failure test).

With the shift-mode signal SM2 of "1", the test-mode signal TMSI of "0" and the test-mode signal TMFB of "1", the S-FF 103 enters the third test (TEST3) mode. In the third test mode, the S-FF 103 can perform a test operation without leaving the failure information "0" therein after outputting "0" as the serial output SO ("0"-failure test or "1"-failure test).

With the shift-mode signal SM2 of 1 the test-mode signal TMSI of "1", the test-mode signal TMFB of "1" and the comparison control signals CMP0L and CMP1L of both "1", the S-FF 103 enters the set (SET1) mode. In the set mode, "1" can be set to the D-FF 27.

Writing "1" into the D-FF 27 in the set mode makes it easy to perform a scan test for random logic connected to the output of the RAM and so on, like in the fifteenth preferred embodiment.

Further, the comparator 123 includes only the inverter 162 except the OR gates 163 and 164 which are shared with the OR-NAND compound gate 133. Therefore, the comparator 123 has much simpler circuit configuration than the comparator 121 of the fifteenth preferred embodiment using the EX-NOR gate.

<Test Circuit>

The S-FF 103 having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the seventeenth preferred embodiment. The test-mode signal TM of FIGS. 2 and 3 corresponds to the test-mode signals TMSI and TMFB of FIG. 32, the shift-mode signal SM of FIGS. 2 and 3 corresponds to the shift-mode signal SM2 of FIG. 32 and the comparison control signal CMP and the expected value data EXP of FIGS. 2 and 3 correspond to the comparison control signals CMP0L and CMP1L of FIG. 32.

Therefore, the test circuit of the seventeenth preferred embodiment performs an operation equivalent to that of the test circuit of the fifteenth preferred embodiment, and produces the same effect.

Furthermore, it is natural that the redundancy circuit 14 can be controlled by connecting the test circuit of the fifteenth preferred embodiment thereto, as shown in FIG. 8.

<Control-Signal Generation Circuit >

Figure 34:
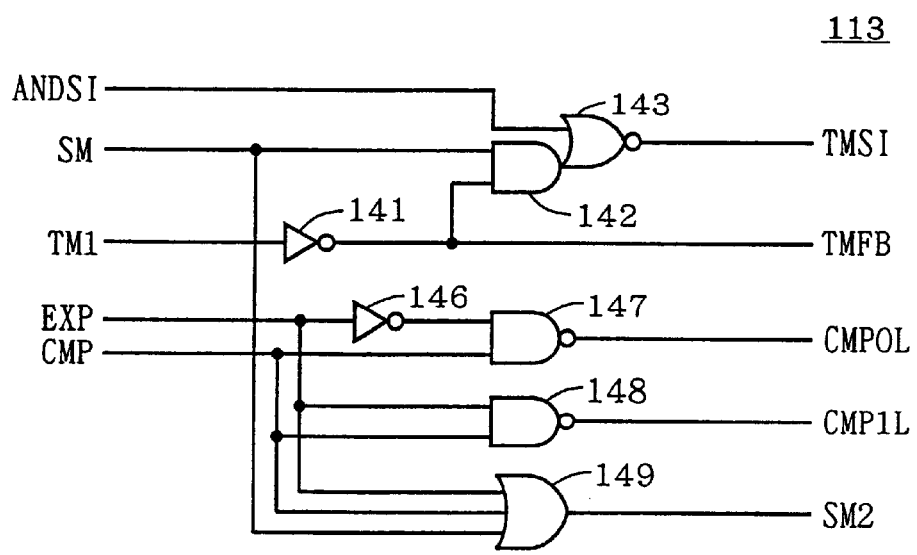
FIG. 34 is a circuit diagram showing a configuration of a control-signal generation circuit in accordance with the seventeenth preferred embodiment of the present invention.

FIG. 34 is a circuit diagram showing a configuration of a control-signal generation circuit 113 of the seventeenth preferred embodiment.

As shown in this figure, the expected value data EXP is inputted to an inverter 146. One of inputs of a NAND gate 147 is connected to an output of the inverter 146 and the other receives the comparison control signal CMP. The NAND gate 147 outputs a signal as the comparison control signal CMP0L.

One of inputs of an NAND gate 148 receives the expected value data EXP and the other receives the comparison control signal CMP. The NAND gate 148 outputs a signal as the comparison control signal CMP1L.

The first input of an OR gate 149 receives the expected value data EXP, the second input receives the comparison control signal CMP and the third input receives the shift-mode signal SM. The OR gate 149 outputs a signal as the shift-mode signal SM2. Other constituent elements are the same as those of the control-signal generation circuit 111 of the fifteenth preferred embodiment of FIG. 29.

Table 3 is a truth table showing a relation between a group of input signals (SM, EXP, CMP, TM1 and ANDSI) and a group of output signals (TMSI, TMFB, CMP0L, CMP1L and SM2) of the control-signal generation circuit 113 by mode. With reference to Table 3, a mode setting with the group of input signals of the control-signal generation circuit 113 will be discussed.

With the shift-mode signal SM of "0", the expected value data EXP of "0", the comparison control signal CMP of "0", the test-mode signal TM1 of "0" and the serial-propagation-mode signal ANDSI of "0", the test circuit enters the normal mode.

With the shift-mode signal SM of "1", the comparison control signal CMP of "0", the test-mode signal TM1 of "1" and the serial-propagation-mode signal ANDSI of "0", the test circuit enters the hold mode.

With the shift-mode signal SM of "1", the comparison control signal CMP of "0", the test-mode signal TM1 of "0" and the serial-propagation-mode signal ANDSI of "0", the test circuit enters the shift mode.

With the shift-mode signal SM of "1", the test-mode signal TM1 of "1" and the serial-propagation-mode signal ANDSI of "1", the test circuit enters the first test mode.

With the shift-mode signal SM of "1", the test-mode signal TM1 of "1" and the serial-propagation-mode signal ANDSI of "0", the test circuit enters the second test mode.

With the shift-mode signal SM of "1", the test-mode signal TM1 of "0" and the serial-propagation-mode signal ANDSI of "1", the test circuit enters the third test mode.

With the shift-mode signal SM of "0", the expected value data EXP of "1", the comparison control signal CMP of "0", the test-mode signal TM1 of "0" and the serial-propagation-mode signal ANDSI of "0", the test circuit enters the set mode.

The test circuit of the seventeenth preferred embodiment can be used together with the prior-art RAM with test function by providing the control-signal generation circuit 113 having this configuration between the input pins of the semiconductor integrated circuit device and the test circuit. Specifically, with the serial-propagation-mode signal ANDSI of "0", a group of other input signals (SM, TM1, EXP, CMP and T) are the same as those in the prior-art test circuit for multi-input RAM with test function, and the test circuit of the seventeenth preferred embodiment can share the input pins other than that for the serial-propagation-mode signal ANDSI with the prior-art test circuit.

<<The Eighteenth Preferred Embodiment >>

Figure 35:
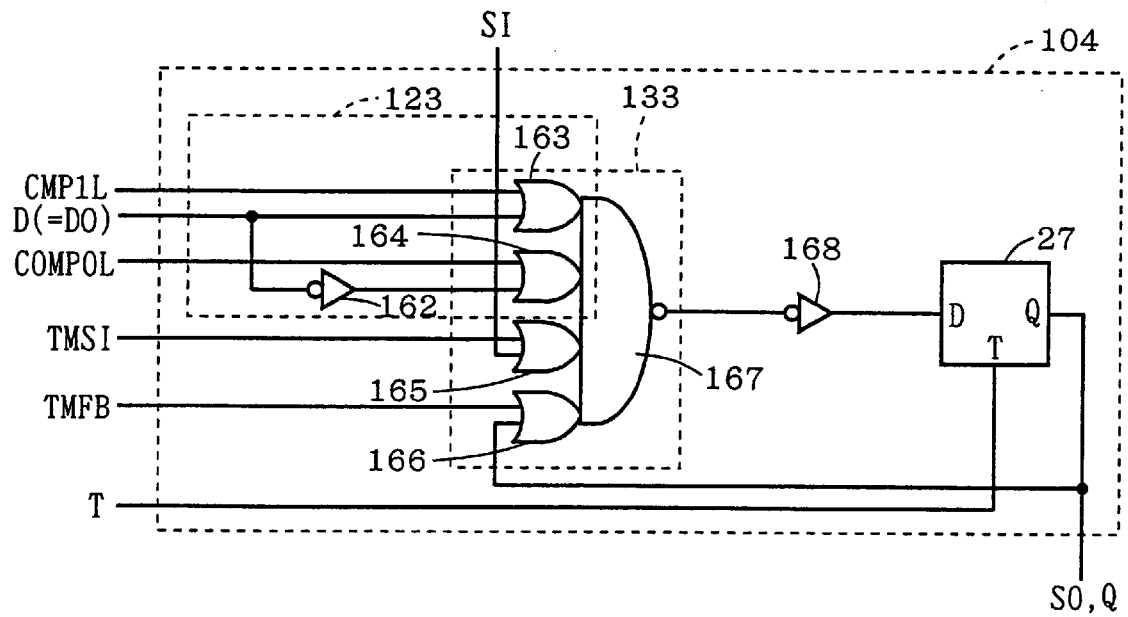
FIG. 35 is a circuit diagram showing an internal configuration of an S-FF in accordance with an eighteenth preferred embodiment of the present invention.

FIG. 35 is a circuit diagram showing a configuration of a scan flip flop 104 used for a test circuit in a semiconductor integrated circuit device such as a DRAM and an SRAM in accordance with the eighteenth preferred embodiment.

As shown in FIG. 35, in the S-FF 104, the selector 26 and the shift-mode signal SM2 for controlling the selector 26 of the S-FF 103 are removed to directly connect the output of the inverter 168 to the D-input of the D-FF 27. Further, the input data D0 or D are inputted into the input of the OR gate 163 which receives the input data D0 in the S-FF 103. Other constituent elements are the same as those of the S-FF 103.

In this configurations, with the test-mode signal TMSI of "1", the test-mode signal TMFB of "1" and one of the comparison control signals CMP0L and CMP1L of "1" and the other one of "0", the S-FF 104 enters the normal (capture) mode.

In the normal mode, with the comparison control signal CMP1L of "0" (CMP0L of "1"), the D-FF 27 takes the input data D received by the OR gate 163 therein in synchronization with the timing signal T, and with the comparison control signal CMP0L of "0" (CMP1L of "1"), the D-FF 27

TABLE 3

| MODE | SM | EXP | CMP | TM1 | ANDSI | TMSI | TMFB | CMP0L | CMP1L | SM2 |
|---|---|---|---|---|---|---|---|---|---|---|
| NORMAL (CAPTURE) | 0 | 0 | 0 | 0 | 0 | 1 | 1 | 1 | 1 | 0 |
| HOLD | 1 | X | 0 | 1 | 0 | 1 | 0 | 1 | 1 | 1 |
| SHIFT | 1 | X | 0 | 0 | 0 | 0 | 1 | 1 | 1 | 1 |
| TEST1 | 1 | EXP | CMP | 1 | 1 | 0 | 0 | $\overline{\text{EXP\&CMP}}$ | $\overline{\text{EXP\&CMP}}$ | 1 |
| TEST1 | 1 | EXP | CMP | 1 | 0 | 1 | 0 | $\overline{\text{EXP\&CMP}}$ | $\overline{\text{EXP\&CMP}}$ | 1 |
| TEST3 | 1 | EXP | CMP | 0 | 1 | 0 | 1 | $\overline{\text{EXP\&CMP}}$ | $\overline{\text{EXP\&CMP}}$ | 1 |
| SET1 | 0 | 1 | 0 | 0 | 0 | 1 | 1 | 1 | 1 | 1 | takes an inverted value of the input data D received by the OR gate 164 therein in synchronization with the timing signal T.

Thus, in the normal mode, it is possible to selectively take either the non-inverted value or the inverted value of the input data D into the D-FF 27 based on the comparison control signals CMP0L and CMP1L.

With the test-mode signal TMSI of "1", the test-mode signal TMFB of "0" and the comparison control signals CMP0L and CMP1L of both "1", the S-FF 104 enters the hold mode and the outputs of the OR gates 163 and 165 forcedly become "1" to feed the Q-output of the D-FF 27 back to the D-input, thereby holding the content of the D-FF 27.

With the test-mode signal TMSI of "0", the test-mode signal TMFB of "1" and the comparison control signals CMP0L and CMP1L of both "1", the S-FF 104 enters the shift operation mode and the outputs of the OR gates 163, 164 and 166 forcedly become "1" to take the serial input SI into the D-FF 27 in synchronization with the timing signal T.

With the test-mode signal TMSI of "0", the test-mode signal TMFB of "0" and one of the comparison control signals CMP1L and CMP0L of "0" and the other one of "1" according to the expected value data EXP, the S-FF 104 enters the first test (TEST1) mode. In the first test mode, supplying the comparison control signal CMP1L of "0" (CMP0L of "1") starts the "1"-failure test and supplying the comparison control signal CMP0L of "0" (CMP1L of "1") starts the "0"-failure test.

With the test-mode signal TMSI of "1" and the test-mode signal TMFB of "0", the S-FF 104 enters the second test (TEST2) mode. In the second test mode, the S-FF 104 can perform the test operation without propagating the serial output SO ("0"-failure test or "1"-failure test).

With the test-mode signal TMSI of "0" and the test-mode signal TMFB of "1", the S-FF 104 enters the third test (TEST3) mode. In the third test mode, the S-FF 104 can perform the test operation without leaving the failure information "0" therein after outputting "0" as the serial output SO ("0"-failure test or "1" failure test).

With the test-mode signal TMSI of "1", the test-mode signal TMFB of "1" and the comparison control signals CMP0L and CMP1L of both "1", the S-FF 104 enters the set (SET1) mode. In the set mode, "1" can be set to the D-FF 27.

The comparator 123, which employs no EX-NOR gate unlike the comparator 121, simplifies the circuit configuration.

Moreover, the S-FF 104 of the eighteenth preferred embodiment, which does not use the selector 26, achieves further simplification in circuit configuration as compared with the S-FF 103 of the seventeenth preferred embodiment.

<Test Circuit>

The S-FF 104 having the above configuration is used as each of the SFF<0> to SFF<4> constituting the scan path of the test circuit 10 of FIG. 2 having the first configuration or the test circuit 16 of FIG. 3 having the second configuration, like the S-FF 1 of the first preferred embodiment, to achieve a test circuit in a semiconductor integrated circuit device of the eighteenth preferred embodiment. The test-mode signal TM of FIGS. 2 and 3 corresponds to the test-mode signals TMSI and TMFB of FIG. 35 and the comparison control signal CMP and the expected value data EXP of FIGS. 2 and 3 correspond to the comparison control signals CMP0L and CMP1L of FIG. 35.

Therefore, the test circuit of the eighteenth preferred embodiment performs an operation equivalent to that of the test circuit of the fifteenth preferred embodiment, and produces the same effect as the test circuits of the fifteenth to seventeenth preferred embodiments.

Furthermore, it is natural that the redundancy circuit 14 can be controlled by connecting the test circuit of the fifteenth preferred embodiment thereto, as shown in FIG. 8.

<Control-Signal Generation Circuit>

Figure 36:
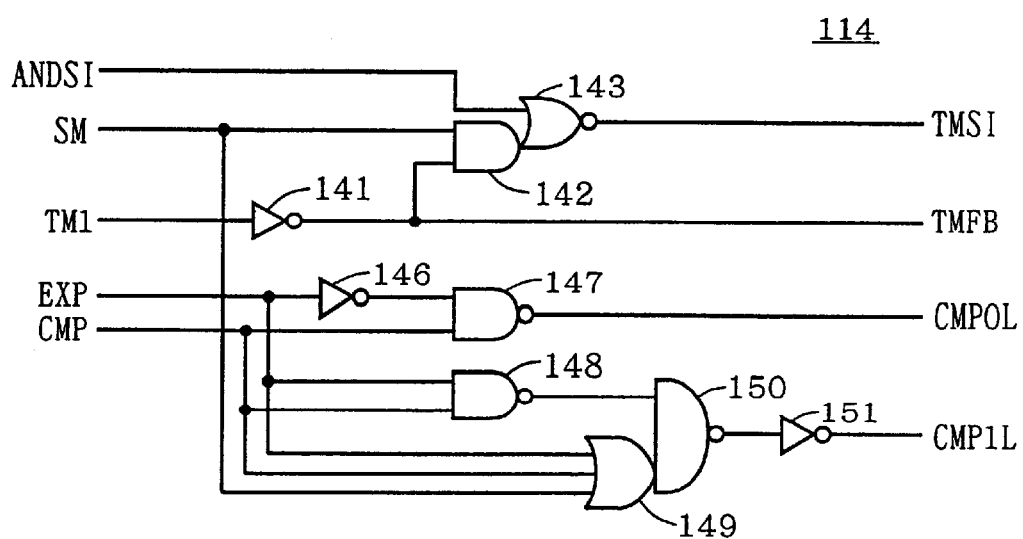
FIG. 36 is a circuit diagram showing a configuration of a control-signal generation circuit in accordance with the eighteenth preferred embodiment of the present invention.

FIG. 36 is a circuit diagram showing a configuration of a control-signal generation circuit 114 of the eighteenth preferred embodiment.

As shown in this figure, one of inputs of a NAND gate 150 is connected to the output of the NAND gate 148 and the other is connected to the output of the OR gate 149. The OR gate 149 and the NAND gate 150 may be provided as an OR-NAND compound gate.

The NAND gate 150 outputs a signal through an inverter 151 as the comparison control signal CMP1L. Other constituent elements are the same as those of the control-signal generation circuit 113 of the seventeenth preferred embodiment of FIG. 34.

Table 4 is a truth table showing a relation between a group of input signals (SM, EXP, CMP, TM1 and ANDSI) and a group of output signals (TMSI, TMFB, CMP0L and CMP1L) of the control-signal generation circuit 114 by mode. With reference to Table 4, a mode setting with the group of input signals of the control-signal generation circuit 114 will be discussed.

TABLE 4

| MODE | SM | EXP | CMP | TM1 | ANDSI | TMSI | TMFB | CMP0L | CMP1L |
|---|---|---|---|---|---|---|---|---|---|
| NORMAL (CAPTURE) | 0 | 0 | 0 | 0 | 0 | 1 | 1 | 1(0) | 0(1) |
| HOLD | 1 | X | 0 | 1 | 0 | 1 | 0 | 1 | 1 |
| SHIFT | 1 | X | 0 | 0 | 0 | 0 | 1 | 1 | 1 |
| TEST1 | 1 | EXP | CMP | 1 | 1 | 0 | 0 | $\overline{\text{EXP\&CMP}}$ | $\overline{\text{EXP\&CMP}}$ |
| TEST2 | 1 | EXP | CMP | 1 | 0 | 1 | 0 | $\overline{\text{EXP\&CMP}}$ | $\overline{\text{EXP\&CMP}}$ |
| TEST3 | 1 | EXP | CMP | 0 | 1 | 0 | 1 | $\overline{\text{EXP\&CMP}}$ | $\overline{\text{EXP\&CMP}}$ |
| SET1 | 0 | 1 | 0 | 0 | 0 | 1 | 1 | 1 | 1 |

With the shift-mode signal SM of "0", the expected value data EXP of "0", the comparison control signal CMP of "0", the test-mode signal TM1 of "0" and the serial-propagation-mode signal ANDSI of "0", the test circuit enters the normal mode.

With the shift-mode signal SM of "1", the comparison control signal CMP of "0", the test-mode signal TM1 of "1" and the serial-propagation-mode signal ANDSI of "0", the test circuit enters the hold mode.

With the shift-mode signal SM of "1", the comparison control signal CMP of "0", the test-mode signal TM1 of "0" and the serial-propagation-mode signal ANDSI of "0", the test circuit enters the shift mode.

With the shift-mode signal SM of "1", the test-mode signal TM1 of "1" and the serial-propagation-mode signal ANDSI of "1", the test circuit enters the first test mode.

With the shift-mode signal SM of "1", the test-mode signal TM1 of "1" and the serial-propagation-mode signal ANDSI of "0", the test circuit enters the second test mode.

With the shift-mode signal SM of "1", the test-mode signal TM1 of "0" and the serial-propagation-mode signal ANDSI of "1", the test circuit enters the third test mode.

With the shift-mode signal SM of "0", the expected value data EXP of "1", the comparison control signal CMP of "0", the test-mode signal TM1 of "0" and the serial-propagation-mode signal ANDSI of "0", the test circuit enters the set mode.

The test circuit of the eighteenth preferred embodiment can be used together with the prior-art RAM with test function by providing the control-signal generation circuit 114 having this configuration between the input pins of the semiconductor integrated circuit device and the test circuit. Specifically, with the serial-propagation-mode signal ANDSI of "0", a group of other input signals (SM, TM1, EXP, CMP and T) are the same as those in the prior-art test circuit for multi-input RAM with test function, and the test circuit of the eighteenth preferred embodiment can share the input pins other than that for the serial-propagation-mode signal ANDSI with the prior-art test circuit.

<<The Nineteenth Preferred Embodiment>>

Figure 37:
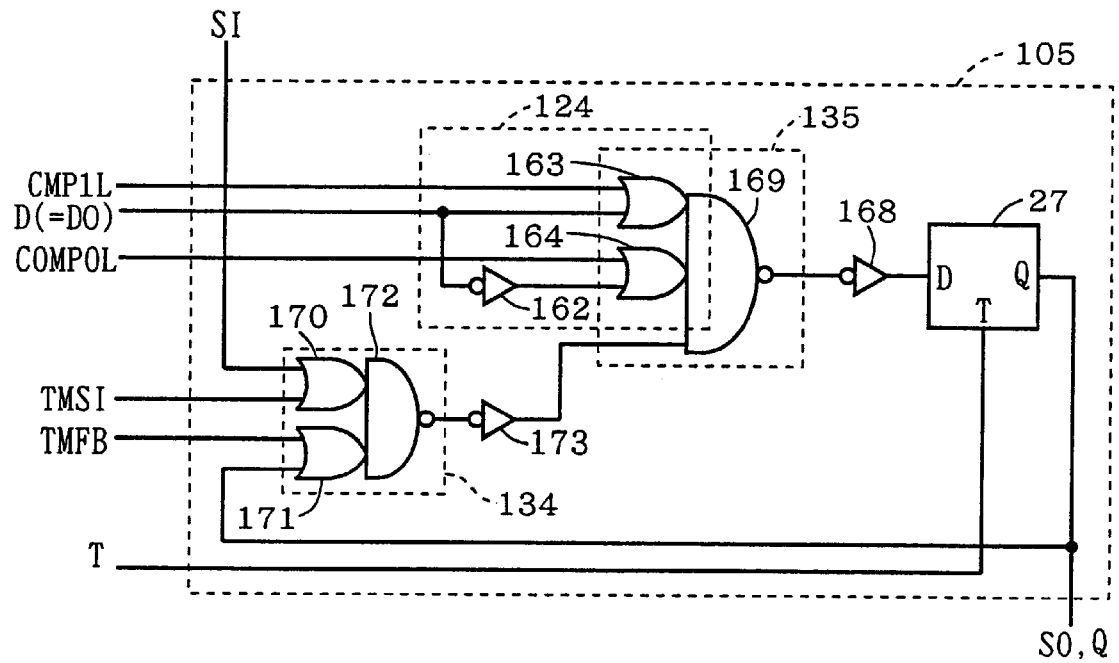
FIG. 37 is a circuit diagram showing an internal configuration of an S-FF in accordance with a nineteenth preferred embodiment of the present invention.

FIG. 37 is a circuit diagram showing a configuration of a scan flip flop 105 used for a test circuit in a semiconductor integrated circuit device such as a DRAM and an SRAM in accordance with the nineteenth preferred embodiment.

As shown in FIG. 37, a comparator 124 consists of the inverter 162 and the OR gates 163 and 164. The inverter 162 receives the input data D or D0. One of the inputs of the OR gate 163 receives the comparison control signal CMP1L and the other receives the input data D or D0, and one of the inputs of the OR gate 164 receives the comparison control signal CMP0L and the other is connected to the output of the inverter 162.

One of inputs of an OR gate 170 receives the serial input SI and the other receives the test-mode signal TMSI. One of inputs of an OR gate 171 receives the test-mode signal TMFB and the other receives the Q-output of the D-FF 27.

A NAND gate 172 receives outputs of the OR gates 170 and 171, performs a NAND operation of the two OR-operation results, i.e., the outputs of the OR gates 170 and 171, and outputs the operation result to the input of an inverter 173.

The NAND gate 172 and the OR gates 170 and 171 are united to constitute an OR-NAND compound gate 134.

A NAND gate 169 receives outputs of the OR gates 163 and 164 and the inverter 173, performs a NAND operation of the outputs of the OR gates 163 and 164 and the inverter 173, and outputs the operation result to the input of the inverter 168.

The NAND gate 169 and the OR gates 163 and 164 are united to constitute an OR-NAND compound gate 135 with the third input. Therefore, the comparator 124 and the OR-NAND compound gate 135 share the OR gates 163 and 164. An output of the OR-NAND compound gate 135 is connected to the input of the inverter 168. Other constituent elements are the same as those of the S-FF 104 of the eighteenth preferred embodiment of FIG. 35.

The S-FF 105 of the nineteenth preferred embodiment having this configuration can operate in the normal mode, the hold mode, the shift mode, the first to third test modes and the set mode based on the test-mode signals TMSI and TMFB and the comparison control signals CMP0L and CMP1L, like the S-FF 104 of the eighteenth preferred embodiment. Therefore, the S-FF 105 of the nineteenth preferred embodiment produces the same effect as the S-FF 104 of the eighteenth preferred embodiment.

Figure 38:
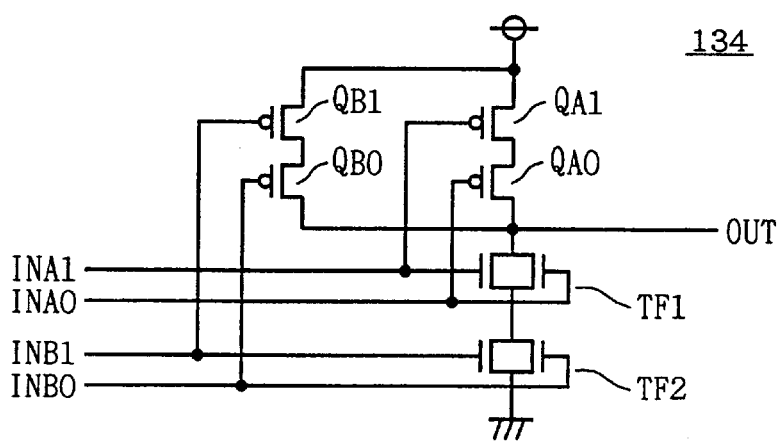
FIG. 38 is a circuit diagram showing an internal configuration of a first OR-NAND compound gate of FIG. 37.

FIG. 38 is a circuit diagram showing an internal configuration of the OR-NAND compound gate 134. As shown in this figure, the PMOS transistors QA1 and QA0 and the transfer gates TF1 and TF2 are connected in series between the power supply $V_{DD}$ and the ground level.

Further, the PMOS transistors QB1 and QB0 are connected in parallel to the PMOS transistors QA1 and QA0.

The first A-input INA1 and the zeroth A-input INA0 are inputted to one of two NMOS gates of the transfer gate TF1 and the other and gates of the PMOS transistors QA1 and QA0, respectively. The first B-input INB1 and the zeroth B-input INB0 are inputted to one of two NMOS gates of the transfer gate TF2 and the other and gates of the PMOS transistors QB1 and QB1, respectively.

With this configuration, the OR-NAND compound gate 134 is achieved to perform the OR-NAND operation of signals from the first A-input INA1 and the zeroth A-input INA0 and the first B-input INB1 and the zeroth B-input INB0 and output the operation result from its output OUT.

Figure 39:
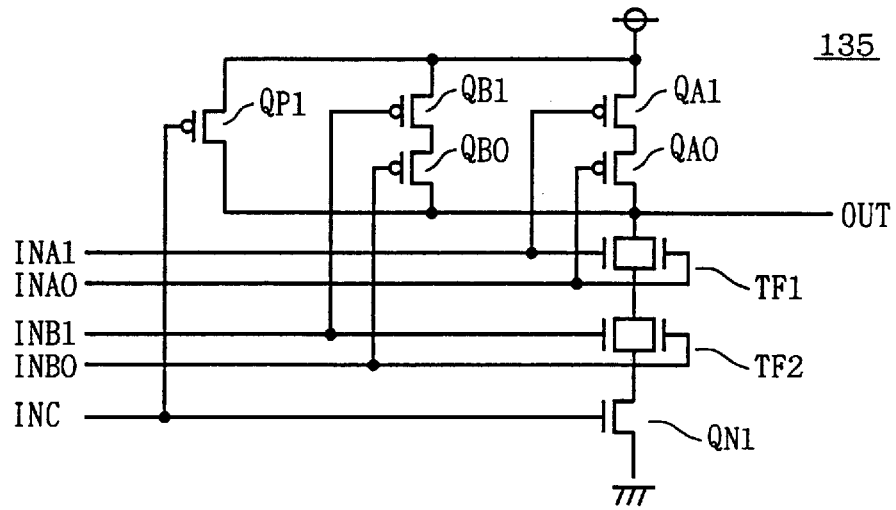
FIG. 39 is a circuit diagram showing an internal configuration of a second OR-NAND compound gate of FIG. 37.

FIG. 39 is a circuit diagram showing an internal configuration of the OR-NAND compound gate 135. As shown in this figure, the PMOS transistors QA1 and QA0 and the transfer gates TF1 and TF2 and an NMOS transistor QN1 are connected in series between the power supply $V_{DD}$ and the ground level.

Further, the PMOS transistors QB1 and QB0 are connected in parallel to the PMOS transistors QA1 and QA0, and a PMOS transistor QP1 is connected in parallel thereto.

The first A-input INA1 and the zeroth A-input INA0 are inputted to one of two NMOS gates of the transfer gate TF1 and the other and gates of the PMOS transistors QA1 and QA0, respectively. The first B-input INB1 and the zeroth B-input INB0 are inputted to one of two NMOS gates of the transfer gate TF2 and the other and gates of the PMOS transistors QB1 and QB0, respectively. The third input INC is inputted to a gate of the NMOS transistor QN1 and a gate of the PMOS transistor QP1.

With this configuration, the OR-NAND compound gate 135 is achieved to perform the NAND operation of a signal from the third input INC and an OR-operation result of signals from the first A-input INA1 and the zeroth A-input INA0 and the first B-input INB1 and the zeroth B-input INB0 and output the operation result from its output OUT.

In the normal mode, the output of the inverter 173 is fixed to "1" in the S-FF 105 having this configuration since the test-mode signal TMSI is "1" and the test-mode signal TMFB is "1".

Therefore, in the normal mode, the operation time of the S-FF 105 depends on the operation time of the OR-NAND compound gate 135. The OR-NAND compound gate 135 has five-stage transistors connected in series between the power supply $V_{DD}$ and the ground level as shown in FIG. 39, and actually four-stage transistors since the NMOS transistor QN1 is always in an ON-state.

On the other hand, the OR-NAND compound gate 133 (see FIG. 33) used in the S-FFs 103 and 104 each have six-stage transistors connected in series between the power supply $V_{DD}$ and the ground level.

Therefore, the S-FF 105 of the nineteenth preferred embodiment ensures a faster operation in the normal mode than the S-FF 104 of the eighteenth preferred embodiment.

<Test Circuit>

The S-FF 105 having the above configuration is used as each of the SFF<0> to SFF<4> constituting the scan path of the test circuit 10 of FIG. 2 having the first configuration or the test circuit 16 of FIG. 3 having the second configuration, like the S-FF 104 of the eighteenth preferred embodiment, to achieve a test circuit in a semiconductor integrated circuit device of the nineteenth preferred embodiment.

Furthermore, it is natural that the redundancy circuit 14 can be controlled by connecting the test circuit of the fifteenth preferred embodiment thereto, as shown in FIG. 8.

<Control-Signal Generation Circuit>

The test circuit of the nineteenth preferred embodiment can be used together with the prior-art RAM with test function by providing the control-signal generation circuit 114 of FIG. 36 between the input pins of the semiconductor integrated circuit device and the test circuit, like the eighteenth preferred embodiment.

<<The Twentieth Preferred Embodiment>>

Figure 40:
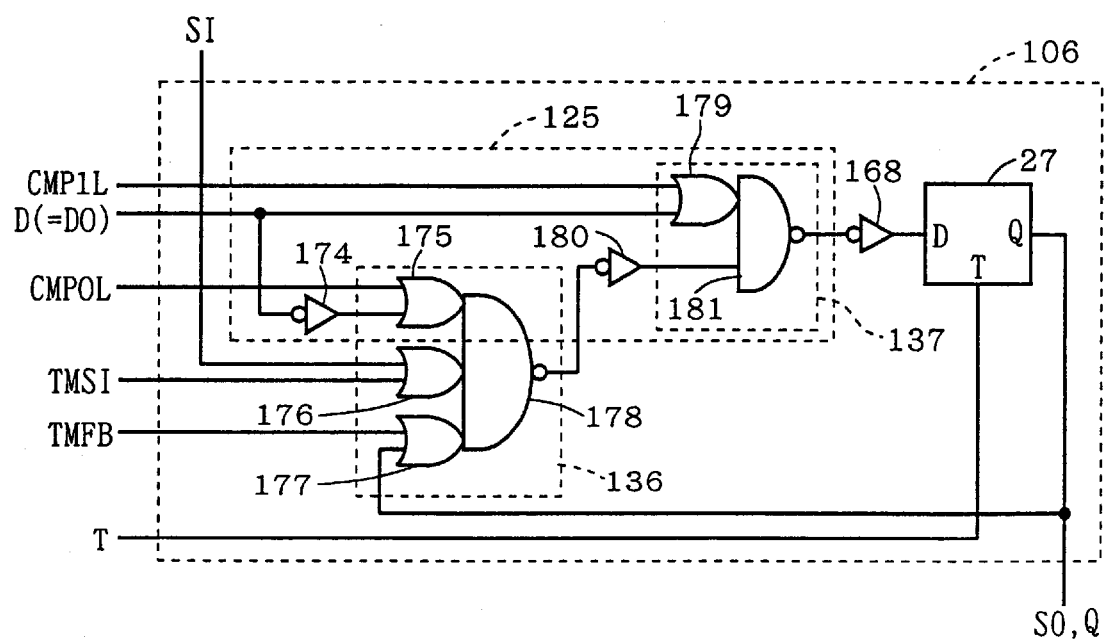
FIG. 40 is a circuit diagram showing an internal configuration of an S-FF in accordance with a twentieth preferred embodiment of the present invention.

FIG. 40 is a circuit diagram showing a configuration of a scan flip flop 106 used for a test circuit in a semiconductor integrated circuit device such as a DRAM and an SRAM in accordance with the twentieth preferred embodiment.

As shown in FIG. 40, a comparator 125 consists of inverters 174 and 180, OR gates 175 and 179, a NAND gate 181 and part of functions of a NAND gate 178. The inverter 174 receives the input data D or D0. One of inputs of the OR gate 179 receives the comparison control signal CMP1L and the other receives the input data D or D0, and one of inputs of the OR gate 175 receives the comparison control signal CMP0L and the other is connected to an output of the inverter 174.

One of inputs of the NAND gate 181 is connected to an output of the OR gate 179 and the other is connected to an output of the inverter 180. The NAND gate 181 and the OR gates 179 are united to constitute an OR-NAND compound gate 137.

One of inputs of an OR gate 176 receives the serial input SI and the other receives the test-mode signal TMSI. One of inputs of an OR gate 177 receives the test-mode signal TMFB and the other receives the Q-output of the D-FF 27.

The NAND gate 178 receives outputs of the OR gates 175 to 177, performs a NAND operation of three OR-operation results, i.e., the outputs of the OR gates 175 to 177, and outputs the operation result to an input of the inverter 180.

The NAND gate 178 and the OR gates 175 to 177 are united to constitute an OR-NAND compound gate 136. Other constituent elements are the same as those of the S-FF 104 of the eighteenth preferred embodiment.

The S-FF 106 of the twentieth preferred embodiment having this configuration can operate in the normal mode, the hold mode, the shift mode, the first to third test modes and the set mode based on the test-mode signals TMSI and TMFB and the comparison control signals CMP0L and CMP1L, like the S-FF 104 of the eighteenth preferred embodiment. Therefore, the S-FF 106 of the twentieth preferred embodiment produces the same effect as the S-FF 104 of the eighteenth preferred embodiment.

Figure 41:
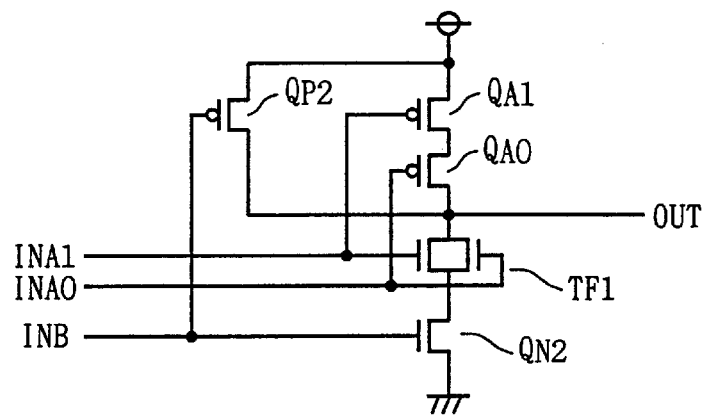
FIG. 41 is a circuit diagram showing an internal configuration of an OR-NAND compound gate of FIG. 40.

FIG. 41 is a circuit diagram showing an internal configuration of the OR-NAND compound gate 137. As shown in this figure, the PMOS transistors QA1 and QA0, the transfer gate TF1 and an NMOS transistor QN2 are connected in series between the power supply $V_{DD}$ and the ground level.

Further, a PMOS transistor QP2 is connected in parallel to the PMOS transistors QA1 and QA0.

The first A-input INA1 and the zeroth A-input INA0 are inputted to one of two NMOS gates of the transfer gate TF1 and the other and gates of the PMOS transistors QA1 and QA0, respectively. The second input INB is inputted to a gate of the NMOS transistor QN2 and a gate of the PMOS transistor QP2.

With this configuration, the OR-NAND compound gate 137 is achieved to perform the NAND operation of a signal from the second input INB and an OR-operation result of signals from the first A-input INA1 and the zeroth A-input INA0 and output the operation result from its output OUT.

The internal configuration of the OR-NAND compound gate 136 is equivalent to that of the OR-NAND compound gate 131 of FIG. 28.

In the normal mode for taking the non-inverted value of the input data D, the output of the inverter 180 is fixed to "1" in the S-FF 106 having this configuration since the test-mode signal TMSI is "1", the test-mode signal TMFB is "1", the comparison control signal CMP1L is "0" and the comparison control signal CMP0L is "1".

Therefore, in the normal mode for taking the non-inverted value of the input data D, the operation time of the S-FF 106 depends on the operation time of the OR-NAND compound gate 137. The OR-NAND compound gate 137 has four-stage transistors connected in series between the power supply $V_{DD}$ and the ground level as shown in FIG. 41, and actually three-stage transistors since the NMOS transistor QN2 is always in an ON-state.

Therefore, the S-FF 106 of the twentieth preferred embodiment ensures a faster operation in the normal mode for taking the non-inverted value of the input data D than the S-FF 105 of the nineteenth preferred embodiment as well as the SFF 104 of the eighteenth preferred embodiment.

<Test Circuit>

The S-FF 106 having the above configuration is used as each of the SFF<0> to SFF<4> constituting the scan path of the test circuit 10 of FIG. 2 having the first configuration or the test circuit 16 of FIG. 3 having the second configuration, like the S-FF 104 of the eighteenth preferred embodiment, to achieve a test circuit in a semiconductor integrated circuit device of the twentieth preferred embodiment.

Furthermore, it is natural that the redundancy circuit 14 can be controlled by connecting the test circuit of the fifteenth preferred embodiment thereto, as shown in FIG. 8.

<Control-Signal Generation Circuit>

The test circuit of the twentieth preferred embodiment can be used together with the prior-art RAM with test function by providing the control-signal generation circuit 114 of FIG. 36 between the input pins of the semiconductor integrated circuit device and the test circuit, like the eighteenth preferred embodiment.

<<The Twenty-First Preferred Embodiment>>

Figure 42:
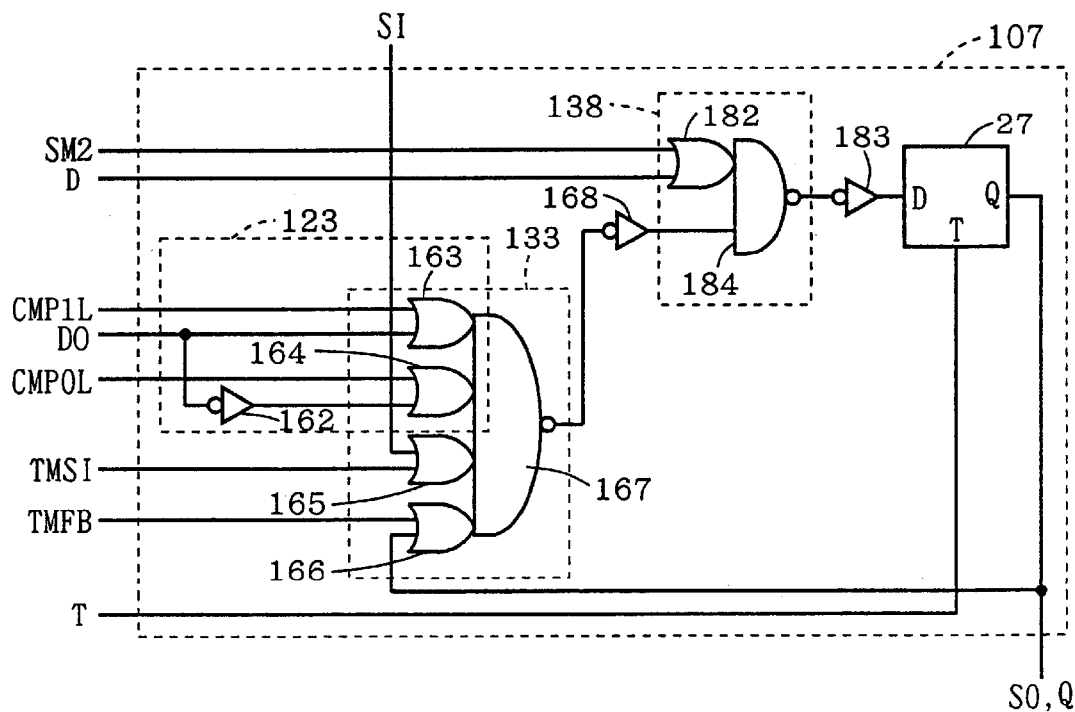
FIG. 42 is a circuit diagram showing an internal configuration of an S-FF in accordance with a twenty-first preferred embodiment of the present invention.

FIG. 42 is a circuit diagram showing a configuration of a scan flip flop 107 used for a test circuit in a semiconductor integrated circuit device such as a DRAM and an SRAM in accordance with the twenty-first preferred embodiment.

As shown in FIG. 42, the S-FF 107 is provided with an OR gate, an inverter 183 and a NAND gate 184 instead of the selector 26 of the S-FF 103 of the seventeenth preferred embodiment.

One of inputs of an OR gate 182 receives the shift-mode signal SM2 and the other receives the input data D. One of inputs of the NAND gate 184 is connected to an output of the OR gate 182 and the other is connected to the output of the inverter 168. An output of the NAND gate 184 is connected to the D-input of the D-FF 27 through the inverter 183.

The NAND gate 184 and the OR gate 182 are united to constitute an OR-NAND compound gate 138 with the second input. The internal configuration of the OR-NAND compound gate 138 is equivalent to that of the OR-NAND compound gate 137 of FIG. 41.

Other constituent elements are the same as those of the S-FF 103 of the seventeenth preferred embodiment shown in FIG. 32, and discussion thereof will be omitted.

The S-FF 107 of the twenty-first preferred embodiment having this configuration can operate in the normal mode, the hold mode, the shift mode, the first to third test modes and the set mode based on the shift-mode signal SM2, test-mode signals TMSI and TMFB and the comparison control signals CMP0L and CMP1L, like the S-FF 103 of the seventeenth preferred embodiment. Therefore, the S-FF 107 of the twenty-first preferred embodiment produces the same effect as the S-FF 103 of the seventeenth preferred embodiment.

In the normal mode, the output of the inverter 168 is fixed to "1" in the SFF 107 having this configuration since the test-mode signal TMSI is "1", the test-mode signal TMFB is "1", the comparison control signal CMP1L is "1" and the comparison control signal CMP0L is "1".

Therefore, in the normal mode, the operation time of the S-FF 107 depends on the operation time of the OR-NAND compound gate 138. The OR-NAND compound gate 138, which has the internal configuration equivalent to that of the OR-NAND compound gate 137 of FIG. 41, has four-stage transistors connected in series between the power supply $V_{DD}$ and the ground level, and actually three-stage transistors since the NMOS transistor QN2 is always in an ON-state.

Therefore, the S-FF 107 of the twenty-first preferred embodiment ensures a faster operation in the normal mode than the S-FF 103 of the seventeenth preferred embodiment using the selector 26.

The S-FF 107 of the twenty-first preferred embodiment, which uses the logic gates 182 to 184, instead of the selector 26, to achieve the function of the selector 26, can perform a selection operation at relatively high speed with relatively simple circuit configuration when constituted of CMOS circuits and the like.

<Test Circuit>

The S-FF 107 having the above configuration is used as each of the SFF<0> to SFF<4> constituting the scan path of the test circuit 10 of FIG. 2 having the first configuration or the test circuit 16 of FIG. 3 having the second configuration, like the S-FF 103 of the seventeenth preferred embodiment, to achieve a test circuit in a semiconductor integrated circuit device of the twenty-first preferred embodiment.

Furthermore, it is natural that the redundancy circuit 14 can be controlled by connecting the test circuit of the fifteenth preferred embodiment thereto, as shown in FIG. 8.

<Control-Signal Generation Circuit>

The test circuit of the twenty-first preferred embodiment can be used together with the prior-art RAM with test function by providing the control-signal generation circuit 113 of FIG. 34 between the input pins of the semiconductor integrated circuit device and the test circuit, like the seventeenth preferred embodiment.

<Others>

Though the first-stage S-FF (SFF<3> of FIGS. 2 and 3, MSFF<3> of FIG. 13 and the like) among the S-FFs constituting the scan path employs the S-FF of the present invention which can execute the test in the first test mode for failure judgment in consideration of the serial input SI like the following S-FFs in the test circuit of the above-discussed preferred embodiments, the first-stage S-FF may use the S-FF having the prior-art configuration of FIG. 26 which can execute only the test in the second test mode without consideration of the serial input SI since the serial input SI of the first-stage S-FF has no relation with the test result.

Further, the S-FF which can execute the test in the first test mode may be used only for some serial S-FFs consisting of one or more S-FFs among the S-FFs constituting the scan path. In this case the test in the first test mode is executed while observing the serial output SO of the last-stage one of the above some serial S-FFs, and the bits of the RAM corresponding to the above some serial S-FFs are tested (if there is an S-FF immediately before the first one of the above some serial S-FFs, the data output of the S-FF is included).

Though the RAM (Random Access Memory) is used as a memory circuit to be tested in the above-discussed preferred embodiments, a sequential access memory circuit such as an FIFO memory may be used.

Figure 46:
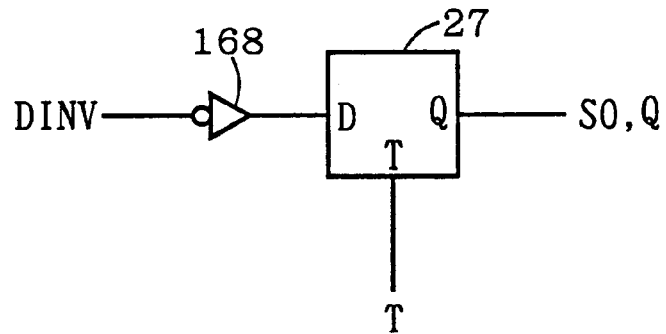
FIG. 46 is a circuit diagram showing a first exemplary connection of a D-FF and an inverter.
Figure 47:
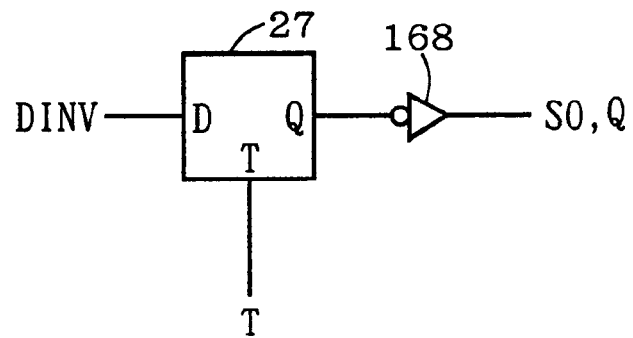
FIG. 47 is a circuit diagram showing a second exemplary connection of the D-FF and the inverter.

Though the inverter 168 is provided to the side of the D-input of the D-FF 27 to apply the output data DINV of the OR-NAND compound gate to the D-input of the D-FF 27 through the inverter 168 as shown in FIG. 46 in the eighteenth to twenty-first preferred embodiments (of FIGS. 35, 37, 40 and 42), the output data DINV may be applied direct to the D-input of the D-FF 27 and the inverter 168 may be provided to the side of the Q-output of the D-FF 27 to give the output of the inverter 168 outside as the serial output SO and the data output Q.

Specifically discussing with the configuration of the eighteenth preferred embodiment (FIG. 35) taken as an example, only if a unit constituted of the comparator 123, the OR-NAND gate 133, the inverter 168 and the D-FF 27 can perform an AND operation of the outputs of the OR gates 163 to 166, the inverter 168 may be provided on either side of the D-input or Q-output of the D-FF 27.

Similarly, the inverter 168 provided to the side of the "1"-input of the selector 26 in the fifteenth to seventeenth preferred embodiments (FIGS. 27, 30 and 32) may be provided to the side of the Q-output of the D-FF 27. In this case, it is necessary to provide another inverter between the "0"-input of the selector 26 and the input data D.

If the semiconductor integrated circuit device has a plurality of RAMs, the semiconductor integrated circuit device may have a configuration where the serial output data SODO of the test circuit for a RAM is given to the test circuit for another RAM as the serial input data SIDO. In this case, it is necessary to employ the S-FF which can execute the test in the first test mode as the first-stage S-FF among the S-FFs constituting the scan path of the test circuit for the later-stage RAM.

Though a DRAM is mainly used as the semiconductor integrated circuit device in the above-discussed preferred embodiments, it is natural that the present invention can be applied to all kinds of semiconductor integrated circuit devices internally having the data storing unit.

While the invention has been shown and described in detail, the foregoing description is in all aspects illustrative and not restrictive. It is therefore understood that numerous modifications and variations can be devised without departing from the scope of the invention.

We claim:

1. A semiconductor integrated circuit device, comprising:
a memory circuit under test which can output in parallel a plurality of output data corresponding to a plurality of bits based on an internally-stored content; and
a test circuit having a plurality of scan flip flops (S-FFs) provided correspondingly to said plurality of output data, said plurality of S-FFs receiving serial output data of their respective preceding S-FFs as serial input data to be connected in series to one another,
each of said plurality of S-FFs comprising:
a comparison circuit for comparing at least one of said plurality of output data with at least one of expected value data corresponding thereto to output a comparison result data indicating whether there is a failure or not; and
failure-information transfer means receiving a group of failure judging data including said comparison result data in a first test mode, for outputting said serial output data indicating a failure when at least one data of said group of failure judging data indicate a failure, and
said group of failure judging data of said failure-information transfer means in each of one or more serial S-FFs among said plurality of S-FFs further including said serial input data in addition to said comparison result data.

2. The semiconductor integrated circuit device of claim 1, wherein
said failure-information transfer means in each of said plurality of S-FFs comprises
memory-data output means for outputting memory data indicating a failure when at least one data of said group of failure judging data indicate a failure in said first test mode; and
a data storage for storing said memory data as latch data in synchronization with a predetermined timing signal, and
said serial output data include said latch data.

3. The semiconductor integrated circuit device of claim 2, wherein
said group of failure judging data further include said latch data.

4. The semiconductor integrated circuit device of claim 1, wherein
said failure-information transfer means in each of said one or more serial S-FFs comprises
a data storage for storing memory data as latch data in synchronization with a predetermined timing signal;
memory-data output means for outputting said memory data indicating a failure when at least one of said comparison result data and said latch data indicates a failure in said first test mode; and
serial-data output means for outputting said serial output data indicating a failure when at least one of said serial input data and said latch data indicates a failure in said first test mode.

5. The semiconductor integrated circuit device of claim 1, wherein
said failure-information transfer means in each of said one or more serial S-FFs comprises
a data storage for storing memory data as latch data in synchronization with a predetermined timing signal;
serial-data output means for outputting said serial output data indicating a failure when at least one of said comparison result data and said latch data indicates a failure in said first test mode; and
memory-data output means for outputting said memory data indicating a failure when at least one of said serial input data and said serial output data indicates a failure in said first test mode.

6. The semiconductor integrated circuit device of claim 1, wherein
said failure-information transfer means in each of said one or more serial S-FFs comprises
data storing means for storing said serial input data as latch data in synchronization with a predetermined timing signal in said first test mode; and
serial-data output means for outputting said serial output data indicating a failure when at least one of said comparison result data and said latch data indicates a failure.

7. The semiconductor integrated circuit device of claim 6, wherein
said data storing means stores said comparison result data as latch data in synchronization with said predetermined timing signal in a failure observation mode.

8. The semiconductor integrated circuit device of claim 1, wherein
said failure-information transfer means in each of said one or more serial S-FFs comprises
a data storage for storing memory data as latch data in synchronization with a predetermined timing signal;
selection means receiving said serial input data and said latch data, for outputting said serial input data as selected data in said first test mode and outputting said latch data as said selected data in a second test mode; and
memory-data output means for outputting memory data indicating a failure when at least one of said selected data and said comparison result data indicates a failure in said first and second test modes, and
said serial output data include said latch data.

9. The semiconductor integrated circuit device of claim 8, wherein
said memory-data output means outputs said comparison result data as said memory data in a failure observation mode.

10. The semiconductor integrated circuit device of claim 1, wherein
said at least one output data include a predetermined number of output data and said at least one expected value data include a predetermined number of expected value data, said predetermined number being not less than two, and
said comparison circuit compares said predetermined number of output data with said predetermined number of expected value data and outputs said comparison result data indicating a failure when at least one of said output data disagrees with corresponding one of said comparison result data.

11. The semiconductor integrated circuit device of claim 10, wherein
said test circuit further includes a data input unit capable of independently writing said predetermined number of test data into said predetermined number of bits corresponding to said predetermined number of output data among said plurality of bits.

12. The semiconductor integrated circuit device of claim 1, wherein said failure-information transfer means in each of said one or more serial S-FFs comprises a data storage for storing memory data as latch data in synchronization with a predetermined timing signal; and memory-data output means for outputting said memory data indicating a failure when at least one of said comparison result data and said latch data indicates a failure in a second test mode.

13. The semiconductor integrated circuit device of claim 3, wherein said comparison result data, said serial input data, said latch data and said memory data each represent a logic value "0"/"1" to indicate whether there is a failure or not, and a unit constituted of said memory-data output means and said data storage includes AND-operation means for performing an AND operation of the said serial input data, said latch data and said comparison result data to output said memory data.

14. The semiconductor integrated circuit device of claim 13, wherein said AND-operation means includes first to third OR gates for outputting first to third OR-operation results, respectively, with said serial input data, said latch data and said comparison result data being valid in said first test mode;

a NAND gate receiving said first to third OR-operation results simultaneously, for performing a NAND operation of said first to third OR-operation results at a time to output a NAND-operation result; and an inverter for logically inverting said NAND-operation result to output said memory data, and said first to third OR gates and said NAND gate are united to constitute an OR-NAND compound gate.

15. The semiconductor integrated circuit device of claim 13, wherein said AND-operation means includes first and second OR gates for outputting first and second OR-operation results, respectively, with said serial input data and said latch data being valid in said first test mode;

a first NAND gate receiving said first and second OR-operation results simultaneously, for performing a NAND operation of said first and second OR-operation results at a time to output a first NAND-operation result;

a first inverter for logically inverting said first NAND-operation result to output a first AND-operation result;

a third OR gate for outputting a third OR-operation result with said comparison result data being valid in said first test mode;

a second NAND gate receiving said first AND-operation result and said third OR-operation result simultaneously, for performing a NAND operation of said first AND-operation result and said third OR-operation result at a time to output a second NAND-operation result; and a second inverter for logically inverting said second NAND-operation result to output said memory data, and said first and second OR gates and said first NAND gate are united to constitute a first OR-NAND compound gate and said third OR gate and said second NAND gate are united to constitute a second OR-NAND compound gate.

16. The semiconductor integrated circuit device of claim 13, further comprising:

a comparison-control-signal generation circuit for outputting first and second comparison control signals one of which is "1" and the other is "0" based on said at least one expected value data in said first test mode, wherein said at least one output data include 1-bit output data of "1" or "0" and said third OR-operation result includes a third OR-operation result for the first comparison and a third OR-operation result for the second comparison, said third OR gate includes an OR gate for the first comparison for performing an OR operation of said 1-bit output data and said first comparison control signal to output said third OR-operation result for the first comparison; and an OR gate for the second comparison for performing an OR operation of an inverted value of said 1-bit output data and said second comparison control signal to output said third OR-operation result for the second comparison, and said memory-data output means and said comparison circuit share said third OR gates for the first comparison and the second comparison.

17. The semiconductor integrated circuit device of claim 15 further comprising:

a comparison-control-signal generation circuit for outputting first and second comparison control signals one of which is "1" and the other is "0" based on said at least one expected value data in said first test mode, wherein said at least one output data include 1-bit output data of "1" or "0" and said third OR-operation result includes a third OR-operation result for the first comparison and a third OR-operation result for the second comparison, said third OR gate includes an OR gate for the first comparison for performing an OR operation of said 1-bit output data and said first comparison control signal to output said third OR-operation result for the first comparison; and an OR gate for the second comparison for performing an OR operation of an inverted value of said 1-bit output data and said second comparison control signal to output said third OR-operation result for the second comparison, said first NAND gate receives said third OR-operation result for the second comparison together with said first and second OR-operation results and performs a NAND operation of said first and second OR-operation results and said third OR-operation result for the second comparison at a time to output said first NAND-operation result, and said second NAND gate simultaneously receives said first AND-operation result and said third OR-operation result for the first comparison and performs a NAND operation of said first AND-operation result and said third OR-operation result for the first comparison at a time to output said second NAND-operation result.

18. The semiconductor integrated circuit device of claim 13, wherein said AND-operation means further has a function of performing an AND operation of only said latch data and said comparison result data to output said memory data in said second test mode and performing an AND operation of only said serial input data and said comparison result data to output said memory data in said third test mode.

19. The semiconductor integrated circuit device of claim 1, further comprising:

a redundancy circuit for detecting a defective bit among said plurality of bits based on at least some of said serial output data from each of said one or more serial S-FFs to control input/output data of said memory circuit under test corresponding to said defective bit not to be used.

20. The semiconductor integrated circuit device of claim 1, wherein said one or more serial S-FFs include said plurality of S-FFs.

* * * * *